US011732361B2

United States Patent
Oka et al.

(10) Patent No.: US 11,732,361 B2
(45) Date of Patent: *Aug. 22, 2023

(54) METAL PLATE FOR MANUFACTURING DEPOSITION MASK, METHOD FOR MANUFACTURING METAL PLATE, DEPOSITION MASK AND METHOD FOR MANUFACTURING DEPOSITION MASK

(71) Applicant: Dai Nippon Printing Co., Ltd., Tokyo (JP)

(72) Inventors: Hiroki Oka, Tokyo (JP); Chikao Ikenaga, Tokyo (JP); Sachiyo Matsuura, Tokyo (JP); Shogo Endo, Tokyo (JP); Chiaki Hatsuta, Tokyo (JP); Asako Narita, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/070,127

(22) Filed: Oct. 14, 2020

(65) Prior Publication Data

US 2021/0108312 A1  Apr. 15, 2021

Related U.S. Application Data

(63) Continuation-in-part of application No. 16/940,791, filed on Jul. 28, 2020.

(30) Foreign Application Priority Data

Oct. 8, 2019 (JP) .................................. 2019-185424
Jul. 27, 2020 (JP) .................................. 2020-126760
Sep. 29, 2020 (JP) .................................. 2020-164041

(51) Int. Cl.
C23C 16/458 (2006.01)
C21D 8/02 (2006.01)
(Continued)

(52) U.S. Cl.
CPC .......... *C23C 16/4582* (2013.01); *C21D 6/001* (2013.01); *C21D 8/021* (2013.01);
(Continued)

(58) Field of Classification Search
None
See application file for complete search history.

(56) References Cited

U.S. PATENT DOCUMENTS 6,060,172 A * 5/2000 Inoue ..................... C22C 38/02
148/403
2001/0047839 A1 12/2001 Hatano et al.

FOREIGN PATENT DOCUMENTS

| EP | 3 514 249 A1 | 7/2019 |
| JP | H05-214492 A | 8/1993 |
| JP | 5382259 | 1/2014 |

OTHER PUBLICATIONS

Japanese Office Action (Application No. 2020-126760) dated Aug. 21, 2020 (with English translation).
(Continued)

*Primary Examiner* — Sally A Merkling
*Assistant Examiner* — Nazmun Nahar Shams
(74) *Attorney, Agent, or Firm* — Burr Patent Law, PLLC

(57) ABSTRACT

A method for manufacturing a metal plate, the metal plate including a first surface and a second surface positioned on the opposite side of the first surface, may include a step of rolling a base metal having an iron alloy containing nickel to produce the metal plate. The metal plate may include particles containing as a main component an element other than iron and nickel. In a sample including the first surface and the second surface of the metal plate, the following conditions (1) and (2) regarding the particles may be satisfied:
(1) The number of the particles having an equivalent circle diameter of 1 μm or more is 50 or more and 3000 or less per 1 mm³ in the sample, and
(Continued)

(2) The number of the particles having an equivalent circle diameter of 3 μm or more is 50 or less per 1 mm$^3$ in the sample.

20 Claims, 35 Drawing Sheets

(51) Int. Cl.
*C21D 6/00* (2006.01)
*C23F 1/28* (2006.01)
*C22C 33/04* (2006.01)
*C23F 1/02* (2006.01)
*C22C 38/08* (2006.01)
*H10K 71/00* (2023.01)

(52) U.S. Cl.
CPC ......... *C21D 8/0226* (2013.01); *C21D 8/0247* (2013.01); *C21D 8/0263* (2013.01); *C21D 8/0278* (2013.01); *C22C 33/04* (2013.01); *C22C 38/08* (2013.01); *C23F 1/02* (2013.01); *C23F 1/28* (2013.01); *H10K 71/00* (2023.02)

(56) References Cited

OTHER PUBLICATIONS

Extended European Search Report (Application No. 20200827.2) dated Jan. 15, 2021.

* cited by examiner

|  | Total quantity of particles | First quantity (first ratio) | Second quantity (second ratio) | Third quantity (third ratio) | Evaluation A-1 | Evaluation A-2 | Evaluation B-1 | Evaluation B-2 |
|---|---|---|---|---|---|---|---|---|
| 1st mask | 924 | 912 (98.7) | 12 (1.3) | 0 (0.0) | OK | OK | OK | OK |
| 2nd mask | 1300 | 1251 (96.2) | 40 (3.1) | 9 (0.7) | OK | OK | NG | NG |
| 3rd mask | 1158 | 1123 (97.0) | 35 (3.0) | 0 (0.0) | OK | OK | NG | NG |
| 4th mask | 813 | 808 (99.4) | 5 (0.6) | 0 (0.0) | OK | OK | OK | OK |
| 5th mask | 333 | 333 (100.0) | 0 (0.0) | 0 (0.0) | OK | OK | OK | OK |
| 6th mask | 381 | 381 (100.0) | 0 (0.0) | 0 (0.0) | OK | OK | OK | OK |
| 7th mask | 31 | 28 (90.3) | 3 (9.7) | 0 (0.0) | Occurrence of peeling of resist | | | |
| 8th mask | 50 | 39 (78.0) | 9 (18.0) | 2 (4.0) | OK | OK | OK | OK |
| 9th mask | 240 | 234 (97.5) | 6 (2.5) | 0 (0.0) | OK | OK | OK | OK |
| 10th mask | 160 | 154 (96.3) | 6 (3.8) | 0 (0.0) | OK | OK | OK | OK |
| 11th mask | 166 | 160 (96.4) | 6 (3.6) | 0 (0.0) | OK | OK | OK | OK |
| 12th mask | 209 | 209 (100.0) | 0 (0.0) | 0 (0.0) | OK | OK | OK | OK |
| 13th mask | 3093 | 3046 (98.5) | 45 (1.5) | 2 (0.1) | NG | OK | NG | NG |
| 14th mask | 8143 | 7949 (97.6) | 169 (2.1) | 25 (0.3) | NG | NG | NG | NG |
| 15th mask | 4009 | 3936 (98.2) | 63 (1.6) | 10 (0.2) | NG | NG | NG | NG |
| 16th mask | 2992 | 2960 (98.9) | 31 (1.0) | 1 (0.0) | OK | OK | NG | NG |
| 17th mask | 2836 | 2787 (98.3) | 30 (1.1) | 19 (0.7) | OK | OK | NG | NG |
| 21th mask | 1218 | 1210 (99.3) | 8 (0.7) | 0 (0.0) | OK | OK | NG | OK |
| 22th mask | 2381 | 2361 (99.2) | 18 (0.8) | 2 (0.1) | OK | OK | NG | OK |
| 23th mask | 2890 | 2847 (98.5) | 34 (1.2) | 9 (0.3) | OK | OK | NG | NG |
| 24th mask | 237 | 236 (99.6) | 1 (0.4) | 0 (0.0) | OK | OK | OK | OK |
| 25th mask | 61 | 41 (67.2) | 20 (32.8) | 0 (0.0) | OK | OK | OK | OK |

FIG.48

|  | Total quantity of particles | Mg quantity (Mg ratio) | Al quantity (Al ratio) | Si quantity (Si ratio) | P quantity (P ratio) | Zr quantity (Zr ratio) | S quantity (S ratio) |
|---|---|---|---|---|---|---|---|
| 1st mask | 924 | 6 (0.6) | 770 (83.3) | 80 (8.7) | 0 (0.0) | 37 (4.0) | 31 (3.4) |
| 2nd mask | 1300 | 37 (2.8) | 991 (76.2) | 192 (14.8) | 18 (1.4) | 31 (2.4) | 31 (2.4) |
| 3rd mask | 1158 | 10 (0.9) | 867 (74.9) | 266 (23.0) | 0 (0.0) | 0 (0.0) | 15 (1.3) |
| 4th mask | 813 | 29 (3.6) | 641 (78.8) | 133 (16.4) | 0 (0.0) | 10 (1.2) | 0 (0.0) |
| 5th mask | 333 | 0 (0.0) | 160 (48.0) | 136 (40.8) | 6 (1.8) | 6 (1.8) | 25 (7.5) |
| 6th mask | 381 | 0 (0.0) | 185 (48.6) | 160 (42.0) | 12 (3.1) | 6 (1.6) | 18 (4.7) |
| 7th mask | 31 | 3 (9.7) | 15 (48.4) | 10 (32.3) | 0 (0.0) | 0 (0.0) | 3 (9.7) |
| 8th mask | 50 | 0 (0.0) | 30 (60.0) | 20 (40.0) | 0 (0.0) | 0 (0.0) | 0 (0.0) |
| 9th mask | 240 | 0 (0.0) | 154 (64.2) | 55 (22.9) | 0 (0.0) | 25 (10.4) | 6 (2.5) |
| 10th mask | 160 | 0 (0.0) | 129 (80.6) | 19 (11.9) | 0 (0.0) | 12 (7.5) | 0 (0.0) |
| 11th mask | 166 | 0 (0.0) | 123 (74.1) | 31 (18.7) | 0 (0.0) | 12 (7.2) | 0 (0.0) |
| 12th mask | 209 | 0 (0.0) | 179 (85.6) | 24 (11.5) | 0 (0.0) | 6 (2.9) | 0 (0.0) |
| 13th mask | 3093 | 0 (0.0) | 663 (21.4) | 2402 (77.7) | 0 (0.0) | 19 (0.6) | 9 (0.3) |
| 14th mask | 8143 | 25 (0.3) | 6892 (84.6) | 1164 (14.3) | 0 (0.0) | 6 (0.1) | 56 (0.7) |
| 15th mask | 4009 | 22 (0.5) | 3459 (86.3) | 492 (12.3) | 0 (0.0) | 8 (0.2) | 28 (0.7) |
| 16th mask | 2992 | 0 (0.0) | 572 (19.1) | 2420 (80.9) | 0 (0.0) | 0 (0.0) | 0 (0.0) |
| 17th mask | 2836 | 0 (0.0) | 608 (21.4) | 2203 (77.7) | 0 (0.0) | 17 (0.6) | 8 (0.3) |
| 21th mask | 1218 | 8 (0.7) | 984 (80.8) | 88 (7.2) | 1 (0.1) | 65 (5.3) | 72 (5.9) |
| 22th mask | 2381 | 62 (2.6) | 1848 (77.6) | 341 (14.3) | 48 (2.0) | 42 (1.8) | 40 (1.7) |
| 23th mask | 2890 | 0 (0.0) | 621 (21.5) | 2241 (77.5) | 0 (0.0) | 17 (0.6) | 11 (0.4) |
| 24th mask | 237 | 1 (0.4) | 199 (84.0) | 32 (13.5) | 0 (0.0) | 0 (0.0) | 5 (2.1) |
| 25th mask | 61 | 0 (0.0) | 44 (72.1) | 17 (27.9) | 0 (0.0) | 0 (0.0) | 0 (0.0) |

FIG.49

| Distance from distal end | Total quantity of particles | First quantity (first ratio) | Second quantity (second ratio) | Third quantity (third ratio) |
|---|---|---|---|---|
| 1m | 859 | 850 (99.0) | 8 (0.9) | 1 (0.1) |
| 100m | 626 | 619 (98.9) | 7 (1.1) | 0 (0.0) |
| 200m | 585 | 579 (99.0) | 6 (1.0) | 0 (0.0) |
| 300m | 705 | 696 (98.7) | 8 (1.1) | 1 (0.1) |
| 400m | 670 | 665 (99.3) | 5 (0.7) | 0 (0.0) |
| Average value | 689.0 | 681.8 | 6.8 | 0.4 |
| Distribution range | 274 | 271 | 3 | 1 |
| Distribution range/ Average value | 0.398 | 0.397 | 0.441 | 2.500 |

FIG.50

| Distance from distal end | Total quantity of particles | Mg quantity (Mg ratio) | Al quantity (Al ratio) | Si quantity (Si ratio) | P quantity (P ratio) | Zr quantity (Zr ratio) | S quantity (S ratio) |
|---|---|---|---|---|---|---|---|
| 1m | 859 | 36 (4.2) | 733 (85.3) | 90 (10.5) | 0 (0.0) | 0 (0.0) | 0 (0.0) |
| 100m | 626 | 0 (0.0) | 452 (72.2) | 65 (10.4) | 0 (0.0) | 18 (2.9) | 91 (14.5) |
| 200m | 585 | 0 (0.0) | 474 (81.0) | 56 (9.6) | 0 (0.0) | 12 (2.1) | 43 (7.4) |
| 300m | 705 | 0 (0.0) | 589 (83.5) | 37 (5.2) | 0 (0.0) | 0 (0.0) | 79 (11.2) |
| 400m | 670 | 0 (0.0) | 558 (83.3) | 43 (6.4) | 0 (0.0) | 6 (0.9) | 63 (9.4) |

FIG.51

|  | Total quantity of particles | First quantity (first ratio) | Second quantity (second ratio) | Third quantity (third ratio) |
|---|---|---|---|---|
| first end part | 833 | 828 (99.4) | 5 (0.6) | 0 (0.0) |
| second end part | 1158 | 1153 (99.6) | 5 (0.4) | 0 (0.0) |
| Average value | 995.5 | 990.5 | 5.0 | 0.0 |
| Distribution range | 325 | 325 | 0 | 0 |
| Distribution range/ Average value | 0.326 | 0.328 | 0.000 | - |

FIG.52

|  | Total quantity of particles | Mg quantity (Mg ratio) | Al quantity (Al ratio) | Si quantity (Si ratio) | P quantity (P ratio) | Zr quantity (Zr ratio) | S quantity (S ratio) |
|---|---|---|---|---|---|---|---|
| first end part | 833 | 0 (0.0) | 301 (36.1) | 463 (55.6) | 5 (0.6) | 10 (1.2) | 54 (6.5) |
| second end part | 1158 | 0 (0.0) | 532 (45.9) | 567 (49.0) | 5 (0.4) | 0 (0.0) | 54 (4.7) |

FIG.53

METAL PLATE FOR MANUFACTURING DEPOSITION MASK, METHOD FOR MANUFACTURING METAL PLATE, DEPOSITION MASK AND METHOD FOR MANUFACTURING DEPOSITION MASK

CROSS REFERENCE TO RELATED APPLICATIONS

This application is a continuation-in-part of U.S. patent application Ser. No. 16/940,791, filed on Jul. 28, 2020. This application is based upon and claims the benefit of priority from the prior Japanese Patent Application No. 2020-164041 filed on Sep. 29, 2020. U.S. patent application Ser. No. 16/940,791 is based upon and claims the benefit of priority from the prior Japanese Patent Application No. 2019-185424 filed on Oct. 8, 2019 and Japanese Patent Application No. 2020-126760 filed on Jul. 27, 2020, the entire contents of which are incorporated herein by reference.

BACKGROUND

Field

Embodiments of the present disclosure relate to a metal plate for manufacturing a deposition mask, a method for manufacturing a metal plate, a deposition mask, and a method for manufacturing a deposition mask.

Background Art

A display device having high fineness in an electronic device such as a smart phone and a tablet PC is recently required from a market. The display device has, for example, a pixel density of 500 ppi or more, or 800 ppi or more.

Attention has been paid to an organic EL display device because of its excellent responsibility and/or low power consumption. As a method of forming pixels of an organic EL display device, a deposition method is known. In the deposition method, a material constituting pixels is adhered to a substrate by deposition. In this case, a deposition mask having through holes is initially prepared. Then, in a deposition apparatus, while the deposition mask is in close contact with a substrate, an organic material and/or inorganic material are deposited so that the organic material and/or inorganic material are formed on the substrate.

As disclosed in Patent Document 1, for example, a method of forming through holes in a metal plate by etching the metal plate is known as a manufacturing method of a deposition mask.

Patent Document 1: JP5382259B

SUMMARY

The object of the present disclosure is to improve accuracy of a shape of a through hole formed in a metal plate.

In one embodiment of the present disclosure, a metal plate used for manufacturing a deposition mask includes a first surface and a second surface positioned on the opposite side of the first surface. The metal plate contains iron and nickel. The metal plate may include particles containing as a main component an element other than iron and nickel. In a sample including the first surface and the second surface of the metal plate, the following conditions (1) and (2) regarding the particles may be satisfied.

(1) The number of the particles having an equivalent circle diameter of 1 μm or more is 50 or more and 3000 or less per 1 $mm^3$ in the sample.

(2) The number of the particles having an equivalent circle diameter of 3 μm or more is 50 or less per 1 $mm^3$ in the sample.

The embodiments of this disclosure can improve accuracy of a shape of a through hole formed in a metal plate.

BRIEF DESCRIPTION OF THE DRAWINGS

FIG. 48 is a view showing results of observing particles included in the respective samples obtained from a first mask to a seventeenth mask.

FIG. 49 is a view showing results of analyzing a composition of particles.

FIG. 50 is a view showing results of observing particles included in the respective samples obtained from a plurality of positions of a wound body, in Supplementary Evaluation 1.

FIG. 51 is a view showing results of analyzing a composition of particles, in Supplementary Evaluation 1.

FIG. 52 is a view showing results of analyzing a composition of particles, in Supplementary Evaluation 2.

FIG. 53 is a view showing results of analyzing a composition of particles, in Supplementary Evaluation 2.

DETAILED DESCRIPTION

Figure 1:
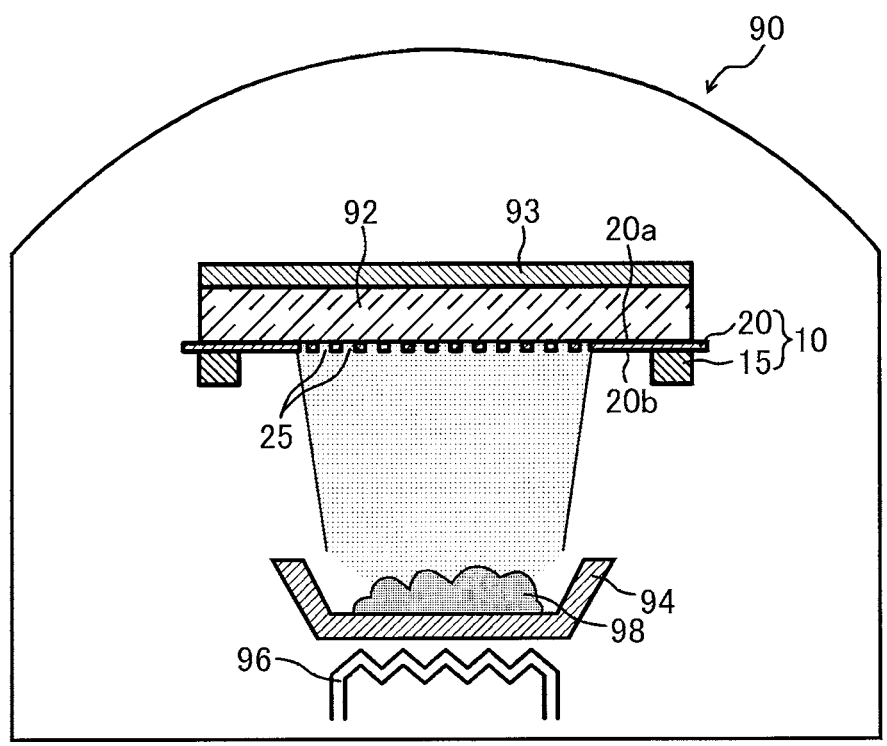
FIG. 1 is a deposition apparatus comprising a deposition mask apparatus according to one of embodiments of the present disclosure.

In the specification and the drawings, terms meaning a substance that forms basis of a composition, such as "plate", "sheet" and "film", are not differentiated from one another based only on the difference of terms, unless otherwise specified. In the specification and the drawings, terms specifying shapes, geometric conditions and their degrees, e.g., "parallel", "orthogonal", etc., and values of a length and an angle are not limited to their strict definitions, but construed to include a range capable of exerting a similar function, unless otherwise specified.

In the specification and the drawings, when a certain member or a certain structure such as an area is located "above", "below", "on an upper side", "on a lower side" or "upward" and "downward", a case where a certain structure is in direct contact with another structure is included, unless otherwise specified. Further, a case where another structure is included between the certain structure and the other structure, i.e., the certain structure and the other structure are in indirect contact with each other is also included. Unless otherwise specified, "up", "upper side" and "upward" or "down", "lower side" and "downward" can be vertically reversed.

In the specification and the drawings, the same or similar numerals are given to the same parts or parts having similar functions, and the repeated description thereof may be omitted. In addition, a dimensional ratio of the drawings may differ from an actual one for convenience of explanation, and/or a part of a structure may be omitted from the drawings.

In the specification and the drawings, embodiments of the present disclosure may be combined with another embodiment and a modification example, to the extent that there is no contradiction, unless otherwise specified. In addition, other embodiments, and another embodiment and a modification example may be combined, to the extent that there is no contradiction. Moreover, modification examples may be combined, to the extent that there is no contradiction.

In the specification and the drawings, when a plurality of step of a method such as a manufacturing method are disclosed, another step that is not disclosed may be performed between the disclosed steps, unless otherwise specified. In addition, the order to the disclosed steps is optional, to the extent that there is no contradiction.

In the specification and the drawings, a range represented by a wording "to" includes numerical values or elements placed before and after the wording "to". For example, a numeral range defined by the expression "34 to 38% by mass" is the same as a numerical range defined by an expression "34% by mass or more and 38% by mass or less". For example, a range defined by the expression "through holes 25A to 25E" includes through holes 25A, 25B, 25C, 25D and 25E.

In one embodiment of the specification, an example related to a deposition mask used for patterning an organic material on a substrate in a desired pattern upon manufacture of an organic EL display device, and a manufacturing method thereof will be described. However, the present embodiment is not limited to such an application, and can be applied to a deposition mask used for various purposes. For example, the deposition mask in this embodiment can be used for manufacturing a device for displaying or projecting an image or video for expressing virtual reality, which is so-called VR, or augmented reality, which is so-called AR.

An embodiment of the present disclosure is described in detail below, with reference to the drawings. The embodiment shown herebelow is an example of embodiments of the present disclosure, and the present disclosure should not be construed as being confined to these embodiments alone.

A first aspect of the present disclosure is a metal plate used for manufacturing a deposition mask, the metal plate including a first surface and a second surface positioned on the opposite side of the first surface, and containing iron and nickel, the metal plate comprising particles containing as a main component an element other than iron and nickel, wherein in a sample including the first surface and the second surface of the metal plate, the following conditions (1) and (2) regarding the particles are satisfied:
(1) the number of the particles having an equivalent circle diameter of 1 µm or more is 50 or more and 3000 or less per 1 mm$^3$ in the sample; and
(2) the number of the particles having an equivalent circle diameter of 3 µm or more is 50 or less per 1 mm$^3$ in the sample.

A second aspect of the present disclosure is the metal plate according to the aforementioned first aspect, wherein the following condition (3) regarding the particles may be satisfied:
(3) the number of the particles having an equivalent circle diameter of 1 µm or more is 1000 or less per 1 mm$^3$ in the sample.

A third aspect of the present disclosure is the metal plate according to the aforementioned first aspect or the aforementioned second aspect, wherein the following condition (4) regarding the particles may be satisfied:
(4) the number of the particles having an equivalent circle diameter of 3 µm or more is 20 or less per 1 mm$^3$ in the sample.

A fourth aspect of the present disclosure is the metal plate according to the respective aforementioned first aspect to the aforementioned third aspect, wherein the following condition (5) regarding the particles may be satisfied:
(5) the number of the particles having an equivalent circle diameter of 5 µm or more is 20 or less per 1 mm$^3$ in the sample.

A fifth aspect of the present disclosure is the metal plate according to the respective aforementioned first aspect to the aforementioned third embodiments, wherein the following condition (6) regarding the particles may be satisfied:
(6) the number of the particles having an equivalent circle diameter of 5 µm or more is 2 or less per 1 mm$^3$ in the sample.

A sixth aspect of the present disclosure is the metal plate according to the respective aforementioned first aspect to the aforementioned fifth embodiment, wherein a first ratio of the metal plate may be 70% or more.

The first ratio is a ratio of a first quantity to a total quantity.

The total quantity is the number of the particles per 1 mm$^3$ in the sample, the particles having an equivalent circle diameter of 1 µm or more.

The first quantity is the number of the particles per 1 mm$^3$ in the sample, the particles having an equivalent circle diameter of 1 µm or more and less than 3 µm.

A seventh aspect of the present disclosure is the metal plate according to the respective aforementioned first aspect to the aforementioned sixth aspect, wherein a thickness of the metal plate may be 70 µm or less.

An eighth aspect of the present disclosure is the metal plate according to the respective aforementioned first aspect to the aforementioned sixth aspect, wherein a thickness of the metal plate may be 50 µm or less.

A ninth aspect of the present disclosure is the metal plate according to the respective aforementioned first aspect to the aforementioned sixth aspect, wherein a thickness of the metal plate may be 30 µm or less.

A tenth aspect of the present disclosure is a method for manufacturing a metal plate used for manufacturing a deposition mask, the metal plate including a first surface and a second surface positioned on the opposite side of the first surface, the method comprising:
a preparation step of preparing a base metal having an iron alloy containing nickel; and
a step of rolling the base metal to produce the metal plate;
wherein:
the metal plate comprises particles containing as a main component an element other than iron and nickel;
in a sample including the first surface and the second surface of the metal plate, the following conditions (1) and (2) regarding the particles are satisfied:
(1) the number of the particles having an equivalent circle diameter of 1 µm or more is 50 or more and 3000 or less per 1 mm$^3$ in the sample; and
(2) the number of the particles having an equivalent circle diameter of 3 µm or more is 50 or less per 1 mm$^3$ in the sample.

An eleventh aspect of the present disclosure is the method for manufacturing a metal plate according to the aforementioned tenth aspect, wherein the manufacturing method may comprise a surface treatment step of removing a surface part of the base metal or the metal plate.

A twelfth aspect of the present disclosure is the method for manufacturing a metal plate according to the aforementioned eleventh aspect, wherein the surface treatment step may include a base-metal surface treatment step of removing the surface part of the base metal, and a thickness of the surface part may be 10 mm or more.

A thirteenth aspect of the present disclosure is the method for manufacturing a metal plate according to the aforementioned eleventh aspect, wherein the surface treatment step may include a metal-plate surface treatment step of removing the surface part of the metal plate, and a thickness of the surface part may be 5 µm or more.

A fourteenth aspect of the present disclosure is the method for manufacturing a metal plate according to the aforementioned eleventh aspect, wherein the surface treatment step may include a step of removing the surface part by exposing a surface of the base metal or the metal plate to a surface treatment liquid.

A fifteenth aspect of the present disclosure is the method for manufacturing a metal plate according to the aforementioned tenth aspect to the aforementioned fourteenth aspect, wherein it may comprises a selection step of selecting the metal plate in which, in a sample including the first surface and the second surface of the selected metal plate, the following conditions (1) and (2) regarding the particles may be satisfied:

(1) the number of the particles having an equivalent circle diameter of 1 μm or more is 50 or more and 3000 or less per 1 $mm^3$ in the sample; and (2) the number of the particles having an equivalent circle diameter of 3 μm or more is 50 or less per 1 $mm^3$ in the sample.

A sixteenth aspect of the present disclosure is the method for manufacturing a metal plate according to the aforementioned tenth aspect to the aforementioned fifteenth aspect, wherein the following condition (3) regarding the particles may be satisfied:

(3) the number of the particles having an equivalent circle diameter of 1 μm or more is 1000 or less per 1 $mm^3$ in the sample.

A seventeenth aspect of the present disclosure is the method for manufacturing a metal plate according to the aforementioned tenth aspect to the aforementioned sixteenth aspect, wherein the following condition (4) regarding the particles may be satisfied:

(4) the number of the particles having an equivalent circle diameter of 3 μm or more is 20 or less per 1 $mm^3$ in the sample.

An eighteenth aspect of the present disclosure is the method for manufacturing a metal plate according to the aforementioned tenth aspect to the aforementioned seventeenth aspect, wherein the following condition (5) regarding the particles may be satisfied:

(5) the number of the particles having an equivalent circle diameter of 5 μm or more is 20 or less per 1 $mm^3$ in the sample.

A nineteenth aspect of the present disclosure is the method for manufacturing a metal plate according to the aforementioned tenth aspect to the aforementioned eighteenth aspect, wherein the following condition (6) regarding the particles may be satisfied:

(6) the number of the particles having an equivalent circle diameter of 5 μm or more is 2 or less per 1 $mm^3$ in the sample.

A twentieth aspect of the present disclosure is the method for manufacturing a metal plate according to the aforementioned tenth aspect to the aforementioned nineteenth aspect, wherein a first ratio of the metal plate may be 70% or more.

The first ratio is a ratio of a first quantity to a total quantity.

The total quantity is the number of the particles per 1 $mm^3$ in the sample, the particle having an equivalent circle diameter of 1 μm or more.

The first quantity is the number of the particles per 1 $mm^3$ in the sample, the particles having an equivalent circle diameter of 1 μm or more and less than 3 μm.

A twenty-first aspect of the present disclosure is the method for manufacturing a metal plate according to the aforementioned tenth aspect to the aforementioned twentieth aspect, wherein a thickness of the metal plate may be 70 μm or less.

A twenty-second aspect of the present disclosure is the method for manufacturing a metal plate according to the aforementioned tenth aspect to the aforementioned twentieth aspect, wherein a thickness of the metal plate may be 50 μm or less.

A twenty-third aspect of the present disclosure is the method for manufacturing a metal plate according to the aforementioned tenth aspect to the aforementioned twentieth aspect, wherein a thickness of the metal plate may be 30 μm or less.

A twenty-fourth aspect of the present disclosure is a deposition mask comprising:

a metal plate including a first surface and a second surface positioned on the opposite side of the first surface, and containing iron and nickel; and a plurality of through holes formed in the metal plate;

wherein:

the metal plate comprises particles containing as a main component an element other than iron and nickel; and in a sample including the first surface and the second surface of the metal plate, the following conditions (1) and (2) regarding the particles are satisfied:

(1) the number of the particles having an equivalent circle diameter of 1 μm or more is 50 or more and 3000 or less per 1 $mm^3$ in the sample; and (2) the number of the particles having an equivalent circle diameter of 3 μm or more is 50 or less per 1 $mm^3$ in the sample.

A twenty-fifth aspect of the present disclosure is a method for manufacturing a deposition mask comprising:

a step of preparing a metal plate including a first surface and a second surface positioned on the opposite side of the first surface and containing iron and nickel;

a processing step of forming through holes in the metal plate;

wherein:

the metal plate comprises particles containing as a main component an element other than iron and nickel; and in a sample including the first surface and the second surface of the metal plate, the following conditions (1) and (2) regarding the particles are satisfied:

(1) the number of the particles having an equivalent circle diameter of 1 μm or more is 50 or more and 3000 or less per 1 $mm^3$ in the sample; and (2) the number of the particles having an equivalent circle diameter of 3 μm or more is 50 or less per 1 $mm^3$ in the sample.

Firstly, a deposition apparatus 90 for performing a deposition process for depositing a deposition material onto an object is described with reference to FIG. 1. As shown in FIG. 1, the deposition apparatus 90 may comprise therein a deposition source 94, a heater 96 and a deposition mask apparatus 10. The deposition apparatus 90 further comprises an evacuation means for creating a vacuum atmosphere inside the deposition apparatus 90. The deposition source 94 is, for example, a crucible. The deposition source 94 accommodates a deposition material 98 such as an organic luminescent material. The heater 96 heats the deposition source 94 to evaporate the deposition material 98 under a vacuum atmosphere. The deposition mask apparatus 10 may be arranged so as to be opposed to the deposition source 94.

Herebelow, the deposition mask apparatus 10 is described. As shown in FIG. 1, the deposition mask apparatus 10 may comprise at least one deposition mask 20, and a frame 15 that supports the deposition mask 20. The frame 15 may support the deposition mask 20 under tension in a planar direction thereof so as to prevent the deposition mask 20 from being bent. As shown in FIG. 1, the deposition mask apparatus 10 may be arranged in the deposition apparatus 90 such that the deposition mask 20 faces a substrate which is an object to which the deposition material 98 is adhered. The substrate is as an organic EL substrate 92, for example. In the following description, among surfaces of the deposition mask 20, the surface on the same side as the organic EL substrate 92 is referred to as first surface 20a, and the surface positioned on the opposite side of the first surface 20a is referred to as second surface 20b.

As shown in FIG. 1, the deposition mask apparatus 10 may comprise a magnet 93. The magnet is arranged on a surface of the organic EL substrate 92, which is on the opposite side of another surface facing the deposition mask 20. Due to the provision of the magnet 93, the deposition mask 20 can be attracted toward the magnet 93 by a magnetic force, so that the deposition mask 20 can be in close contact with the organic EL substrate 92. Although not shown, the deposition mask 20 may be brought into close contact with the organic EL substrate 92 using an electrostatic chuck that utilizes an electrostatic force (Coulomb force).

Figure 3:
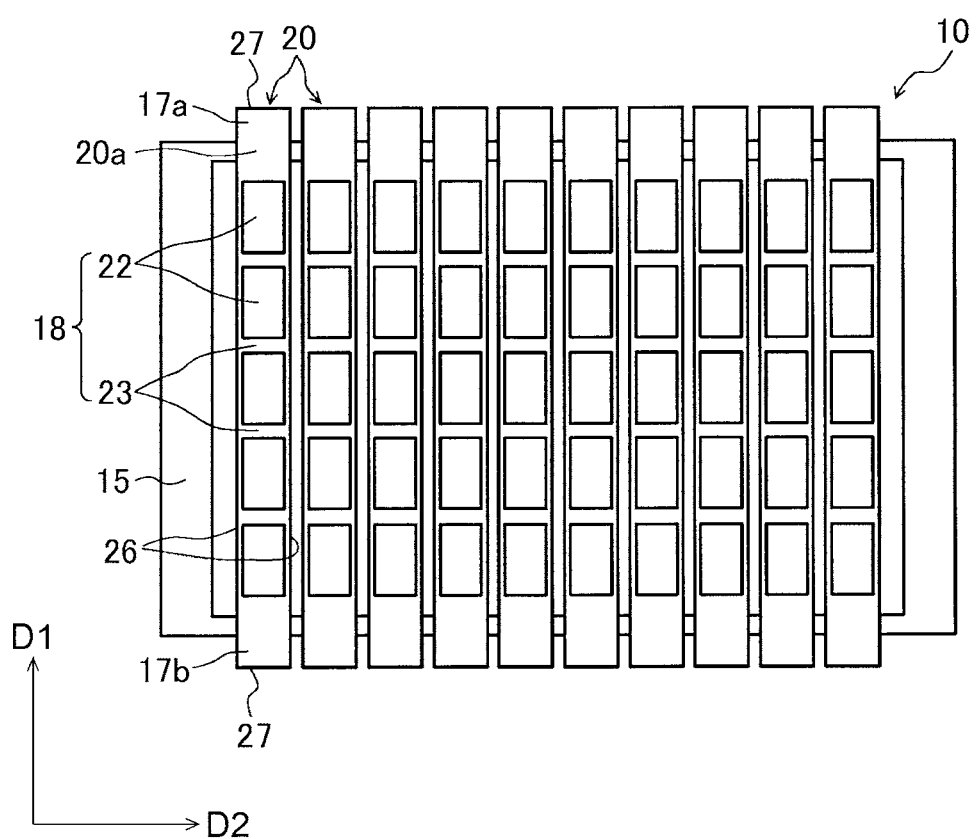
FIG. 3 is a plan view showing the deposition mask apparatus according to one of the embodiments of the present disclosure.

FIG. 3 is a plan view showing the deposition mask apparatus 10 viewed at the first surface 20a side of the deposition mask 20. As shown in FIG. 3, the deposition mask apparatus 10 comprises a plurality of deposition masks 20. Each deposition mask 20 includes a pair of long sides 26 and a pair of short sides 27, and has a rectangular shape, for example. Each deposition mask 20 is fixed to the frame 15 by welding, for example, at the pair of short sides 27 or locations in the vicinity thereof.

The deposition mask 20 includes a metal plate in which a plurality of through holes 25 passing through the deposition mask 20 are formed. The deposition material 98, which has evaporated from the deposition source 94 and reached the deposition mask apparatus 10, adheres to the organic EL substrate 92 through the through holes 25 of the deposition mask 20. Thus, the deposition material 98 can be deposited on the surface of the organic EL substrate 92 in a desired pattern corresponding to the positions of the through holes 25 of the deposition mask 20.

Figure 2:
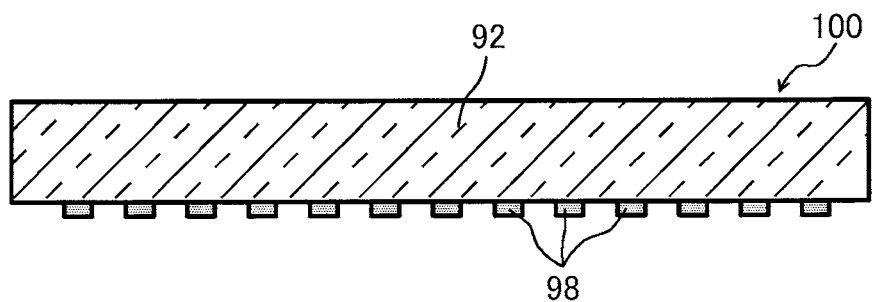
FIG. 2 is a sectional view showing an organic EL display device manufactured using the deposition mask apparatus shown in FIG. 1.

FIG. 2 is a sectional view showing an organic EL display device 100 manufactured by using the deposition apparatus 90 of FIG. 1. The organic EL display device 100 may comprise an organic EL substrate 92 and patterned pixels containing the deposition material 98. Although not shown, the organic EL display device 100 may further comprise electrodes electrically connected to the pixels containing the deposition material 98. The electrodes are provided in advance on the organic EL substrate 92, before the deposition material 98 is deposited on the organic EL substrate 92 by a deposition step, for example. The organic EL display device 100 may further comprise another component such as a sealing member that seals a space around the pixels containing the deposition material 98 from outside. Thus, it can be said that the organic EL display device 100 of FIG. 2 is an intermediate product of an organic EL display device, produced in an intermediate stage of manufacturing the organic EL display device.

In case color display by a plurality of colors is desired, the deposition apparatuses 90 provided with the deposition mask 20 corresponding to one of the plurality of colors are prepared, and the organic EL substrate 92 is put into the deposition apparatuses 90 in sequence. Thus, for example an organic luminescence material for red color, an organic luminescence material for green color, and an organic luminescence material for blue color can be deposited onto the organic EL substrate 92 in sequence.

The deposition process is sometimes performed inside the deposition apparatus 90 in a high-temperature atmosphere. In this case, during the deposition process, the deposition masks 20, the frame 15 and the organic EL substrate 92, which are held inside the deposition apparatus 90, are also heated. At this time, dimensions of the deposition mask 20, the frame 15 and the organic EL substrate 92 change based on their respective thermal expansion coefficients. Thus, the thermal expansion coefficients of the deposition mask 20 and the frame 15 are preferably values equal to the thermal expansion coefficient of the organic EL substrate 92. In this case, it is possible to restrain a difference in dimensional change rate of the deposition mask 20, the frame 15 and the organic EL substrate 92 based on the thermal expansion coefficients. As a result, the dimensional accuracy and the positional accuracy of the deposition material to be adhered to the organic EL substrate 92 can be restrained from becoming lower, because of thermal expansions of the deposition mask 20, the frame 15, the organic EL substrate 92 and so on.

For example, when a glass substrate is used as the organic EL substrate 92, an iron alloy containing nickel may be used as a main material of the deposition mask 20 and the frame 15. The iron alloy may further contain cobalt in addition to nickel. For example, an iron alloy in which a total content of nickel and cobalt is 28% by mass or more and 54% by mass or less, and a content of cobalt is 0% by mass or more and 6% by mass or less may be used as a material of the metal plate constituting the deposition mask 20.

The content of nickel and cobalt in the metal plate may be 28% by mass or more and 38% by mass or less in total. In this case, specific examples of an iron alloy containing nickel or nickel and cobalt include an invar material, a super invar material, an ultra invar material, etc. The invar material is an iron alloy containing nickel of 34% by mass or more and 38% by mass or less, balancing iron, and inevitable impurities. The super invar material is an iron alloy containing nickel of 30% by mass or more and 34% by mass or less, cobalt, balancing iron, and inevitable impurities. The ultra invar material is an iron alloy containing nickel of 28% by mass or more and 34% by mass or less, cobalt of 2% by mass or more and 7% by mass or less, manganese of 0.1% by mass or more and 1.0% by mass or less, silicon of 0.10% by mass or less, carbon of 0.01% by mass or less, balancing iron, and inevitable impurities.

The content of nickel and cobalt in the metal plate may be 38% by mass or more and 54% by mass or less in total. In this case, specific examples of an iron alloy containing nickel or nickel and cobalt include a low thermal expansion Fe—Ni based plating alloy and so on. The low thermal expansion Fe—Ni based plating alloy is an iron alloy containing nickel of 38% by mass or more and 54% by mass or less, balancing iron, and inevitable impurities.

When the temperatures of the deposition mask 20, the frame 15 and the organic EL substrate 92 do not reach high temperatures during the deposition process, it is not particularly necessary that the thermal expansion coefficients of the deposition mask 20 and the frame 15 are values equal to the thermal expansion coefficient of the organic EL substrate 92. In this case, a material other than the aforementioned iron alloy can be used as the material constituting the deposition mask 20. For example, an iron alloy other than the aforementioned iron alloy containing nickel, such as an iron alloy containing chrome, may be used. An iron alloy referred to as so-called stainless may be used as the iron alloy containing chrome, for example. An alloy other than the iron alloy, such as nickel and nickel-cobalt alloy, may be used.

Next, the deposition mask 20 is described in detail. As shown in FIG. 3, the deposition mask 20 may comprise a first end part 17a and a second end part 17b that are opposed to each other in a first direction D1 of the deposition mask 20, and an intermediate part 18 positioned between the pair of end parts 17a and 17b.

The end part 17a, 17b is firstly described. The end part 17a, 17b is an area that spreads from an end of the deposition mask 20 in the first direction D1. The end part 17a, 17b has an area from which a below-described sample can be cut out. The end part 17a, 17b may be fixed to the frame 15 at least partially. In this embodiment, the end part 17a, 17b is integrally formed with the intermediate part 18. The end part 17a, 17b may be formed of a member separate from the intermediate part 18. In this case, the end part 17a, 17b is joined to the intermediate part 18 by welding, for example.

Next, the intermediate part 18 is described. The intermediate part 18 includes at least one effective area 22 and a peripheral area 23 surrounding the effective area 22. In the effective area 22, through holes 25 extending from the first surface 20a to reach the second surface 20b are provided. The effective area 22 is an area of the deposition mask 20, which faces a display area of the organic EL substrate 92.

In the example shown in FIG. 3, the intermediate part 18 includes a plurality of the effective areas 22 that are arranged along the long side 26 of the deposition mask 20 with predetermined spacings therebetween. One effective area 22 corresponds to a display area of one organic EL display device 100. Thus, the deposition mask apparatus 10 shown in FIG. 1 can perform a multifaceted deposition for the organic EL display devices 100. There is a case where one effective area 22 corresponds to a plurality of display areas. Although not shown, also in a second direction D2 of the deposition mask 20, a plurality of the effective areas 22 may be arranged with predetermined spacings therebetween.

As shown in FIG. 3, the effective area 22 has a profile of a substantially quadrangular shape in a plan view, more precisely a substantially rectangular shape in a plan view. Although not shown, each effective area 22 may have a profile of various shapes depending on a shape of a display area of the organic EL substrate 92. For example, each effective area 22 may have a profile of a circular shape. Each effective area 22 may have a profile that is the same as an outer shape of a display device such as a smartphone.

Figure 4:
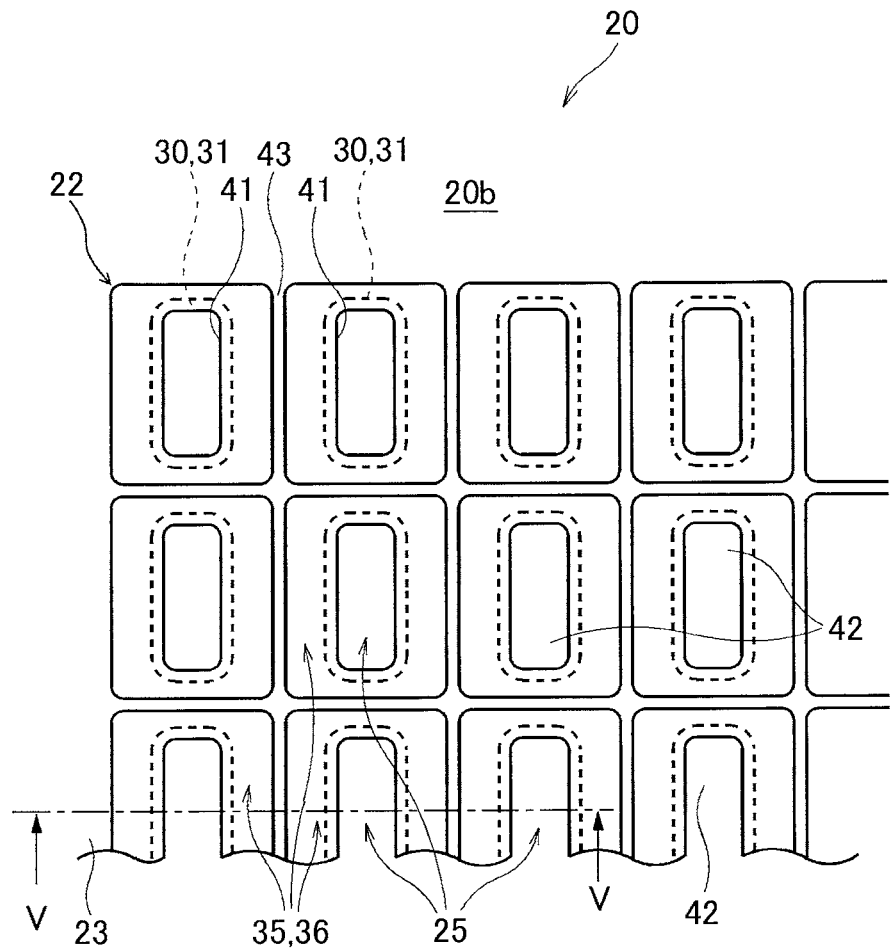
FIG. 4 is a partial plan view showing an effective area of the deposition mask shown in FIG. 3.

Herebelow, the effective area 22 is described in detail. FIG. 4 is an enlarged plan view showing the effective areas 22 viewed at the second surface 20b side of the deposition mask 20. As shown in FIG. 4, in the illustrated example, a plurality of the through holes 25 formed in the respective effective areas 22 may be arranged in these effective areas 22 along two directions orthogonal to each other at respective predetermined pitches.

Figure 5:
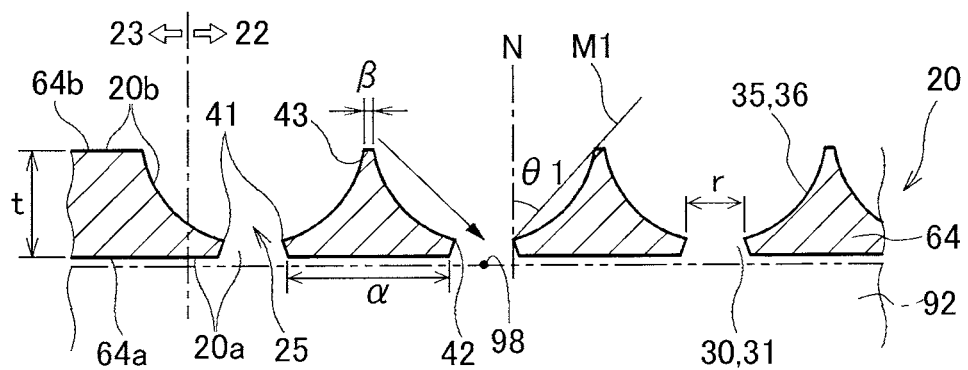
FIG. 5 is a sectional view along a V-V line of FIG. 4.

FIG. 5 is a sectional view along a V-V direction of the effective area 22 of FIG. 4. As shown in FIG. 5, a plurality of the through holes 25 pass through the deposition mask 20 from the first surface 20a which is one side along a normal direction N of the deposition mask 20, to the second surface 20b which is the other side along the normal direction N of the deposition mask 20. In the illustrated example, as described in detail later, a first recess 30 is formed by etching in a first surface 64a of the metal plate 64, which is one side in the normal direction N of the deposition mask 20, and a second recess 35 is formed in a second surface 64b of the metal plate 64, which is the other side in the normal direction N of the deposition mask 20. The first recess 30 is connected to the second recess 35, so that the second recess 35 and the first recess 30 are formed in communication with each other. The through hole 25 is composed of the second recess 35 and the first recess 30 connected to the second recess 35. As shown in FIGS. 4 and 5, a wall surface 31 of the first recess 30 and a wall surface 36 of the second recess 35 are connected to each other through a circumferential connection part 41. In the example shown in FIGS. 4 and 5, the connection part 41 delimits a through part 42 at which an opening area of the through hole 25 is minimum in a plan view of the deposition mask 20.

As shown in FIG. 5, on the first surface 20a side of the deposition mask 20, the adjacent two through holes 25 are separated from each other along the first surface 64a of the metal plate 64. Also on the second surface 20b side of the deposition mask 20, the adjacent two second recesses 35 may be separated from each other along the second surface 64b of the metal plate 64. Namely, the second surface 64b of the metal plate 64 may remain between the adjacent two second recesses 35. In the below description, a part of the effective area 22 of the second surface 64b of the metal plate 64, which is not etched and thus remains, is referred to also as top part 43. By producing the deposition mask 20 such that such a top part 43 remains, the deposition mask 20 can have sufficient strength. Thus, the possibility of damage to the deposition mask 20 during transportation can be reduced, for example. However, when a width β of the top part 43 is excessively large, there is a possibility that shadow occurs in the deposition step, which lowers utilization efficiency of the deposition material 98. Thus, it is preferable that the deposition mask 20 is produced such that the width β of the top portion 43 is excessively large.

When the deposition mask apparatus 10 is received in the deposition apparatus 90 as shown in FIG. 1, the first surface 20a of the deposition mask 20 faces the organic EL substrate 92 as shown by two-dot chain lines in FIG. 5. The second surface 20b of the deposition mask 20 is positioned on the same side as the deposition source 94 holding the deposition material 98. Thus, the deposition material 98 adheres to the organic EL substrate 92 through the second recess 35 whose opening area gradually decreases. As shown by an arrow in FIG. 5 extending from the second surface 20b toward the first surface 20a, the deposition material 98 not only moves from the deposition source 94 toward the organic EL substrate 92 along the normal direction N of the organic EL substrate 92, but also sometimes moves along a direction largely inclined with respect to the normal direction N of the organic EL substrate 92. At this time, when a thickness of the deposition mask 20 is large, the diagonally moving deposition material 98 is likely to be caught in the top part 43, the wall surface 36 of the second recess 35 and the wall surface 31 of the first recess 30, so that a ratio of the deposition material 98 that cannot pass through the through hole 25 increases. Thus, in order to improve the utilization efficiency of the deposition material 98, it is considered to be preferable that the thickness t of the deposition mask 20 is reduced so that heights of the wall surface 36 of the second recess 35 and the wall surface 31 of the first recess 30 are reduced. Namely, it can be said that it is preferable to use, as the metal plate 64 for constituting the deposition mask 20, a metal plate 64 which has the thickness t as small as possible, as long as the strength of the deposition mask 20 can be ensured. The thickness t is a thickness of the peripheral area 23, i.e., a thickness of a part of the deposition mask 20 where the first recess 30 and the second recess 35 are not formed.

Thus, it can be said that the thickness t is a thickness of the metal plate 64. The thickness t of the metal plate 64 may be 100 μm or less, may be 80 μm or less, may be 70 μm or less, may be 60 μm or less, may be 50 μm or less, may be 40 μm or less, may be 30 μm or less, may be 25 μm or less, may be 20 μm or less, or may be 18 μm or less.

On the other hand, when the thickness t of the metal plate 64 is excessively small, the strength of the deposition mask 20 lowers so that the deposition mask 20 is likely to be damaged and/or deformed. In consideration of this point, the thickness t of the metal plate 64 may be, for example, 8 μm or more, may be 10 μm or more, may be 13 μm or more, or may be 15 μm or more.

A range of the thickness t of the metal plate 64 may be determined by a first group consisting of 8 μm, 10 μm, 13 μm and 15 μm, and/or a second group consisting of 18 μm, 20 μm, 25 μm, 30 μm, 40 μm, 50 μm, 60 μm, 70 μm, 80 μm, 90 μm and 100 μm. The range of the thickness t of the metal plate 64 may be determined by a combination of any one of the values included in the aforementioned first group and any one of the values included in the aforementioned second group. The range of the thickness t of the metal plate 64 may be determined by a combination of any two of the values included in the aforementioned first group. The range of the thickness t of the metal plate 64 may be determined by a combination of any two of the values included in the aforementioned second group. For example, the range of the thickness t of the metal plate 64 may be 8 μm or more and 100 μm or less, may be 8 μm or more and 80 μm or less, may be 8 μm or more and 70 μm or less, may be 8 μm or more and 60 μm or less, may be 8 μm or more and 50 μm or less, may be 8 μm or more and 40 μm or less, may be 8 μm or more and 30 μm or less, may be 8 μm or more and 25 μm or less, may be 8 μm or more and 20 μm or less, may be 8 μm or more and 18 μm or less, may be 8 μm or more and 15 μm or less, may be 8 μm or more and 13 μm or less, may be 8 μm or more and 10 μm or less, may be 10 μm or more and 30 μm or less, may be 10 μm or more and 25 μm or less, may be 10 μm or more and 20 μm or less, may be 10 μm or more and 18 μm or less, may be 10 μm or more and 15 μm or less, may be 10 μm or more and 13 μm or less, may be 13 μm or more and 30 μm or less, may be 13 μm or more and 25 μm or less, may be 13 μm or more and 20 μm or less, may be 13 μm or more and 18 μm or less, may be 13 μm or more and 15 μm or less, may be 15 μm or more and 30 μm or less, may be 15 μm or more and 25 μm or less, may be 15 μm or more and 20 μm or less, may be 15 μm or more and 18 μm or less, may be 18 μm or more and 30 μm or less, may be 18 μm or more and 25 μm or less, may be 18 μm or more and 20 μm or less, may be 20 μm or more and 30 μm or less, may be 20 μm or more and 25 μm or less, may be 25 μm or more and 30 μm or less, may be 30 μm or more and 100 μm or less, may be 40 μm or more and 100 μm or less, may be 50 μm or more and 100 μm or less, may be 60 μm or more and 100 μm or less, may be 70 μm or more and 100 μm or less, or may be 80 μm or more and 100 μm or less.

A contact-type measuring method is adopted as a method of measuring the thicknesses of the metal plate 64 and the deposition mask 20. As the contact-type measuring method, a length gauge HEIDENHAIN-Metro "MT1271" manufactured by Heidenhain Com., having a plunger of a ball bush guide type is used.

The metal plate 64 used for manufacturing the deposition mask 20 can be sold and/or transported in the form of a wound body wound around a core. In this case, the aforementioned ranges regarding the thickness t of the metal plate 64 may be satisfied by the metal plate 64 in the wound state.

When the method of manufacturing the deposition mask 20 comprises a step of processing the metal plate 64 to reduce the thickness of the metal plate 64, the aforementioned ranges regarding the thickness t of the metal plate 64 may be satisfied by the metal plate 64 that has been processed to have a reduced thickness. The step of processing the metal plate 64 to reduce the thickness of the metal plate 64 includes a step of entirely etching a part of the first surface 64a or the second surface 64b of the metal plate 64, which corresponds to at least the effective area 22 of the deposition mask 20. Herebelow, the etching of entirely a part of the metal plate 64, which corresponds to at least the effective area 22, is referred to also as slimming.

In a case where the metal plate 64 is slimmed by etching, when a reduction quantity of the thickness of the metal plate 64 is large, the thickness of the thinned metal plate 64 tends to be non-uniform. In consideration of this point, even when the slimming of the metal plate 64 is performed, the thickness t of the metal plate 64 in the wound state is preferably small to some extent. For example, the thickness t of the metal plate 64 may be 50 μm or less, may be 45 μm or less, may be 40 μm or less, or may be 35 μm or less. An upper limit candidate value in this paragraph may be combined with the aforementioned plurality of lower limit candidate values and the aforementioned plurality of upper limit candidate values.

In FIG. 5, a minimum angle defined by a straight line M1 with respect to the normal direction N of the deposition mask 20 is indicated by a symbol $\theta 1$. The straight line M1 passes the connection part 41 constituting the through part 42 of the through hole 25 and another given position of the wall surface 36 of the second recess 35. In order that the diagonally moving deposition material 98 can be caused to reach the substrate 92 without reaching the wall surface 31 as much as possible, it is advantageous that the angle $\theta 1$ is increased. In order to increase the angle $\theta 1$, it is effective to reduce the width $\beta$ of the aforementioned top portion 43, as well as to reduce the thickness t of the deposition mask 20.

In FIG. 5, a symbol $\alpha$ indicates a width of a part (hereinafter also referred to as "rib part") of the effective area 22 of the second surface 64a of the metal plate 64. the rib part is not etched and thus remains. The width $\alpha$ of the rib part and a size r of the through part 42 are suitably determined depending on a size of an organic EL display device and the number of display pixels. For example, the width $\alpha$ of the rib part is 5 μm or more and 40 μm or less, and the size r of the through part 42 is 10 μm or more and 60 μm or less.

The width $\alpha$ of the rib part may be, for example, 5 μm or more, may be 10 μm or more, may be 15 μm or more, or may be 20 μm or more. The width $\alpha$ of the rib part may be, for example, 45 μm or less, may be 50 μm or less, may be 55 μm or less, or may be 60 μm or less. A range of the width $\alpha$ of the rib part may be determined by a first group consisting of 5 μm, 10 μm, 15 μm and 20 μm, and/or a second group consisting of 45 μm, 50 μm, 55 μm and 60 μm. The range of the width $\alpha$ of the rib part may be determined by a combination of any one of the values included in the aforementioned first group and any one of the values included in the aforementioned second group. The range of the width $\alpha$ of the rib part may be determined by a combination of any two of the values included in the aforementioned first group. The range of the width $\alpha$ of the rib part may be determined by a combination of any two of the values included in the aforementioned second group. For example, the range of the width $\alpha$ of the rib part may be 5 μm or more and 60 μm or less, may be 5 μm or more and 55

μm or less, may be 5 μm or more and 50 μm or less, may be 5 μm or more and 45 μm or less, may be 5 μm or more and 20 μm or less, may be 5 μmm or more and 15 μm or less, may be 5 μm or more and 10 μm or less, may be 10 μm or more and 60 μm or less, may be 10 μm or more and 55 μm or less, may be 10 μm or more and 50 μm or less, may be 10 μm or more and 45 μm or less, may be 10 μm or more and 20 μm or less, may be 10 μmm or more and 15 μm or less, may be 15 μm or more and 60 μm or less, may be 15 μm or more and 55 μm or less, may be 15 μm or more and 50 μm or less, may be 15 μm or more and 45 μm or less, may be 15 μm or more and 20 μm or less, may be 20 μm or more and 60 μm or less, may be 20 μm or more and 55 μm or less, may be 20 μm or more and 50 μm or less, may be 20 μm or more and 45 μm or less, may be 45 μm or more and 60 μm or less, may be 45 μm or more and 55 μm or less, may be 45 μm or more and 50 μm or less, may be 50 μm or more and 60 μm or less, may be 50 μm or more and 55 μm or less, or may be 55 μm or more and 60 μm or less.

The size r of the through part 42 may be, for example, 10 μm or more, may be 15 μm or more, may be 20 μm or more, or may be 25 μm or more. The size r of the through part 42 may be, for example, 40 μm or less, may be 45 μm or less, may be 50 μm or less, or may be 55 μm or less. A range of the size r of the through part 42 may be determined by a first group consisting of 10 μm, 15 μm, 20 μm and 25 μm, and/or a second group consisting of 40 μm, 45 μm, 50 μm and 55 μm. The range of the size r of the through part 42 may be determined by a combination of any one of the values included in the aforementioned first group and any one of the values included in the aforementioned second group. The range of the size r of the through part 42 may be determined by a combination of any two of the values included in the aforementioned first group. The range of the size r of the through part 42 may be determined by a combination of any two of the values included in the aforementioned second group. The range of the size r of the through part 42 may be, for example, 10 μm or more and 55 μm or less, may be 10 μm or more and 50 μm or less, may be 10 μm or more and 45 μm or less, may be 10 μm or more and 40 μm or less, may be 10 μm or more and 25 μm or less, may be 10 μm or more and 20 μm or less, may be 10 μm or more and 15 μm or less, may be 15 or more and 55 μm or less, may be 15 μm or more and 50 μm or less, may be 15 μm or more and 45 μm or less, may be 15 μm or more and 40 μm or less, may be 15 μm or more and 25 μm or less, may be 15 μm or more and 20 μm or less, may be 20 μm or more and 55 μm or less, may be 20 μm or more and 50 μm or less, may be 20 μm or more and 45 μm or less, may be 20 μm or more and 40 μm or less, may be 20 μm or more and 25 μm or less, may be 25 or more and 55 μm or less, may be 25 μm or more and 50 m or less, may be 25 μm or more and 45 μm or less, may be 25 μm or more and 40 μm or less, may be 40 μm or more and 55 μm or less, may be 40 μm or more and 50 μm or less, may be 40 μm or more and 45 μm or less, may be 45 μm or more and 55 μm or less, may be 45 μm or more and 50 μm or less, or may be 50 μm or more and 55 μm or less.

FIGS. 4 and 5 show the example in which the the second surface 64b of the metal plate 64 remains between the adjacent two second recesses 35. However, not limited thereto, although not shown, etching may be performed such that the adjacent two second recesses 35 are connected to each other. Namely, there may be a place where no second surface 64b of the metal plate 64 remains between the adjacent two second recesses 35.

Based on the repeated studies of the present inventors, it was observed that, when a pixel density of the deposition mask 20 increased, a plurality of particles included in the metal plate 64 tended to adversely affect the accuracy of the shape of the through holes 25 of the deposition mask 20. A cause thereof is considered below. The cause of the above phenomenon is not limited to the following consideration, and another consideration may be adopted.

A plurality of particles included in the metal plate 64 are firstly described. The present inventors have conducted extensive studies, and found that a plurality of particles are present in the metal plate 64 made of an iron alloy containing iron and nickel, which is used in the manufacture of the deposition mask 20. The particles in the metal plate 64 are generated, for example, due to an additive agent, such as aluminum and silicon, which is added for removing impurities during a melting step of producing a base metal of the metal plate 64. The particles include, as a main component, an element other than iron and nickel. Such particles are sometimes referred to as inclusions. The "main component" is an element having the highest weight % of elements contained in the particles. The particles may be composed of a single element, or may be composed of a compound including a plurality of elements. The "base metal" means a form of the iron alloy before it is rolled. Examples of the base metal include a first ingot, a second ingot, a third ingot, etc. as described below. The "metal plate" means a form of an iron alloy after it has been subjected to a hot rolling step or a cold rolling step.

As described below, when the number of particles included in the metal plate 64 is large and/or when a size of the particle included in the metal plate 64 is large, there is a possibility that the shape of the through hole 25 formed in the metal plate 64 by etching deviates from a design. Herebelow, while describing some of steps for manufacturing the deposition mask 20 using the metal plate 64, an influence of the particles 64d in the metal plate 64 on the manufacturing method of the deposition mask 20 is described.

Figure 6:
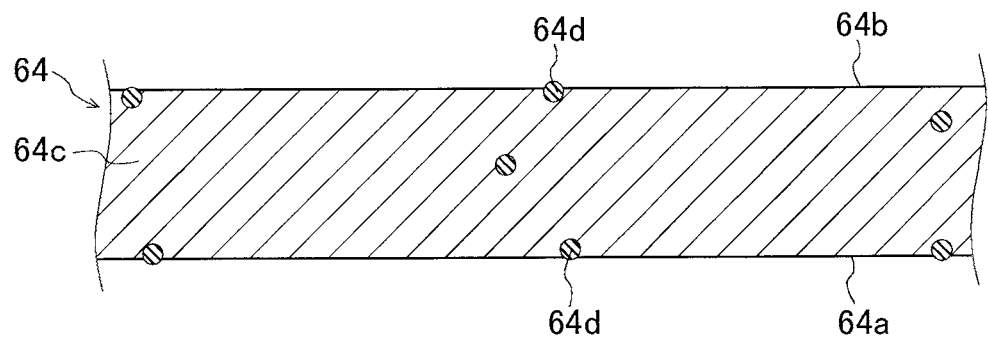
FIG. 6 is a sectional view showing an example of a metal plate comprising particles.

Firstly, a case where the influence of the particles in the metal plate 64 on the accuracy of the shape of the through holes 25 of the deposition mask 20 is so minor that it is negligible is described. FIG. 6 is a sectional view showing an example of the metal plate 64 including the particles 64d. The metal plate 64 comprises a main phase 64c and a plurality of particles 64d present in the main phase 64c. The main phase 64c includes a plurality of crystal grains made of an iron alloy containing iron and nickel, for example. The iron alloy constituting the main phase 64c may contain another element such as cobalt, in addition to iron and nickel. A range of nickel and cobalt contents in the main phase 64c may be the same as the ranges described above regarding the material of the metal plate constituting the deposition mask 20.

The particle 64d is, for example, an object having poor solubility in nitric acid. The partible 64d contains, as a main component, an element other than iron and nickel. For example, the particle 64d has aluminum, magnesium, silicon, phosphorus, sulfur, chromium or zirconium, or a compound containing these elements. The compound is, for example, an oxide, a sulfide, a carbide, a nitride, an intermetallic compound and so on. The shape of the particle 64d is optional, and is granular, for example.

As shown in FIG. 6, the particle 64d may be positioned inside the main phase 64c, or may be positioned on a surface of the main phase 64c. "Positioned on a surface of the main phase 64c" means that the particle 64d is at least partially exposed to the first surface 64a or the second surface 64b of the metal plate 64.

When the particle 64d is positioned inside the main phase 64c, the particle 64d may be positioned in a surface layer of the main phase 64c, or may be positioned in a bulk layer of the main phase 64c. The surface layer is a part where a distance from the first surface 64a or the second surface 64b of the metal plate 64 in the thickness direction is 5 µm or less. The bulk layer is a part where a distance from the first surface 64a or the second surface 64b of the metal plate 64 in the thickness direction is greater than 5 µm.

A plurality of the particles 64d may be uniformly distributed in both the surface layer and the bulk layer of the main phase 64c. A plurality of the particles 64d may be distributed more in the surface layer of the main phase 64c than in the bulk layer thereof. A plurality of the particles 64d may be distributed more in the bulk layer of the main phase 64c than in the surface layer thereof.

Figure 7:
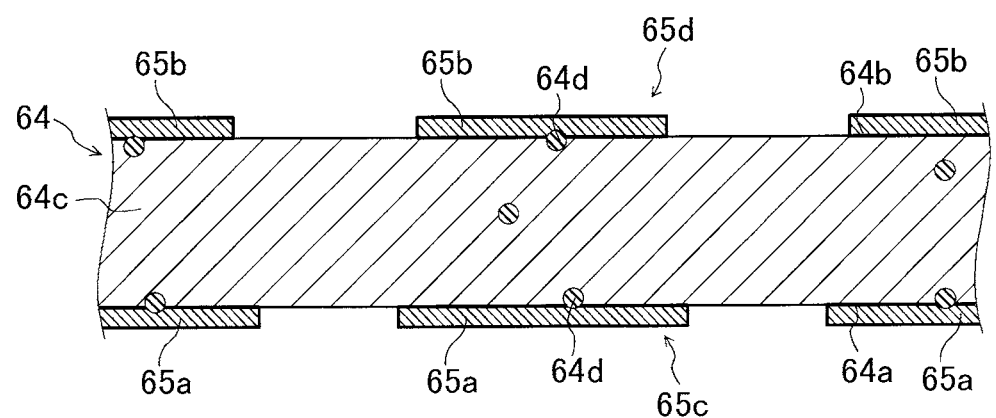
FIG. 7 is a sectional view showing a step of providing a resist pattern on the metal plate shown in FIG. 6.

As shown in FIG. 7, in the manufacturing method of the deposition mask 20, a first resist pattern 65c including a first resist layer 65a is formed on the first surface 64a of the metal plate 64, and a second resist pattern 65d including a second resist layer 65b is formed on the second surface 64b of the metal plate 64. Herebelow, a step of forming the resist patterns 65c and 65d is described.

First, the resist layers 65a and 65b each containing a negative-type photosensitive resist material are formed on the first surface 64a and the second surface 64b of the metal plate 64. For example, a coating liquid containing a photosensitive resist material, such as casein, is applied onto the first surface 64a and the second surface 64b of the metal plate 64. Thereafter, by drying the coating liquid, the resist layers 65a and 65b are formed. Alternatively, the resist layers 65a and 65b may be formed by attaching dry films onto the first surface 64a and the second surface 64b of the metal plate 64. The dry film contains an acrylic photocurable resin, for example.

Then, exposure masks are prepared. The exposure masks do not allow light to reach areas of the resist layers 65a and 65b to be removed. The exposure masks are disposed on the resist layers 65a and 65b. At this time, an alignment step of adjusting a relative positional relationship between the exposure mask on the first surface 64a side and the exposure mask on the second surface 64b side may be performed. A glass dry plate, which does not allow light to reach areas of the resist layers 65a, 65b to be removed, is used as the exposure mask, for example. Thereafter, the exposure masks may be sufficiently brought into close contact with the resist layers 65a and 65b by vacuum adhesion.

As the photoresist material, a positive-type one may be used. In this case, an exposure mask that allows light to reach areas of the resist layer to be removed is used as an exposure mask.

After that, an exposure step of exposing the resist layers 65a and 65b through the exposure masks is performed. Further, in order to form images on the exposed resist layers 65a and 65b, a developing step of developing the resist layers 65a and 65b is performed. In this manner, as shown in FIG. 7, the first resist pattern 65c including the first resist layer 65a can be formed on the first surface 64a of the metal plate 64, and the second resist pattern 65d including the first resist layer 65b can formed on the second surface 64b of the metal plate 64. After the developing step, a resist heat treatment step of heating the resist layers 65a and 65b may be performed. Thus, hardness of the resist layers 65a and 65b can be increased, and/or adhesion of the resist layers 65a and 65b to the metal plate 64 can be increased. The resist heat treatment step may be performed at 25° C. or higher and 400° C. or lower, for example. In addition to the heat treatment step after the developing step of developing the resist layers 65a and 65b, or in place of the heat treatment step after the developing step, the resist heat treatment step of heating the resist layers 65a and 65b may be performed before the developing step of developing the resist layers 65a and 65b.

When the particle 64d is exposed to the surface of the metal plate 64, the resist layer 65a, 65b is in contact not only with the surface of the main phase 64c but also with the particle 64d. Thus, as compared with a case where the resist layer 65a, 65b is in contact only with the surface of the main phase 64c, a contact area between the resist layer 65a, 65b and the metal plate 64 can be increased. This can contribute to improvement in sticking force between the resist layer 65a, 65b and the metal plate 64. An anchoring effect of the particle 64d to the resist layer 65a, 65b also can contribute to improvement in sticking force between the resist layer 65a, 65b and the metal plate 64.

Figure 8:
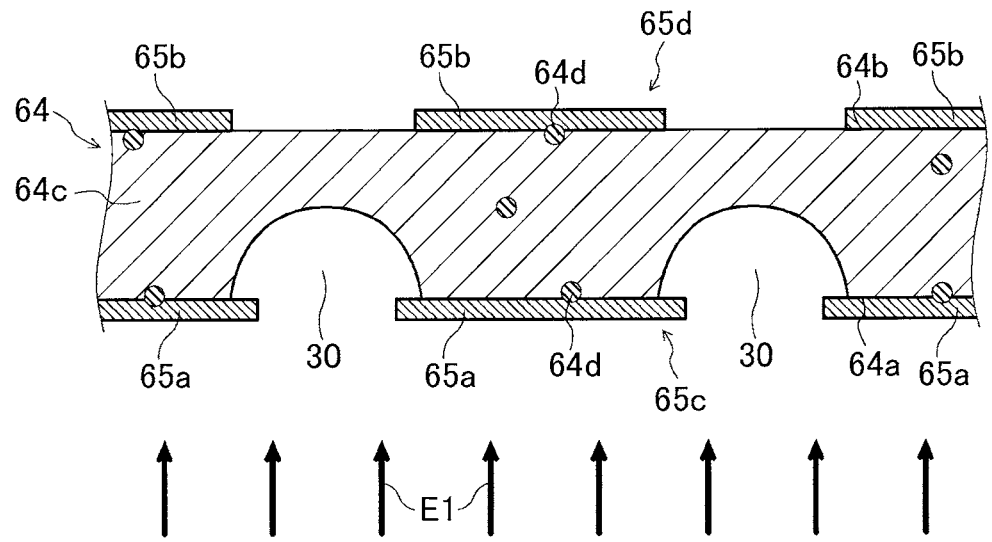
FIG. 8 is a sectional view showing a step of forming a first recess by etching the first surface of the metal plate shown in FIG. 6.

Then, as shown in FIG. 8, a first surface etching step of etching areas of the first surface 64a of the metal plate 64, which are not covered with the first resist layer 65a, is performed by means of a first etchant E1. For example, the first etchant E1 is jetted toward the first surface 64a of the metal plate 64 from a nozzle disposed so as to face the first surface 64a of the metal plate 64. As a result, as shown in FIG. 8, erosion by the first etchant E1 proceeds in the areas of the metal plate 64, which are not covered with the first resist layer 65a. By etching the areas of the first surface 64a of the metal plate 64, which are not covered with the first resist layer 65a, a lot of the first recesses 30 can be formed in the first surface 64a of the metal plate 64. The first etchant E1 to be used may be an etchant containing ferric chloride solution and hydrochloric acid, for example.

Figure 9:
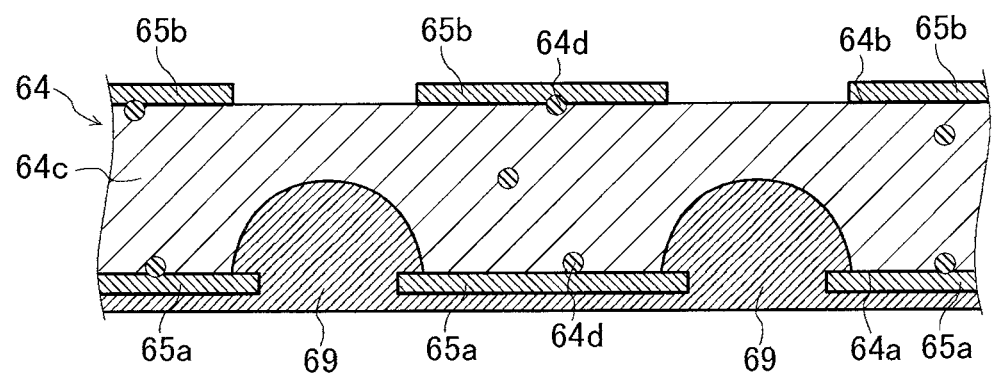
FIG. 9 is a sectional view showing a step of coating the first recess with a resin.

Thereafter, as shown in FIG. 9, the first recesses 30 are coated with a resin 69 having a resistance to a second etchant that is used in a succeeding second surface etching step. For example, the first recesses 30 are sealed by the resin 69 having a resistance to the second etchant. As shown in FIG. 9, a film of the resin 69 may cover the first surface 64a and the first resist pattern 65c, in addition to the first recess 30.

Figure 10:
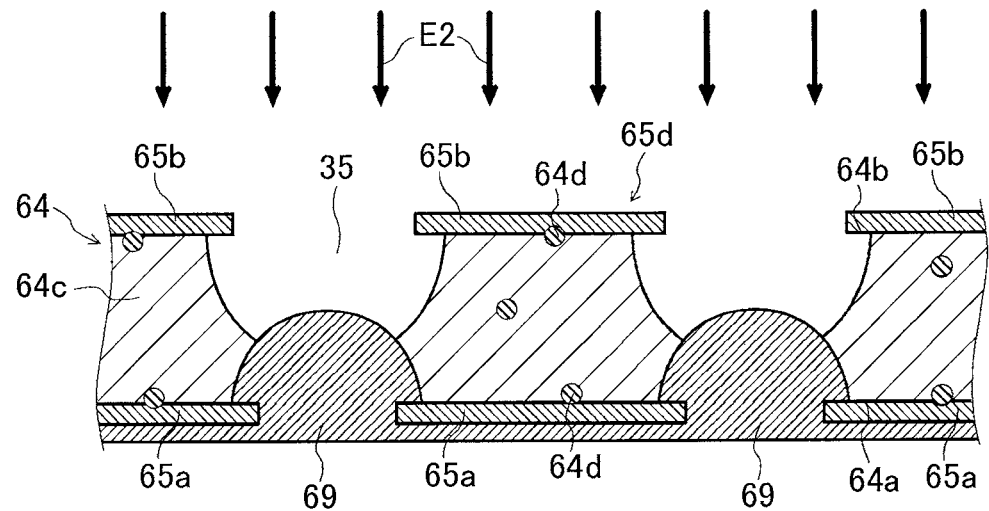
FIG. 10 is a sectional view showing a step of forming a second recess by etching the second surface of the metal plate shown in FIG. 6.

Thereafter, as shown in FIG. 10, the second surface etching step of etching areas of the second surface 64b of the metal plate 64, which are not covered with the second resist layer 65b, is performed so that the second recesses 35 in the second surface 64b are formed. For example, the second etchant E2 is jetted toward the second surface 64b of the metal plate 64 from a nozzle disposed so as to face the second surface 64b of the metal plate 64. As a result, as shown in FIG. 10, erosion by the second etchant E2 proceeds in the areas of the metal plate 64, which are not covered with the second resist layer 65b. By etching the areas of the second surface 64b of the metal plate 64, which are not covered with the second resist layer 65b, a lot of the second recesses 35 can be formed in the second surface 64b of the metal plate 64. The second surface etching step is performed until each first recess 30 and each second recess 35 communicate with each other so that the through hole 25 is formed. The second etchant E2 to be used may be an etchant containing ferric chloride solution and hydrochloric acid, for example.

Figure 11:
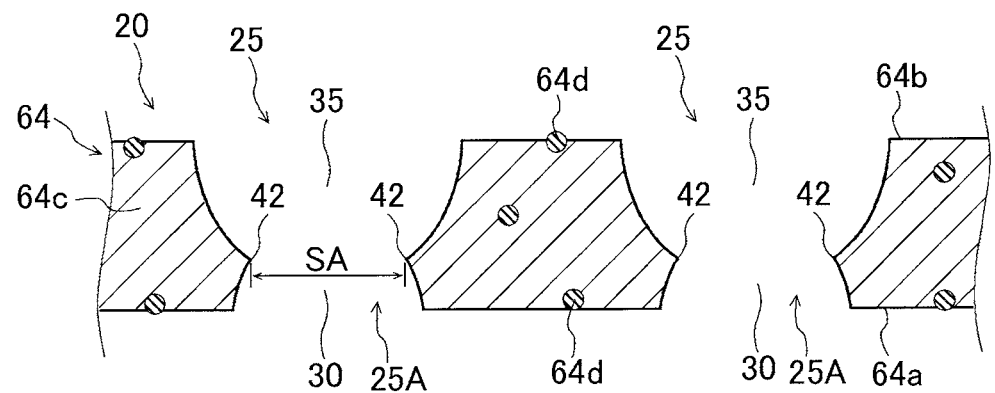
FIG. 11 is a sectional view showing a step of removing the resin and the resist pattern.

Then, as shown in FIG. 11, the resin 69 is removed from the metal plate 64. The resin 69 can be removed by using an alkali-based peeling liquid, for example. When the alkali-based peeling liquid is used, as shown in FIG. 11, the resist layers 65a and 65b may also be removed together with the resin 69. After the resin 69 has been removed, the resist layers 65a and 65b may be removed separately from the resin 69, by using a peeling liquid different from the peeling liquid for peeling the resin 69.

In this manner, a plurality of the through holes 25 can be formed in the metal plate 64. In the description below, a through hole 25 which was formed without being affected by the particle 64d in the metal plate 64 is referred to also as standard through hole, and is indicated by a symbol 25A.

Next, a case where the size of the through hole 25 is smaller than the size of the standard through hole 25A because of the influence from the particle 64d in the metal plate 64 is described. In the below description of the manufacturing method of the deposition mask 20, description of a part that can be similarly constituted to the above embodiment shown in FIGS. 6 to 11 is omitted.

Figure 12:
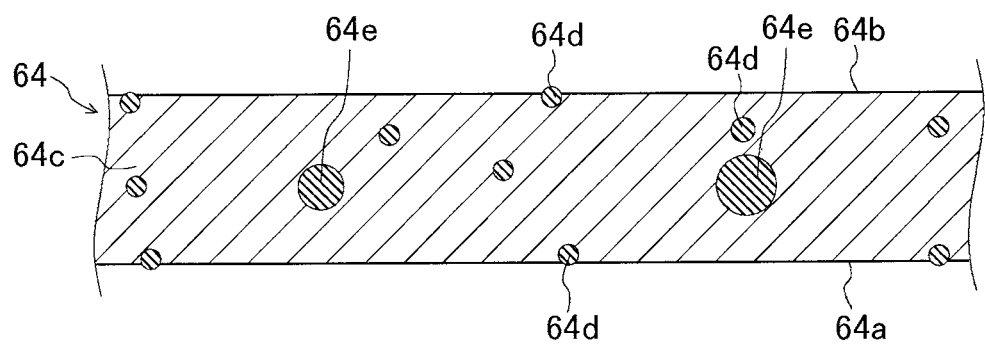
FIG. 12 is a sectional view showing an example of the metal plate comprising particles.

FIG. 12 is a sectional view showing an example of the metal plate 64 including a plurality of the particles 64d. The metal plate 64 shown in FIG. 12 further includes particles having an equivalent circle diameter of 3 μm or more, in addition to relatively small particles such as particles having an equivalent circle diameter of less than 3 μm. In the below description, among the particles 64d, a particle having an equivalent circle diameter of 3 μm or more is also indicated by a symbol 64e. In the example shown in FIG. 12, the particle 64e is present in the bulk layer of the metal plate 64. The particle 64e may be present also in the surface layer of the metal plate 64.

Figure 13:
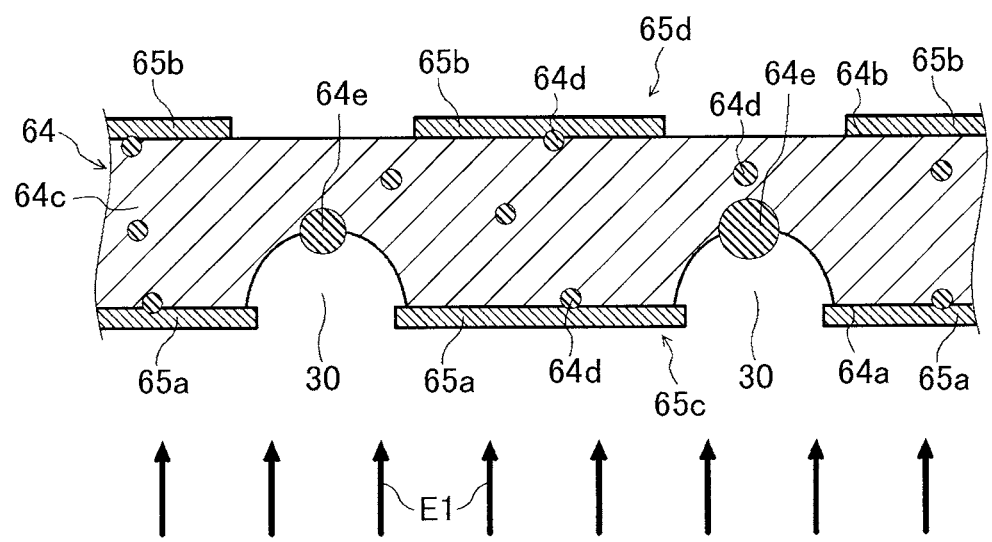
FIG. 13 is a sectional view showing a step of forming a first recess by etching the first surface of the metal plate shown in FIG. 12.
Figure 14:
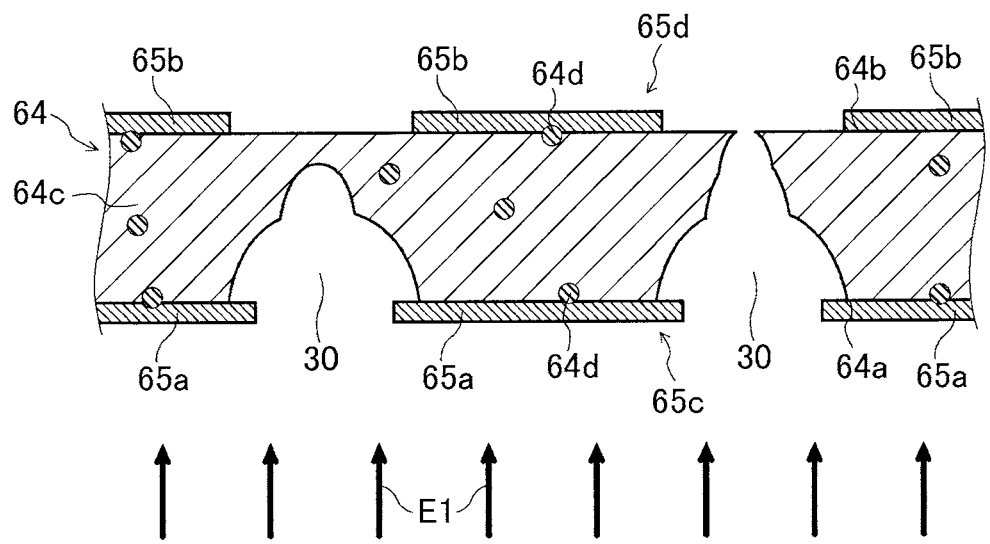
FIG. 14 is a sectional view showing the step of forming the first recess by etching the first surface of the metal plate shown in FIG. 12.

After the resist layers 65a and 65b have been formed on the first surface 64a and the second surface 64b of the metal plate 64, as shown in FIG. 13, the first surface etching step of etching areas of the first surface 64a of the metal plate 64, which are not covered with the first resist layer 65a, is performed by means of the first etchant E1. As a result, as shown in FIG. 13, erosion by the first etchant E1 proceeds in the areas of the metal plate 64, which are not covered with the first resist layer 65a. FIG. 14 shows a state in which the erosion by the first etchant E1 has further progressed.

In the first surface etching step, when the etching proceeds to the place where the particle 64e is present, as shown in FIG. 13, the particle 64e is exposed to the wall surface of the first recess 30. When the etching proceeds from the state shown in FIG. 13, there is a possibility that the particle 64e exposed to the wall surface falls down from the metal plate 64. In this case, a dent is formed in the place of the wall surface of the first recess 30, where the particle 64e was present. In the dent, the etching proceeds deeper than in other portions in the thickness direction of the metal plate 64. As a result, as shown on the right side in FIG. 14, it is conceivable that the first recess 30 formed by etching the first surface 64a of the metal plate 64 reaches the second surface 64b. Alternatively, as shown on the left side in FIG. 14, it is conceivable that the first recess 30 formed by etching the first surface 64a side of the metal plate 64 does not reach the second surface 64b but reaches a position close to the second surface 64b.

Figure 15:
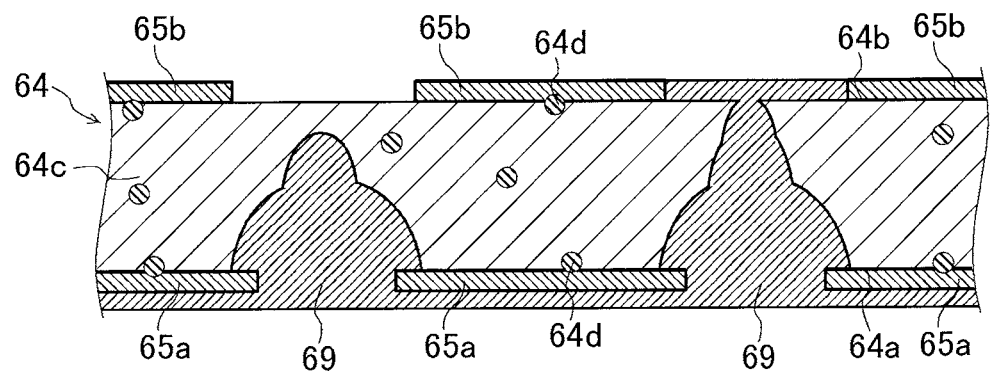
FIG. 15 is a sectional view showing a step of coating the first recess with a resin.

Thereafter, as shown in FIG. 15, the first recess 30 is coated with the resin 69 having a resistance to the second etchant that is used in the succeeding second surface etching step.

In the case where the first recess 30 reaches the second surface 64b as shown on the right side in FIG. 14, as shown on the right side in FIG. 15, it is conceivable that the resin 69 passes through the metal plate 64 to reach the second surface 64b side. In this case, as shown on the right side in FIG. 15, there is a possibility that, on the second surface 64b, a phenomenon in which a layer of the resin 69 is formed in a gap in the second resist layer 65b, namely, a phenomenon in which a part of the second surface 64b is covered with the layer of the resin 69 occurs.

Figure 16:
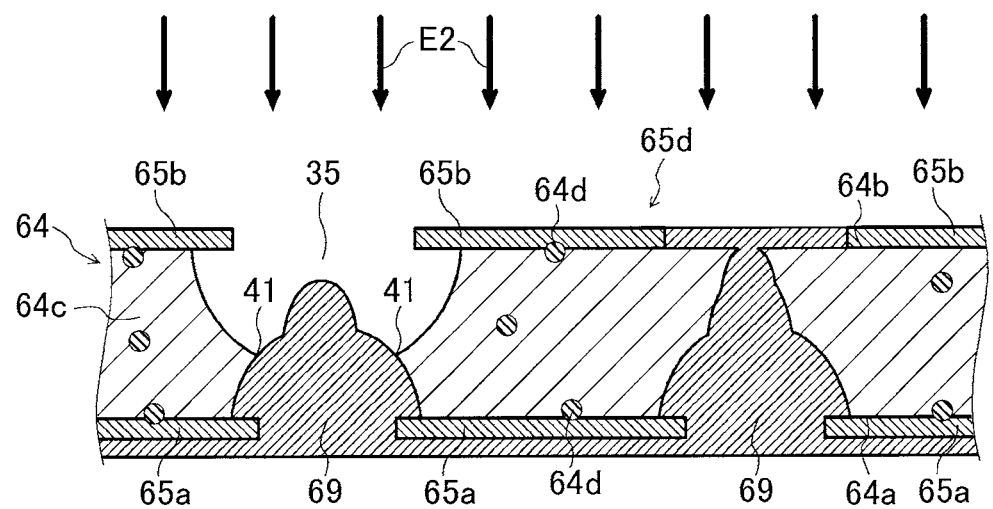
FIG. 16 is a sectional view showing a step of forming a second recess by etching the second surface of the metal plate shown in FIG. 12.

Then, as shown in FIG. 16, the second surface etching step of etching areas of the second surface 64b of the metal plate 64, which are not covered with the second resist layer 65b, is performed so that the second recesses 35 in the second surface 64b are formed. As a result, as shown in FIG. 16, erosion by the second etchant E2 proceeds in the areas of the metal plate 64, which are not covered with the second resist layer 65b.

As shown on the right side in FIG. 16, when the layer of the resin 69 is formed in the gap in the second resist layer 65b, the etching of the second surface 64b is blocked by the layer of the resin 69. Thus, as shown on the right side in FIG. 16, a portion, which is not covered with the second resist layer 65b but is not etched at all, may be generated in the second surface 64b. Alternatively, since the etching of the second surface 64b is blocked by the layer of the resin 69, the size of the second recess 35 may be smaller than that of the standard through hole 25A.

As shown on the left sides in FIGS. 15 and 16, even when the resin 69 does not pass through the metal plate 64 to reach the second surface 64b side, since the resin 69 is excessively provided in the dent of the first recess 30, the flow of the second etchant E2 may be blocked by the resin 69. In this case, a position of the connection part 41 at which the first recess 30 and the second recess 35 are connected to each other may be located closer to the second surface 64b side than a position of the connection part 41 of the standard through hole 25A.

Figure 17:
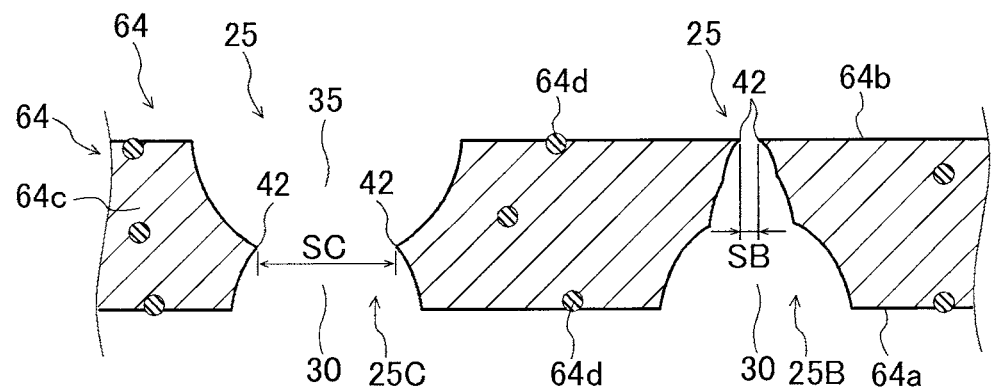
FIG. 17 is a sectional view showing a step of removing the resin and the resist pattern.

Then, as shown in FIG. 17, the resin 69 and the resist layers 65a and 65b are removed from the metal plate 64. In this manner, a plurality of the through holes 25 can be formed in the metal plate 64. In the below description, a through hole 25 having a smaller size than the size of the standard through hole 25A, because of the influence from the particle in the metal plate 64, is referred to also as smaller through hole, and is indicated by a symbol 25B or a symbol 25C.

In the example shown on the right side in FIG. 17, the first recess 30 has a profile on the second surface 64b because the first surface etching step has reached the second surface 64b. The through part 42 at which the opening area of the smaller through hole 25B is minimum is made by the profile of the first recess 30 on the second surface 64b. Thus, a size SB of the through part 42 of the smaller through hole 25B is significantly smaller than the size SA of the through part 42 of the standard through hole 25A.

In the example shown on the left side in FIG. 17, the through part 42 at which the opening area of the smaller through hole 25C is minimum is made by the connection part 41 at which the first recess 30 and the second recess 35 are connected to each other. A position of the connection part 41 of the smaller through hole 25C shown on the left side in FIG. 17 is located closer to the second surface 64b side than that of the standard through hole 25A. Thus, a size SC of the through part 42 of the smaller through hole 25C is smaller than the size SA of the through part 42 of the standard through hole 25A.

Next, a case where the size of the through hole 25 is larger than the size of the standard through hole 25A because of the influence from the particle in the metal plate 64 is described. In the below description of the manufacturing method of the deposition mask 20, description of a part that can be similarly constituted to the above embodiment shown in FIGS. 6 to 11 is omitted.

Figure 18:
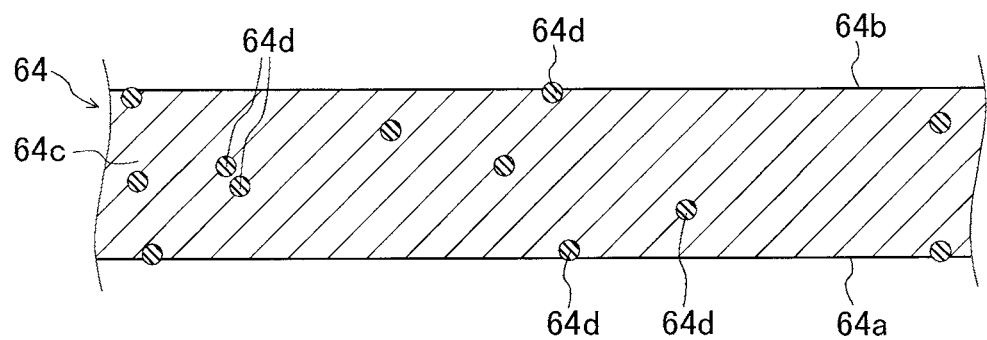
FIG. 18 is a sectional view showing an example of the metal plate comprising particles.

FIG. 18 is a sectional view shown an example of the metal plate 64 including a plurality of particles. The metal plate 64 shown in FIG. 18 includes more particles 64d than the metal plate 64 shown in FIG. 6. In the example shown in FIG. 18, some particles of a plurality of the particles 64d are preset closely to each other.

Figure 19:
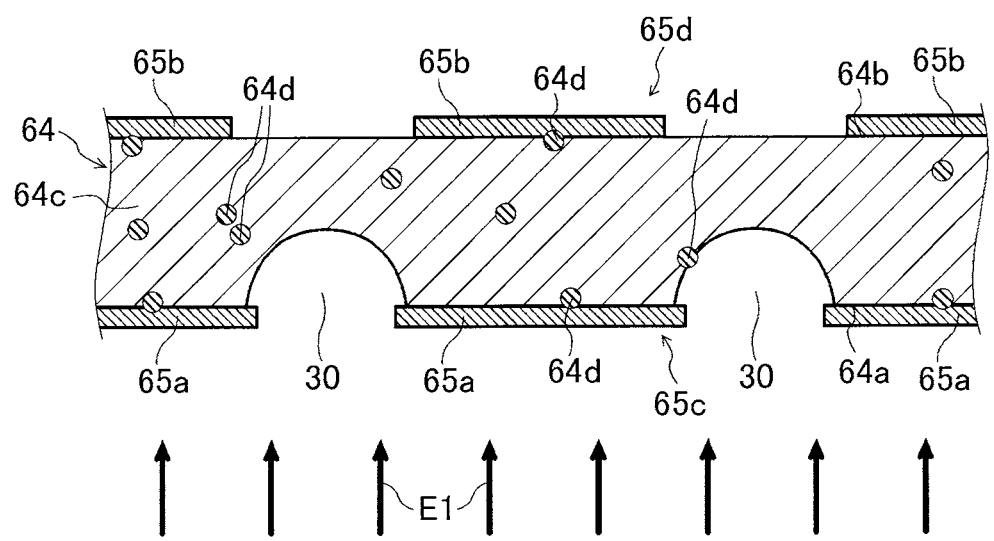
FIG. 19 is a sectional view showing a step of forming a first recess by etching the first surface of the metal plate shown in FIG. 18.
Figure 20:
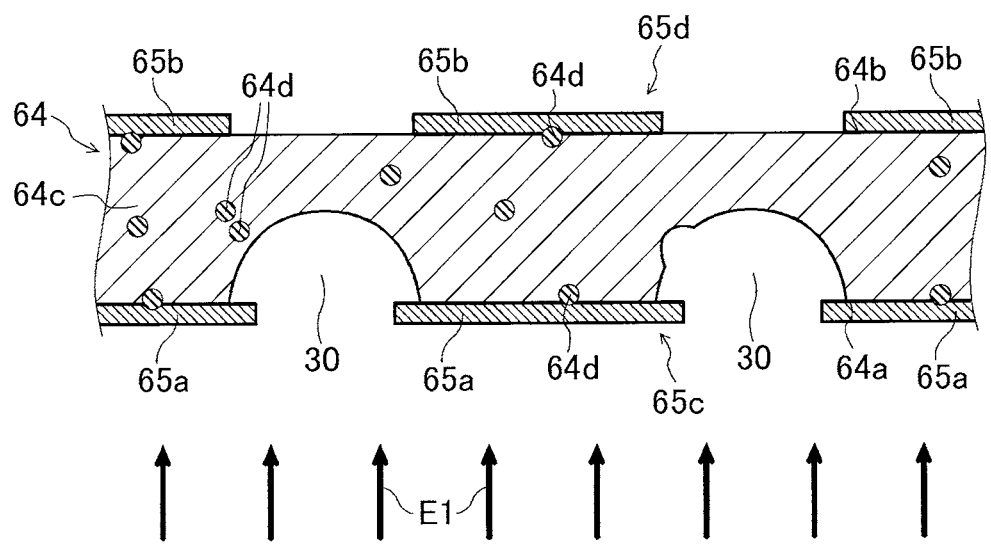
FIG. 20 is a sectional view showing the step of forming the first recess by etching the first surface of the metal plate shown in FIG. 18.

After the resist layers 65a and 65b have been formed on the first surface 64a and the second surface 64b of the metal plate 64, as shown in FIG. 19, the first surface etching step of etching areas of the first surface 64a of the metal plate 64, which are not covered with the first resist layer 65a, is performed by means of the first etchant E1. As a result, as shown in FIG. 19, erosion by the first etchant E1 proceeds in the areas of the metal plate 64, which are not covered with the first resist layer 65a. FIG. 20 shows a state in which the erosion by the first etchant E1 has further progressed. In the example shown on the right side in FIG. 20, the particle 64d exposed to the wall surface has fallen down from the metal plate 64, so that a dent is formed in the wall surface of the first recess 30.

Figure 21:
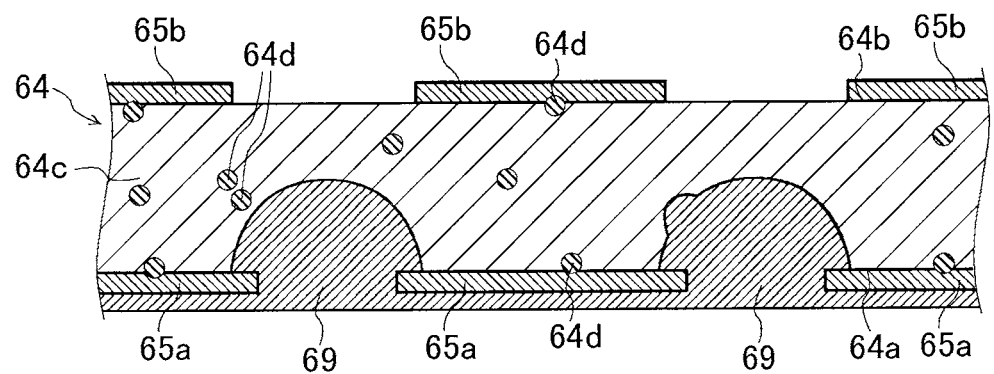
FIG. 21 is a sectional view showing a step of coating the first recess with a resin.

Thereafter, as shown in FIG. 21, the first recess 30 is coated with the resin 69 having a resistance to the second etchant that is used in the succeeding second surface etching step.

Figure 22:
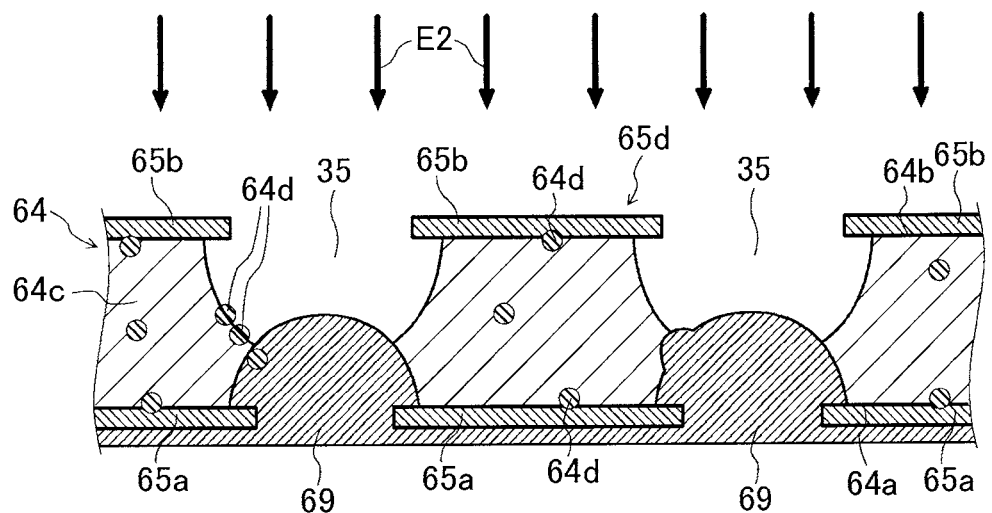
FIG. 22 is a sectional view showing a step of forming a second recess by etching the second surface of the metal plate shown in FIG. 18.
Figure 23:
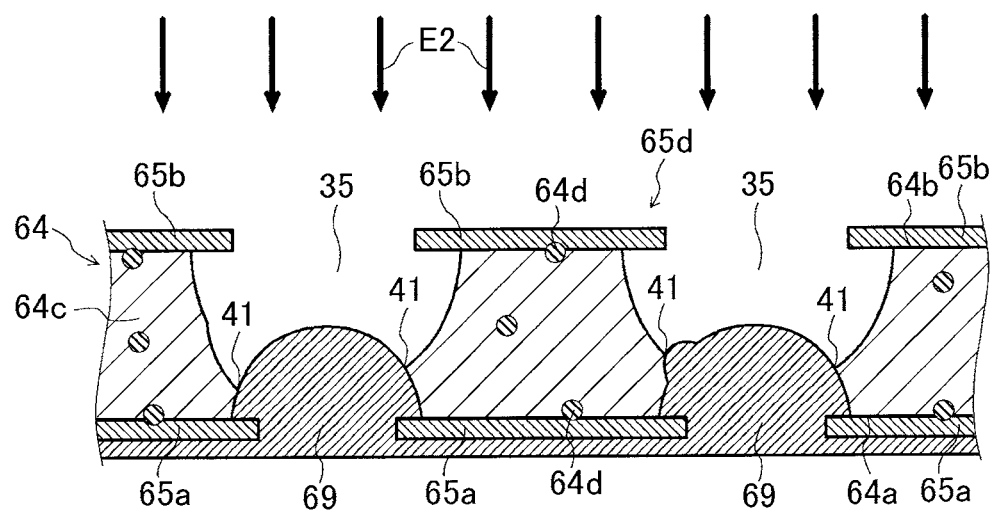
FIG. 23 is a sectional view showing the step of forming the second recess by etching the second surface of the metal plate shown in FIG. 18.

Then, as shown in FIG. 22, the second surface etching step of etching areas of the second surface 64b of the metal plate 64, which are not covered with the second resist layer 65b, is performed so that the second recesses 35 in the second surface 64b are formed. As a result, as shown in FIG. 22, erosion by the second etchant E2 proceeds in the areas of the metal plate 64, which are not covered with the second resist layer 65b. FIG. 23 shows a state in which the erosion by the second etchant E2 has further progressed. In the example shown on the left side in FIG. 23, a plurality of the particles 64d exposed to the wall surface have fallen down from the metal plate 64. As a result, dents corresponding to the particles 64d are formed in the wall surface of the second recess 35.

Figure 24:
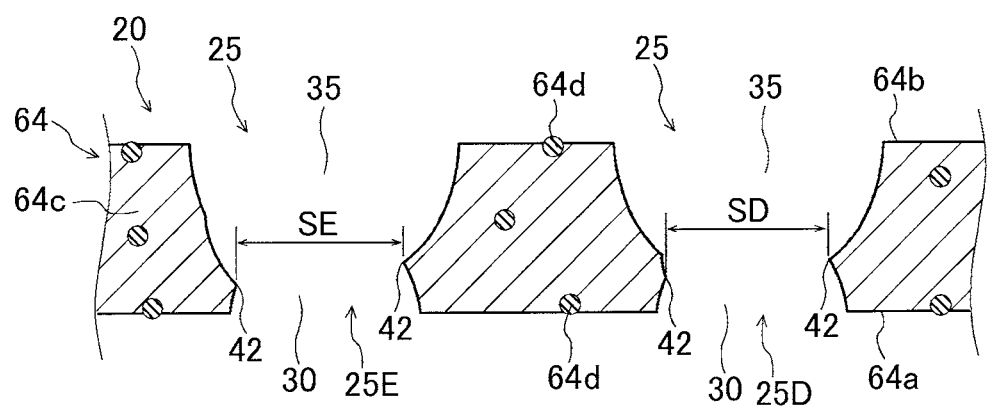
FIG. 24 is a sectional view showing the resin and the resist pattern.

Then, as shown in FIG. 24, the resin 69 and the resist layers 65a and 65b are removed from the metal plate 64. In this manner, a plurality of the through holes 25 can be formed in the metal plate 64. In the below description, a through hole 25 having a larger size than the size of the standard through hole 25A, because of the influence from the particle in the metal plate 64, is referred to also as larger through hole, and is indicated by a symbol 25D or a symbol 25E.

In the example shown on the right side in FIG. 24, the through part 42 at which the opening area of the larger through hole 25D is minimum is partly made by the profile of the dent formed in the first recess 30. Thus, a size SD of the through part 42 of the larger through hole 25D is larger than the size SA of the through part 42 of the standard through hole 25A.

In the example shown on the left side in FIG. 24, the erosion by the second etchant E2 proceeds deeper in a portion of the second recess 35 where the dents are formed. Thus, a part of the connection part 41 at which the first recess 30 and the second recess 35 are connected to each other is positioned closer to the first surface 64a side than the connection part 41 of the standard through hole 25A. As a result, a size SE of the through part 42 of the larger through hole 25E is larger than the size SA of the through part 42 of the standard through hole 25A. In the example shown on the left side in FIG. 24, the dents, which were formed because the plurality of particles 64 positioned close to each other had fallen down, affect the through part 42 of the through hole 25. Thus, the size SE of the through part 42 of the larger through hole 25E may be larger than the size SD of the through part 42 of the larger through hole 25D.

Figure 25:
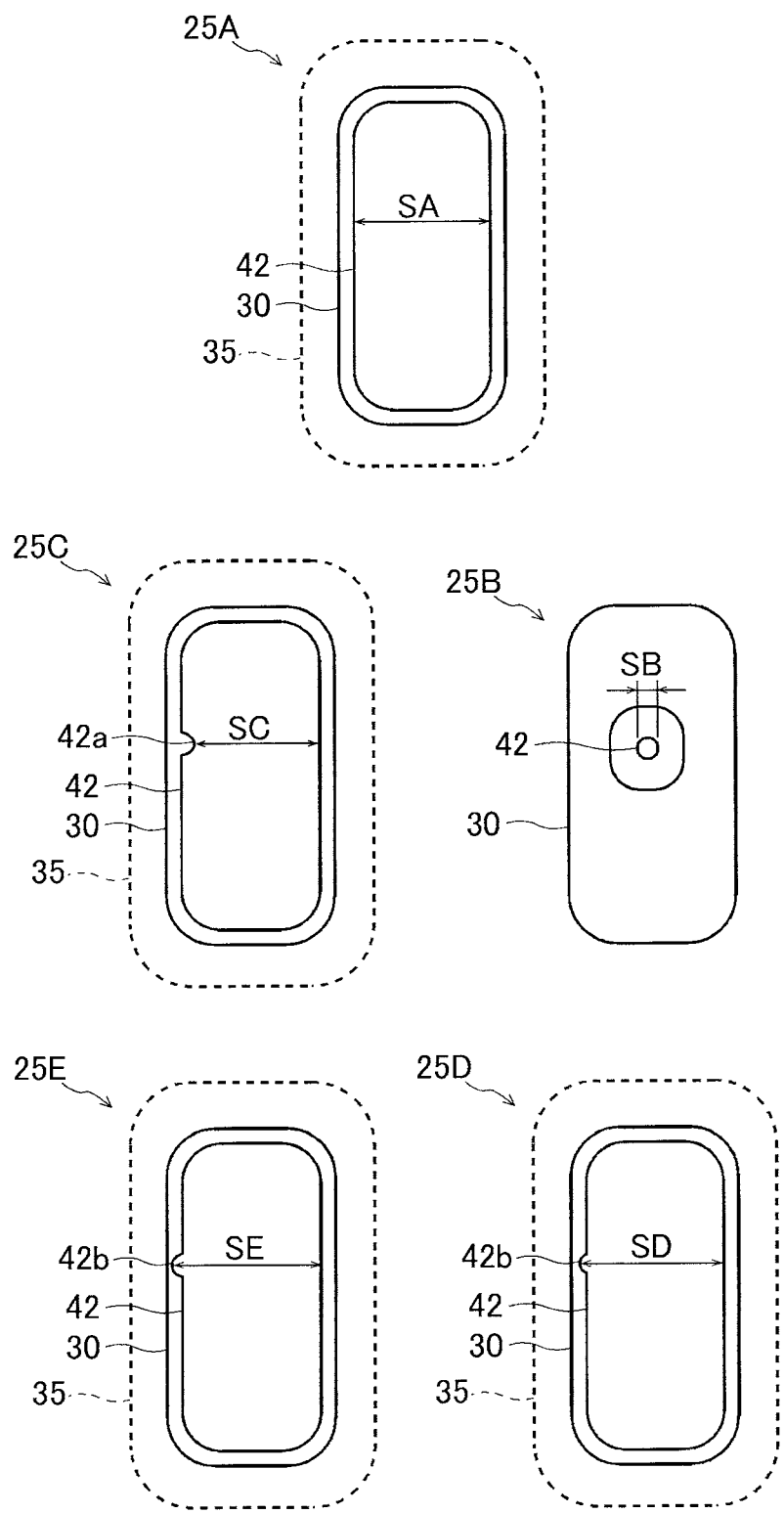
FIG. 25 is a plan view showing plural types of through holes formed in the metal plate viewed at the first surface side.

FIG. 25 is a plan view showing the aforementioned plural types of the through holes 25A to 25E viewed at the first surface 64a side. The sizes SB and SC of the smaller through holes 25B and 25C are smaller than the size SA of the standard through hole 25A. The size SB of the smaller through hole 25B is smaller than the size SC of the smaller through hole 25C. The sizes SD and SE of the larger through holes 25D and 25E are larger than the size SA of the standard through hole 25A. The size SE of the larger through hole 25E is larger than the size SD of the larger through hole 25D.

Next, a case where no through hole 25 is formed in the metal plate 64 because of the influence from the particle in the metal plate 64 is described. In the below description of the manufacturing method of the deposition mask 20, description of a part that can be similarly constituted to the above embodiment shown in FIGS. 6 to 11 is omitted.

Figure 54:
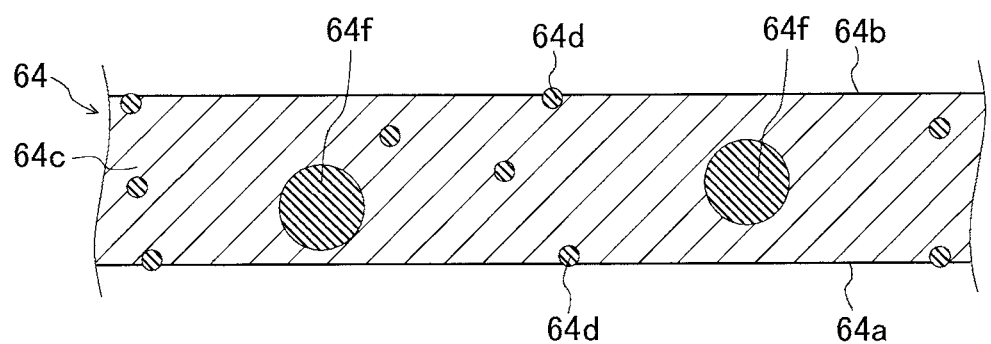
FIG. 54 is a sectional view showing an example of a metal plate comprising particles.

FIG. 54 is a sectional view showing an example of the metal plate 64 including a plurality of the particles 64d. The metal plate 64 shown in FIG. 54 includes particles having an equivalent circle diameter of 5 μm or more. In the below description, a particle 64d having an equivalent circle diameter of 5 μm or more is also indicated by a symbol 64f. In the example shown in FIG. 55, the particle 64f is present in the bulk layer of the metal plate 64. The particle 64f may be present also in the surface layer of the metal plate 64.

Figure 55:
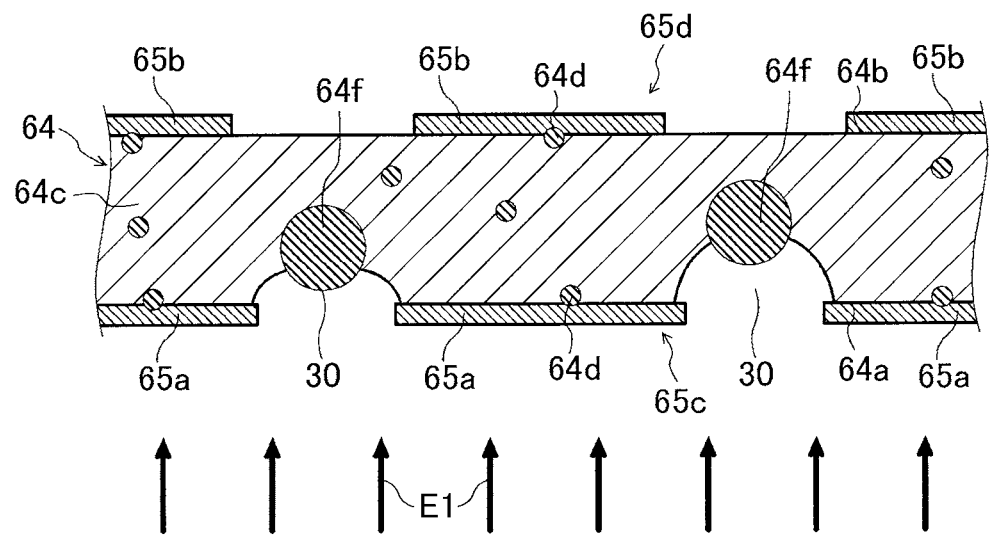
FIG. 55 is a sectional view showing a step of forming a first recess by etching the first surface of the metal plate shown in FIG. 54.
Figure 56:
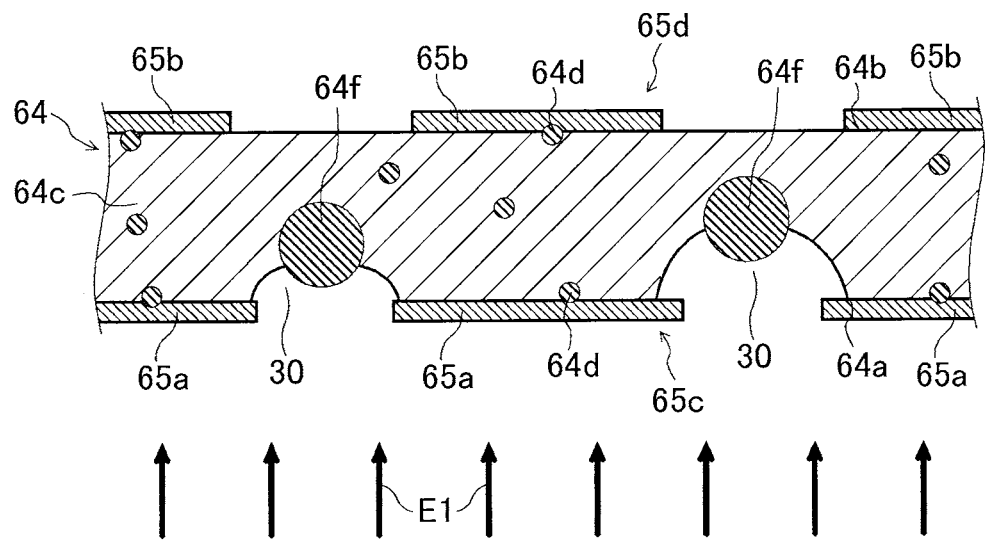
FIG. 56 is a sectional view showing the step of forming the first recess by etching the first surface of the metal plate shown in FIG. 54.

As shown in FIG. 55, areas of the first surface 64a, which are not covered with the first resist layer 65a, are etched by means of the first etchant E1. Erosion by the first etchant E1 proceeds in the areas which are not covered with the first resist layer 65a. Thus, the first recesses 30 are formed in the first surface 64a. FIG. 56 shows a state in which the erosion by the first etchant E1 has further progressed.

In the left-side example shown in FIG. 56, the particle 64f is positioned close to the first surface 64a. In this case, there is a possibility that the flow of the first etchant E1 is blocked by the particle 64f. Thus, as shown in FIG. 56, there is a possibility that the first recess 30 is smaller than that of the standard through hole 25A.

Figure 57:
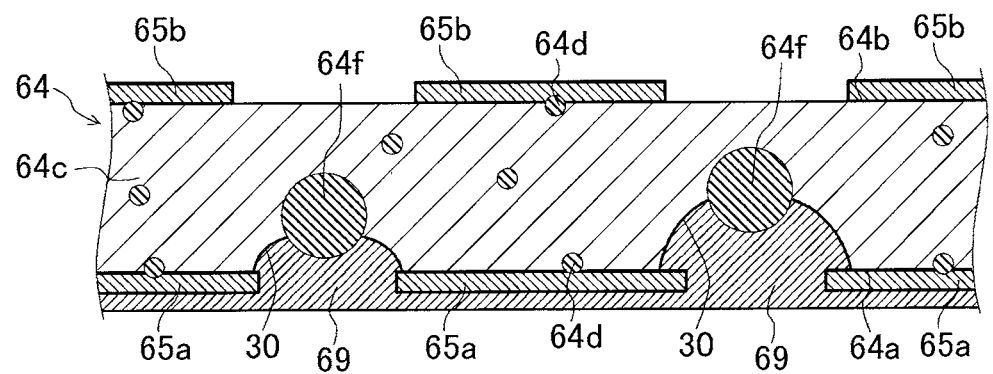
FIG. 57 is a sectional view showing a step of coating the first recess with a resin.

Thereafter, as shown in FIG. 57, the first recess 30 is coated using the resin 69. The resin 69 may be in contact with the particle 64f. In this case, a dent corresponding to the particle 64f is formed in the surface of the resin 69.

Figure 58:
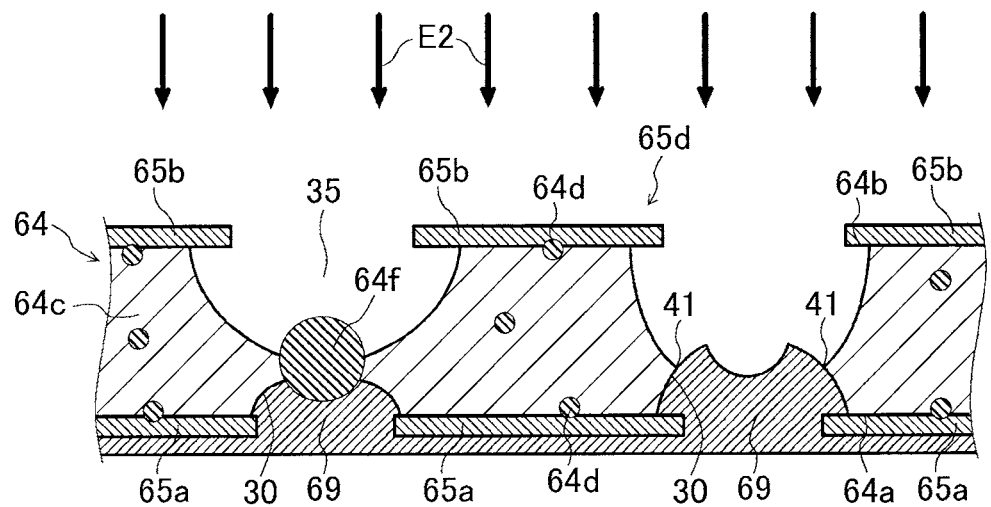
FIG. 58 is a sectional view showing a step of forming a second recess by etching the second surface of the metal plate shown in FIG. 54.

Then, as shown in FIG. 58, areas of the second second surface, which are not covered with the second resist layer 65b, are etched by means of the second etchant E2. Erosion by the second etchant E2 proceeds in the areas which are not covered with the second etchant E2. Thus, the second recesses 25 are formed in the second surface 64b.

In the example shown on the left side in FIG. 58, since the first recess 30 is small, there is a possibility that the etching of the second surface 64b does not reach the first recess 30. Namely, there is a possibility that the second recess 35 is not connected to the first recess 30.

In the example shown on the right side in FIG. 58, the particle 64f has fallen down from the metal plate 64 and the resin 69. When the particle 64f has fallen down, there is a possibility that the flow of the second etchant E2 is promoted. Thus, in the example shown on the right side in FIG. 58, there is a possibility that the second recess 35 is larger than that of the standard through hole 25A. In this case, there is a possibility that the position of the connection part 41 is located closer to the first surface 64a side than a position of the connection part 41 of the standard through hole 25A.

Figure 59:
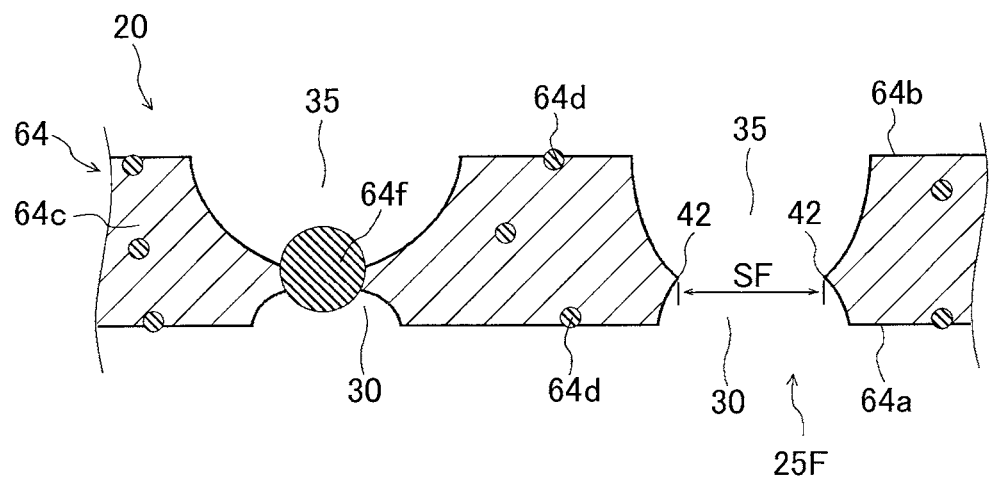
FIG. 59 is a sectional view showing a step of removing the resin and the resist pattern.

Then, as shown in FIG. 59, the resin 69 and the resist layers 65*a* and 65*b* are removed from the metal plate 64. In the example shown on the left side in FIG. 59, since the second recess 35 is not connected to the first recess 30, the through hole 25 does not exist. In the below description, the portion at which the first recess 30 and the second recess 35 are not connected to each other is referred to also as non-through portion.

In the example shown on the right side in FIG. 59, the through part 42 is made by the connection part 41. The position of the connection part 41 is located closer to the first surface 64*a* side than a position of the connection part 41 of the standard through hole 25A. Thus, a size SF of the through hole 25F is larger than the size SA of the standard through hole 25A. Namely, the through hole 25F in the example shown on the right side in FIG. 59 is the larger through hole.

As described above, when the metal plate 64 includes a particle having an equivalent circle diameter of 5 μm or more, there is a possibility that a non-through portion or a larger through hole is generated. Although not shown, similarly to the example shown on the right side in FIG. 17, there is a possibility that a smaller through hole is generated.

A particle having an equivalent circle diameter of 5 μm or more may cause various defects. Thus, a probability that one particle having an equivalent circle diameter of 5 μm or more causes a defective deposition mask is higher than a probability that one particle having an equivalent circle diameter of 3 μm or more causes a defective deposition mask.

The particle 64*d*, 64*e*, 64*f* included in the metal plate 64 may adversely affect the accuracy of the shape of the through hole 25 of the deposition mask 20. There is a possibility that the decrease in dimensional accuracy of the through hole 25 is particularly remarkable when the thickness of the metal plate 64 is small. This is because a ratio of the size of the particle 64*d*, 64*e*, 64*f* to the thickness of the metal plate 64 is large.

In order to solve such a problem, this embodiment proposes to use a metal plate in which the following conditions (1) and (2) are satisfied is used as the metal plate 64. A sample is taken out from the metal plate 64.
(1) The number of the particles having an equivalent circle diameter of 1 μm or more is 50 or more and 3000 or less per 1 $mm^3$ in the sample; and
(2) the number of the particles having an equivalent circle diameter of 3 μm or more is 50 or less per 1 $mm^3$ in the sample.

As shown in the aforementioned FIGS. 18 to 24, when the number of particles 64*d* included in the metal plate 64 increases, a dent caused by the falling down of the particle 64*d* is likely to be formed. As a result, the size of the through hole 25 is likely to deviate from the design value. For example, the larger through hole 25D, 25E having a size larger than the size of the standard through hole 25A is likely to be formed. As in the above condition (1), by setting the upper limit of the number of the particles having an equivalent circle diameter of 1 μm or more to 3000 per 1 $mm^3$ in the sample, deviation of the size of the through hole 25 from the design value can be restrained, as supported by the examples described later. In particular, it is possible to restrain the size of the through hole 25 from becoming larger than the design value.

On the other hand, as described above, a particle exposed to the surface of the metal plate 64 may contribute to the improvement in sticking force between the resist layer 65*a*, 65*b* and the metal plate 64. Thus, by setting the lower limit of the number of the particles having an equivalent circle diameter of 1 μm or more to 50 per 1 $mm^3$ in the sample, the resist layer 65*a*, 65*b* of the resist pattern 65*c*, 65*d* can be restrained from peeling off from the metal plate 64, during a manufacturing method of the deposition mask 20 such as an etching step.

As a pixel density of a display device increases, an arrangement cycle of the through holes 25 of the deposition mask 20 becomes shorter, so that a size such as a width of the resist layer 65*a*, 65*b* of the resist patter 65*a*, 65*b* decreases. On the other hand, when the size such as the width of the resist layer 65*a*, 65*b* is small so that an area of the resist layer 65*a*, 65*b* is small, the resist layer 65*a*, 65*b* is more likely to peel off from the metal plate 64 during the manufacturing method of the deposition mask. According to this embodiment, since the sticking force between the resist layer 65*a*, 65*b* and the metal plate 64 can be improved, it is easy to adopt the resist layer 65*a*, 65*b* of a small size. Thus, it is easy to shorten the arrangement cycle of the through holes 25 of the deposition mask 20, whereby a display device having a high pixel density can be produced.

As shown in the aforementioned FIGS. 12 to 17, when the size of the particle 64*e* included in the metal plate 64 is large, it is conceivable that the first recess 30, which is formed in the first surface 64*a* by the first surface etching step, reaches the second surface 64*b*, and/or that the resin 69 provided in the first recess 30 reaches the vicinity of the second surface 64*b*. In this case, the second surface etching step performed at the second surface 64*b* may be blocked by the resin 69. Thus, for example, the smaller through hole 25B, 25C having a size smaller than of the size of the standard through hole 25A is likely to be formed. In order to cope with this, as in the aforementioned condition (2), by setting the upper limit of the number of the particles having an equivalent circle diameter of 3 μm or more to 50 per 1 $mm^3$ in the sample, deviation of the size of the through hole 25 from the design value can be restrained, as supported by the examples described later. In particular, it is possible to restrain the size of the through hole 25 from becoming smaller than the design value.

As described above, the smaller the thickness of the metal plate 64 is, the more likely it is that the adverse effect caused by the particle 64*d*, 64*e* will occur. By using the embodiment of this disclosure, even when the relatively thin metal plate 64 having a thickness of 30 μm or less or 20 μm or less, the deposition mask 20 comprising the through holes 25 having a desired dimensional accuracy can be produced, as supported by the examples described later.

A metal plate in which the following condition (3) is satisfied may be used as the metal plate 64.
(3) The number of the particles having an equivalent circle diameter of 1 μm or more is 1000 or less per 1 $mm^3$ in the sample.

When the metal plate 64 satisfies the condition (3), it is possible to restrain a plurality of the particles 64*d* from being present closely to one another in the metal plate 64. Thus, it is possible to restrain a plurality of the particles 64*d* from falling down from the wall surface of the one first recess 30 or the wall surface of the one second recess 25. Therefore, it is possible to restrain a dent of a larger volume, e.g., a dent corresponding to volumes of a plurality of the particles 64*d*, from being formed in the wall surface of the first recess 30 or the wall surface of the second recess 35. As a result, deviation of the size of the through hole 25 from the design value can be restrained. In particular, it is possible to restrain the size of the through hole 25 from becoming larger than the design value.

In the conditions (1) and (3), although the examples of the upper limit values and the examples of the lower limit values of the number of the particles per 1 mm$^3$ in the sample, the particles having an equivalent circle diameter of 1 μm or more, are described, other upper limit values and lower limit values can be adopted. The number of the particles having an equivalent circle diameter of 1 μm or more may be, for example, 50 or more, may be 100 or more, may be 200 or more, or may be 300 or more per 1 mm$^3$ in the sample. The number of the particles having an equivalent circle diameter of 1 μm or more may be, for example, 3000 or less, may be 2000 or less, may be 1000 or less, or may be 500 or less per 1 mm$^3$ in the sample.

The number of the particles having an equivalent circle diameter of 1 μm or more may be, for example, example, 50 or more, may be 100 or more, may be 200 or more, or may be 300 or more per 1 mm$^3$ in the sample. The number of the particles having an equivalent circle diameter of 1 μm or more may be, for example, 500 or less, may be 1000 or less, may be 2000 or less, or may be 3000 or less per 1 mm$^3$ in the sample. A range of the number of the particles having an equivalent circle diameter of 1 μm or more may be determined by a first group consisting of 50, 100, 200 and 300 per 1 mm$^3$ in the sample, and/or a second group consisting of 500, 1000, 2000 and 30000 per 1 mm$^3$ in the sample. The range of the number of the particles having an equivalent circle diameter of 1 μm or more may be determined by a combination of any one of the values included in the aforementioned first group and any one of the values included in the aforementioned second group. The range of the number of the particles having an equivalent circle diameter of 1 μm or more may be determined by a combination of any two of the values included in the aforementioned first group. The range of the number of the particles having an equivalent circle diameter of 1 μm or more may be determined by a combination of any two of the values included in the aforementioned second group. For example, the range of the number of the particles having an equivalent circle diameter of 1 μm or more may be 50 or more and 3000 or less, may be 50 or more and 2000 or less, may be 50 or more and 1000 or less, may be 50 or more and 500 or less, may be 50 or more and 300 or less, may be 50 or more and 200 or less, may be 50 or more and 100 or less, may be 100 or more and 3000 or less, may be 100 or more and 2000 or less, may be 100 or more and 1000 or less, may be 100 or more and 500 or less, may be 100 or more and 300 or less, may be 100 or more and 200 or less, may be 200 or more and 3000 or less, may be 200 or more and 2000 or less, may be 200 or more and 1000 or less, may be 200 or more and 500 or less, may be 200 or more and 300 or less, may be 300 or more and 3000 or less, may be 300 or more and 2000 or less, may be 300 or more and 1000 or less, may be 300 or more and 500 or less, may be 500 or more and 3000 or less, may be 500 or more and 2000 or less, may be 500 or more and 1000 or less, may be 1000 or more and 3000 or less, may be 1000 or more and 2000 or less, or may be 2000 or more and 3000 or less per 1 mm$^3$ in the sample.

A metal plate in which the following condition (4) is satisfied may be used as the metal plate 64.
(4) The number of the particles having an equivalent circle diameter of 3 μm or more is 20 or less per 1 mm$^3$ in the sample.

When the metal plate 64 satisfies the condition (4), it is possible to further restrain the first recess 30, which is formed in the first surface 64a by the first surface etching step, from reaching the second surface 64b, and/or the resin 69 provided in the first recess 30 from reaching the vicinity of the second surface 64b. Thus, it is possible to restrain the second surface etching, which is performed at the second surface 64b, from being blocked by the resin 69. As a result, formation of the smaller through hole 25B, 25C can be further restrained.

In the conditions (2) and (4), although the examples of the upper limit values of the number of the particles per 1 mm$^3$ in the sample, the particles having an equivalent circle diameter of 3 μm or more, are described, other upper limit values can be adopted. The number of the particles having an equivalent circle diameter of 3 μm or more may be, for example, 50 or less, may be 40 or less, may be 30 or less, may be 20 or less, may be 15 or less, may be 10 or less, or may be 5 or less per 1 mm$^3$ in the sample.

A metal plate in which the following condition (5) is satisfied may be used as the metal plate 64.
(5) The number of the particles having an equivalent circle diameter of 5 μm or more is 20 or less per 1 mm$^3$ in the sample.

When the metal plate 64 satisfies the condition (5), it is possible to restrain the flow of the etchant from being blocked by the particles. Thus, formation of the non-through portion can be restrained.

The number of the particles having an equivalent circle diameter of 5 μm or more may be, for example, 15 or less, may be 10 or less, may be 5 or less, or may be 2 or less per 1 mm$^3$ in the sample. For example, a metal plate in which the following condition (6) is satisfied may be used as the metal plate 64.
(6) The number of the particles having an equivalent circle diameter of 5 μm or more is 2 or less per 1 mm$^3$ in the sample.

A metal plate in which the following condition (7) is satisfied may be used as the metal plate 64.
(7) The number of the particles having an equivalent circle diameter of 10 μm or more is zero per 1 mm$^3$ in the sample.

A probability that one particle having an equivalent circle diameter of 10 μm or more causes a defective deposition mask is higher than a probability that one particle having an equivalent circle diameter of 5 μm or more causes a defective deposition mask. When the metal plate 64 satisfies the condition (7), a probability of defective products can be reduced.

The aforementioned conditions (1) to (7) may represent a structure of the metal plate 64 which has been processed into a deposition mask. Alternatively, the aforementioned conditions (1) to (7) may represent a structure of the metal plate 64 which is not yet processed into a deposition mask. The metal plate 64 includes a sampling portion from which a sample that satisfies one or more of the aforementioned conditions (1) to (7). The sampling portion includes the first surface 64a and the second surface 64b of the metal plate 64. Namely, the sampling portion spreads out in the thickness direction of the metal plate 64, from the first surface 64a up to the second surface 64b.

In this embodiment, one of the problems to be solved is to restrain the adverse effect caused by the particles, which are present in the bulk layer of the metal plate 64, on shape accuracy of the through holes 25 of the deposition mask. In order to solve such a problem, it is required to appropriately measure the number and sizes of the particles present in the entire part of the metal plate 64 in the thickness direction, including the bulk layer. Herebelow, a method of measuring particles present in the metal plate 64 is described.

Figure 26:
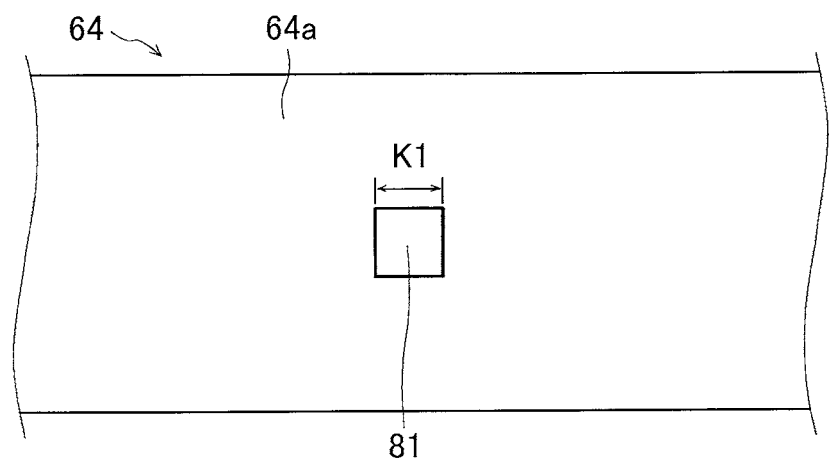
FIG. 26 is a view showing a step of cutting out a sample from the metal plate.

First, a first sampling step of taking out a sample having a predetermined volume from the base metal or the metal plate 64 is performed. For example, as shown in FIG. 26, the metal plate 64 unwound from a wound body is cut in the thickness direction of the metal plate 64, so as to obtain a sample 81 having a square shape in a plan view. A length K1 of one side of the square sample 81 is 60 mm, for example. The sample 81 includes the first surface 64*a* and the second surface 64*b* of the metal plate 64. Thus, the sample 81 includes the aforementioned surface layer and the bulk layer of the metal plate 64. As a tool for cutting out the sample 81 from the metal plate 64, scissors may be used, for example.

Figure 27:
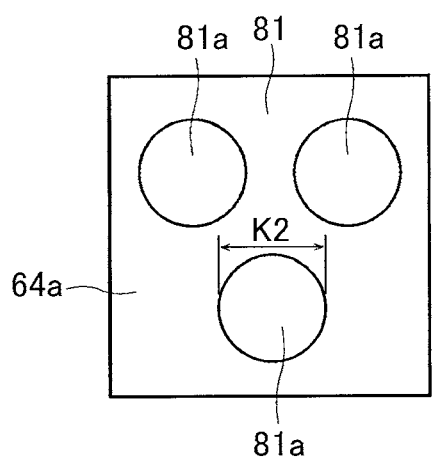
FIG. 27 is a view showing a step of punching a plurality of sample pieces from the sample.

Following thereto, a second sampling step of cutting out a sample piece 81*a* from the sample 81 is performed. For example, as shown in FIG. 27, a plurality of, for example, three sample pieces 81*a* are obtained by punching the sample 81. The sample piece 81*a* has, for example, a circular shape having a diameter of K2 in a plan view. The diameter K2 is 20 mm, for example. The sample piece 81*a* includes the first surface 64*a* and the second surface 64*b* of the metal plate 64. Thus, the sample piece 81*a* includes the aforementioned surface layer and the bulk layer of the metal plate 64. As a tool for accurately cutting out the samples 81*a* from the sample 81 with high reproducibility, a puncher may be used, for example.

Following thereto, a sample cleaning step of cleaning the sample pieces 81*a* is performed. Thus, foreign matters adhering to the sample pieces 81*a* due to the first sampling step and the second sampling step can be removed. As a cleaning method, ultrasonic cleaning in which ultrasonic waves are applied to pure water while the sample pieces 81*a* are immersed in the pure water can be adopted.

Figure 28:
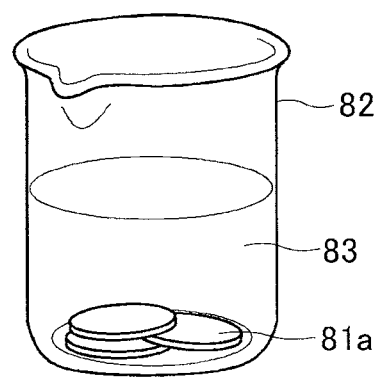
FIG. 28 is a view showing a step of dissolving the sample pieces.

Following thereto, a particle extraction step of extracting particles from the sample 81 is performed. For example, first, a sample dissolution step of dissolving the sample pieces 81*a* taken out from the sample 81 in an aqueous solution is performed. For example, as shown in FIG. 28, the three sample pieces 81*a* are put into a container 82 containing a 100 ml of aqueous solution 83, and the sample pieces 81*a* are dissolved in the aqueous solution 83. As the aqueous solution 83, a solution in which an iron alloy is easily dissolved but particles are not likely to be dissolved is used. For example, 100 ml of aqueous solution containing nitric acid is used as the aqueous solution 83. Thus, particles included in the sample, which are hardly soluble in nitric acid, can be removed from the iron alloy. A temperature of the aqueous solution 83 is 50° C., for example. For example, the aqueous solution 83 is prepared by mixing an undiluted solution containing nitric acid at a concentration of 60% by weight and pure water having the same volume as the volume of the undiluted solution.

A time of the sample dissolution step is 30 minutes, for example. The sample dissolution step may be performed by swinging the aqueous solution 83 by hand in first 15 minutes of the first half, and by leaving still the aqueous solution 83 in next 15 minutes. The sample dissolution step may be performed for 30 minutes or longer.

Figure 29:
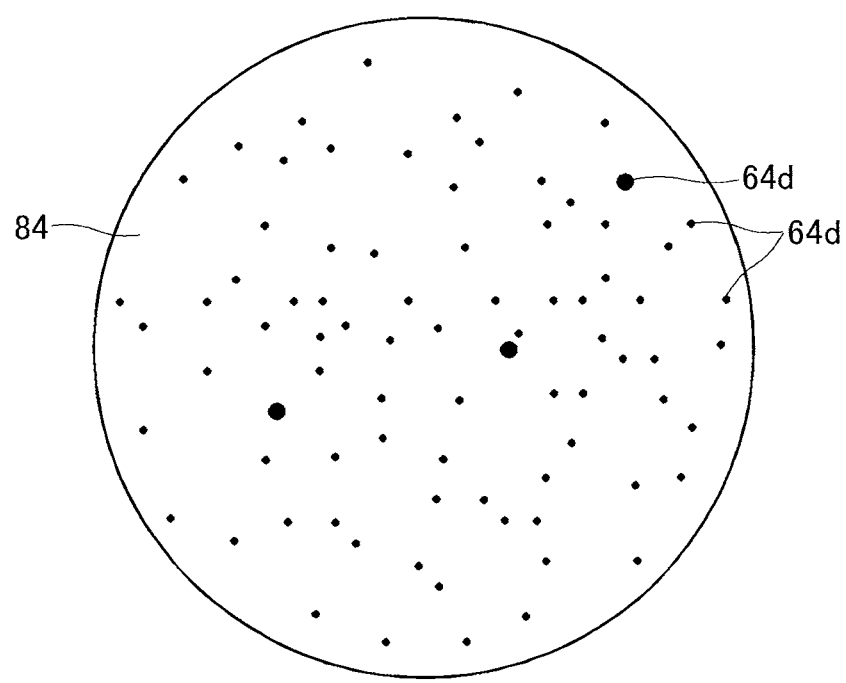
FIG. 29 is a plan view showing particles distributed on a filter paper.

Following thereto, a filtering step of taking out the particles from the aqueous solution 83 in which the sample pieces 81*a* are dissolved, with the use of a suction filtration apparatus. The suction filtration apparatus has a filter paper, and a decompression unit that decompresses a space on a downstream side of the filter paper. The filter paper is formed of a material having resistance to acid, such as Teflon. The filter paper is configured not to allow at least particles of 1 μm or more to pass therethrough. For example, a roughness of the filter paper, that is, a pore size thereof is 0.45 μm. Thus, as shown in FIG. 29, particles 64*d* and 64*e* having a size of at least 1 μm or more remain on the filter paper 84.

In the filtering step, initially, the aqueous solution 83 in which the sample pieces 81*a* are dissolved is poured from the container 82 onto the filter paper 84 through a cylindrical member placed on the filter paper 84. Following thereto, a rinsing step of rinsing the container 82 is performed three times. In the rinsing step, 100 ml of pure water is initially put into the emptied container 82, and then the pure water is poured onto the filter paper 84 from the container 82 through the cylindrical member. Thereafter, the space on the downstream side of the filter paper is decompressed by using the decompression unit such as a pump.

Following thereto, a particle drying step of drying particles 64*d* and 64*e* on the filter paper 84 is performed. To be specific, after the aforementioned cylindrical member has been detached from the filter paper 84, the space on the downstream side of the filter paper is continuously decompressed by using the decompression unit such as a pump, with the filter paper 84 being covered with a wrapping film from above. By arranging a cover such as a wrapping film above the filter paper 84 so as not to be in contact with the filter paper 84, it is possible to restrain foreign matters in the environmental atmosphere from adhering to the filter paper 84, while the particles 64*d* and 64*e* on the filter paper 84 are dried. A time of the particle drying step is not particularly limited, and is 4 hours or more and 6 hours or less, for example.

Following thereto, a preparatory step for observing the particles 64*d* and 64*e* on the filter paper 84 by means of a scanning electron microscope (referred to also as SEM hereafter) is performed. First, a peripheral portion of the filter paper 84 is fixed onto a pedestal with a carbon tape or the like. Following thereto, a platinum layer is formed on the filter paper 84 by sputtering, in order to ensure conductivity during the observation by SEM. The sputtering time is 10 seconds, for example. Following thereto, a jig is mounted on the pedestal according to need, and then the pedestal is mounted on the SEM.

Following thereto, an observation step of observing particles 64*d* on the filter paper 84 by using the SEM is performed. In the observation step, an observation-condition adjustment step of adjusting observation conditions of the SEM is initially performed. An identification-condition adjustment step of adjusting identification conditions for identifying the particles 64*d* from an image obtained by the SEM is performed. An observation-range setting step of setting an observation range of the filter paper 84 is performed.

JSM7800FPRIME manufactured by JEOL may be used as the SEM. Settings of the SEM are as follows.

Detector: Reflective electron detector LVBED-C
Observation magnification: 1000 times
Acceleration voltage: 15 kV
Working distance: 10 mm
Irradiation current: 15

Figure 30:
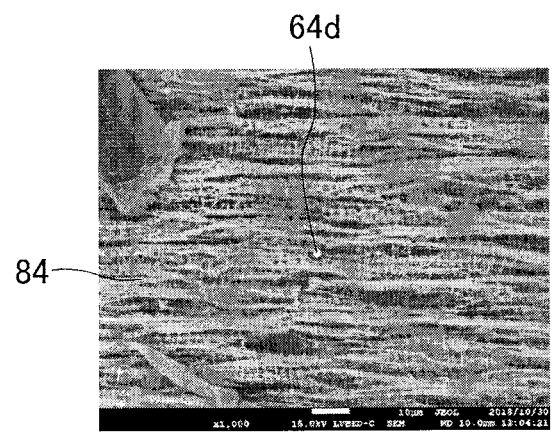
FIG. 30 is a view for describing a step of adjusting a contrast and/or brightness of a scanning electron microscope.
Figure 31:
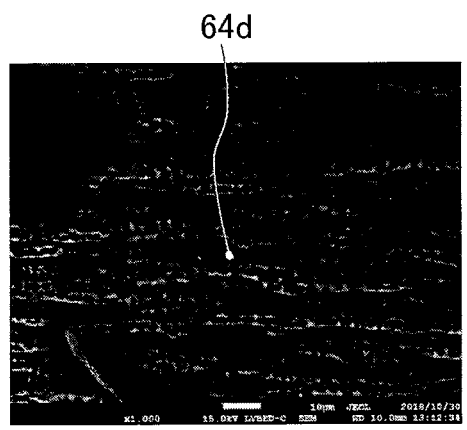
FIG. 31 is a view for describing the step of adjusting the contrast and/or brightness of the scanning electron microscope.

The observation-condition adjustment step is described with reference to FIGS. 30 and 31. In the observation-condition adjustment step, a contrast and/or brightness of the SEM is adjusted such that the particles 64*d* stand out as compared with fibers of the filter paper 84. FIG. 30 is an example of an SEM image which was obtained before the contrast and/or brightness of the SEM was adjusted. FIG. 31 is an example of an SEM image which was obtained after the contract and/or brightness of the SEM had been adjusted. In the observation-condition adjustment step, while checking the SEM image, the contrast of the SEM is adjusted to an appropriate value that is within a range of 3000 or more and 4000 or less, and the brightness of the SEM is adjusted to an appropriate value that is within a range of 200 or more and 400 or less. At this time, the contrast and/or brightness of the SEM is adjusted to the extent that some of the fibers of the filter paper 84 are also visible. Thus, it is possible to restrain some of the plurality of the particles 64d from disappearing from the image.

The identification-condition adjustment step is described with reference to FIG. 32 and FIG. 33. As an analysis means for identifying particles from an image obtained by the SEM, a particle automatic analysis software, Particle Phase Analysis version 6.53 attached to an energy dispersive X-ray spectroscope (referred to also as EDX device hereafter) may be used. Octane Elect, which is an EDX device manufactured by AMETEK Inc., may be used as the EDX device.

In the identification-condition adjustment step, particles 64d in the SEM image are identified by using the particle analysis software. To be specific, a brightness threshold value of the particle automatic analysis software is initially adjusted. Following thereto, the particle automatic analysis software recognizes, as the particle 64d, an object in the image, which has a brightness equal to or higher than the threshold value and has a maximum size of 0.8 μm or more.

Figure 32:
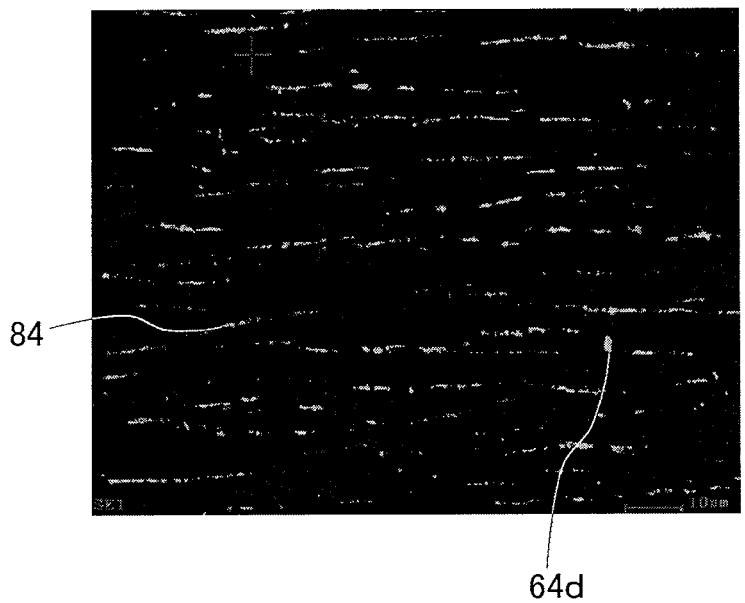
FIG. 32 is a view for describing a step of adjusting a threshold value of brightness of an analysis software.
Figure 33:
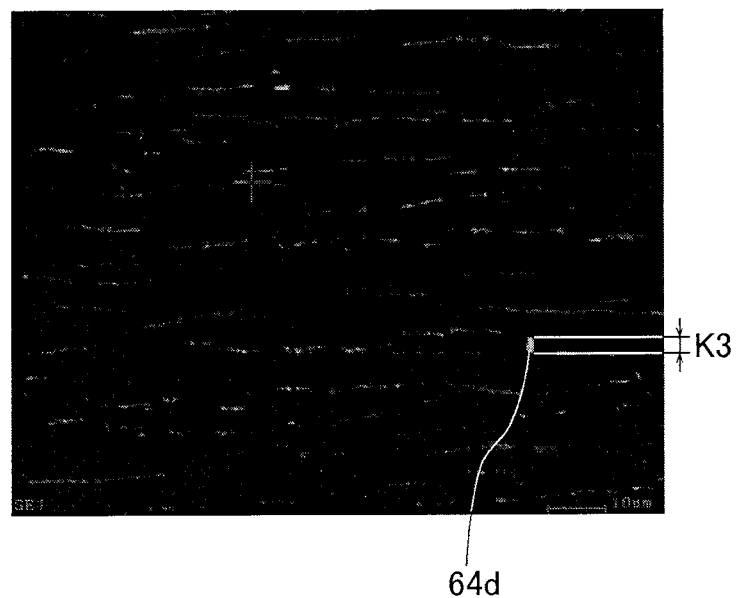
FIG. 33 is a view for describing the step of adjusting the threshold value of brightness of the analysis software.

FIG. 32 is an example of an image before the brightness threshold value of the particle automatic analysis software is adjusted. FIG. 33 is an example of an image after the brightness threshold value of the particle automatic analysis software has been adjusted. The brightness threshold value of the particle automatic analysis software can be adjusted within a range between 0 or more and 255 or less. In the identification-condition adjustment step, while checking the image, the brightness threshold value of the particle automatic analysis software is adjusted to 120, for example. At this time, the contrast and/or brightness of the SEM is adjusted to the extent that some of the fibers of the filter paper 84 are also visible. Thus, it is possible to restrain some of the plurality of the particles 64d from disappearing from the image.

Figure 34:
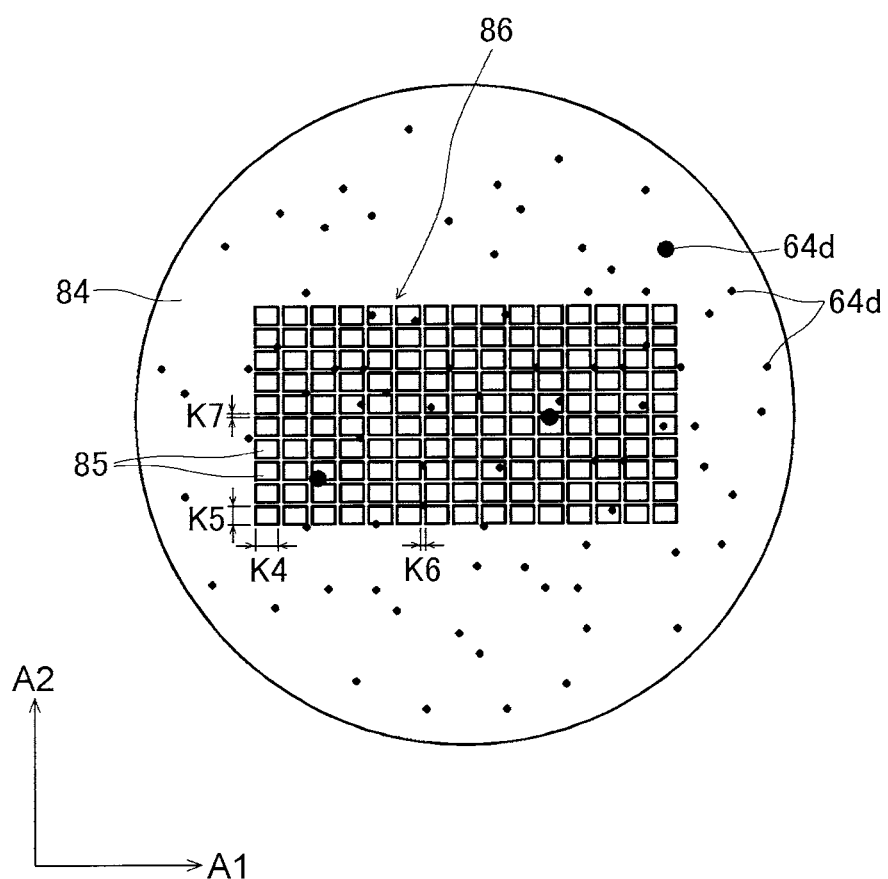
FIG. 34 is a view for describing an observation range of a filter paper.

The observation-range setting step is described with reference to FIG. 34. In FIG. 34, a frame indicated by a symbol 85 represents an area of an image 85 that can be acquired by one observation using the SEM. In the observation-range setting step, as shown in FIG. 34, an observation range 86 is set such that fifteen images 85 arranged in a first observation direction A1 are acquired, and that ten images 85 arranged in a second observation direction A2 orthogonal to the first observation direction A1 are acquired. The observation range 86 composed of a plurality of the images 85 may include a central portion of the filter paper 84, as shown in FIG. 34, or may not include it. In the example shown in FIG. 34, the number of the images 85 acquired for one paper filter 84 is 150. The images 85 may be acquired in two or more observation ranges 86 for one paper filter 84. For example, one hundred and fifty images 85 may be acquired in the observation range 86 including the central portion of the filter paper 84, and one hundred and fifty images 85 may be acquired in the observation range 86 including an end portion of the filter paper 84. Thus, it can be confirmed whether or not there is a difference in the number of the detected particles 64d between the central portion of the filter paper 84 and the end portion of the filter paper 84.

Settings of the particle automatic analysis software are as follows.

Number of pixels in image: 1024 (first observation direction A1)×800 (second observation direction A2)
Time constant: 1.92 μs
Preset (analysis time per particle): 1 second
Scan mode: core 50%
Status of particles at image boundary: recognized as particles A size K4 of the image 85 in the first observation direction A1 on the filter paper 84 is 114 μm, and a size K5 of the image 85 in the second observation direction A2 on the filter paper 84 is 89 μm.

As shown in FIG. 34, a gap is provided between the two images 85 adjacent to each other in the first observation direction A1. A size K6 of the gap provided between the two images 85, which are adjacent to each other in the first observation direction A1, is 1/10 of the size K4. Similarly, a gap is provided between the two images 85 adjacent to each other in the second observation direction A2. A size K7 of the gap provided between the two images 85, which are adjacent to each other in the second observation direction A2, is 1/10 of the size K5. Thus, it is possible to prevent detect a particle 64d from being duplicately detected in two or more images 85.

After the aforementioned observation-condition adjustment step, the identification-condition adjustment step and the observation-range setting step have been performed, by observing the observation range 86 with the use of the SEM, the particles 64d positioned in the observation range 86 and having a maximum size of 0.8 μm or more can be detected.

Following thereto, an analysis step of analyzing the plurality of the detected particles 64d is performed. To be specific, a composition analysis step of analyzing a main component of the particle 64d is performed. In addition, a diameter calculation step of calculating an equivalent circle diameter of the particle 64d is performed. Further, based on the result of the analysis step and the result of the composition analysis step, an extraction step of extracting the particle 64d containing a predetermined component and having an equivalent circle diameter of 1 μm or more is performed.

Figure 35:
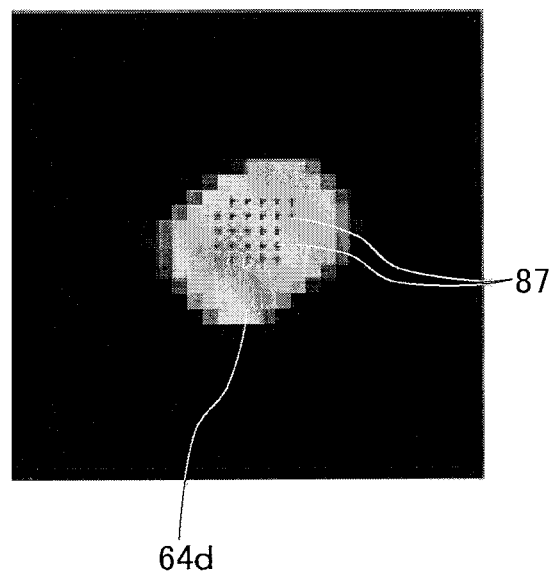
FIG. 35 is a view showing a process of analyzing a composition of particles.

The composition analysis step is described with reference to FIG. 35. In the composition analysis step, as shown in FIG. 35, in a plurality of analysis points 87 in the particle 64d, a composition analysis using energy dispersive X-ray spectroscopy (also referred to as EDX method hereafter) is performed. The composition analysis is performed on all the detected particles 64d. The aforementioned Octane Elect, which is the EDX device manufactured by AMETEK Inc., may be used as the EDX device performing the EDX method. It is possible to simultaneously perform the composition analysis of a plurality of the analysis points 87 in one particle 64d. When the aforementioned scan mode is set as "core 50%", a plurality of the analysis points 87 are determined so as to be distributed over 50% of an area of one particle 64d. When the aforementioned preset is set as "1 second", a time required for analyzing a composition of one particle 64d is 1 second. An average value of composition analysis data in a plurality of the analysis points 87 is adopted as composition data in one particle 64d. By performing the composition analysis, information on a main component and other components constituting the particle 64d can be obtained.

The diameter calculation step is described with reference to FIG. 35. The particle 64d shown in FIG. 35 is an aggregate of pixels having a brightness of the aforementioned threshold value or more, e.g., 120 or more. In the diameter calculation step, the number Pn of pixels appearing in the particle 64d is initially calculated. Following thereto, the number Pn of the pixels is multiplied by an area Ds of the pixel, so as to calculate an area Ds of the particle 64d in a plan view.

$$Ds = Pn \times Ps$$

Following thereto, on the assumption that the particle 64d has a perfect circular shape in a plan view, the diameter of the particle 64d is calculated from the area Ds of the particle 64d. The diameter that is calculated in this manner is an equivalent circle diameter Da1 of the particle 64d.

$$Da1 = 2 \times (Ds/\pi)^{0.5}$$

The calculation of an equivalent circle diameter is performed on all the detected particles 64d.

In the diameter calculation step, one particle 64d may be erroneously recognized as two or more particles 64d, and an equivalent circle diameter may be calculated. It is preferable for a person to confirm whether or not such erroneous data exist. When there are erroneous data, it is preferable that a person again manually calculates the equivalent circle diameter Da1 and perform the composition analysis for the erroneously recognized particles 64d. For example, all the components at a plurality of the analysis points 87 in the result of the composition analysis analyzed as two or more particles 64d are added, and then manually corrected such that a total value of % by weight of each component becomes 100.

The extraction step is described. In the extraction step, a first exclusion step of excluding a particle 64d whose carbon and fluorine content is 80% by weight or more is initially performed. Due to this step, it is possible to restrain an object caused by the filter paper 84 from being recognized as the particle 64d. "Exclusion" means to remove the object caused by the filter paper 84 from candidate particles for which it is judged whether the conditions such as the aforementioned conditions (1) and (2) are satisfied or not.

Following thereto, from among a plurality of the particles 64d which have not been excluded by the first exclusion step, a second exclusion step of excluding a particle 64d whose iron content is 10% by weight or more is performed. Following thereto, from among a plurality of the particles 64d which have not been excluded in the first exclusion step and the second exclusion step, a third exclusion step of excluding a particle 64d whose iron content content is greater than a total content of aluminum, magnesium, silicon, phosphorus, sulfur, chromium and zirconium is performed. Following thereto, from among a plurality of particles 64d which have not been excluded by the first exclusion step, the second exclusion step and the third exclusion step, a fourth exclusion step of excluding a particle having an equivalent circle diameter of less than 1 μm is performed. Thereafter, regarding the particles 64d that have not been excluded and thus remain, their information such as the number, equivalent circle diameters, components and so on, is organized.

When there are 100 or more particles 64d whose iron content is 10% by weight or more, or when a ratio of the number of particles 64d whose iron content is 10% by weight or more to the total number of particles 64d is 50% or more, it is expected that the sample was not sufficiently dissolved in the aforementioned sample dissolution step. In this case, it is preferable that the method of measuring particles present in the metal plate 64 is performed again from the aforementioned first sampling step.

Following thereto, based on the information related to the number Z1 of particles 64d having an equivalent circle diameter of 1 μm or more, which was obtained in the extraction step, a conversion step of calculating the number Z2 of particles 64d per 1 mm³ in the sample 81 is performed.

In the conversion step, the number Z2 of particles 64d per 1 mm³ in the sample 81 is calculated based on the following formula (1).

$$Z2 = Z1 \times (\text{effective area of filter paper 84/area of observation range of SEM}) \times (1/\text{dissolved volume})$$

$$\text{Effective area of filter paper 84} = (R/2)^2 \times \pi$$

$$\text{Area of observation range of SEM} = \text{area of image 85} \times \text{number of images 85}$$

$$\text{Dissolved volume} = (K2/2)^2 \times \pi \times \text{thickness of metal plate 64} \times \text{number of sample pieces 81}a$$

R is a diameter of the cylindrical member placed on the filter paper 84 in the filtering step. When R is 15 mm, the effective area of the filter paper 84 is 176.715 mm².

When the size K4 of the image 85 in the first observation direction A1 is 114 μm, the size K5 of the image 85 in the second observation direction A2 is 89 μm, and the number of the images 85 in the observation range 86 of SEM is 150, the area of the observation range of SEM is 1.5219 mm².

When the thickness of the metal plate 64 is 20 μm, the diameter K2 of the sample piece 81a is 20 mm, and the number of the sample pieces 81a is three, the dissolved volume is 18.850 mm³.

In this manner, regarding the particles 64d having an equivalent circle diameter of 1 μm or more, information such as the number Z2 of particles 64d per 1 mm³ in the sample 81i, equivalent circle diameters thereof, components thereof and so on can be obtained.

The particles 64d having an equivalent circle diameter of 1 μm or more may have a profile of a circular shape in a plan view. "The particle has a circular shape." means that the particle has an aspect ratio of 2.5 or less. The aspect of the particle is calculated based on the following formula.

$$\text{Aspect Ratio} = \pi \times (LP/2)^2 / Ds$$

LP is the longest diameter of the particle 64d. LP is referred to also as longest projection. Ds is the area of the pixel as described above. An aspect ratio, a longest projection LP and an area Ds are calculated by analyzing the particle 64d by using the particle automatic analysis software, Particle Phase Analysis version 6.53

In the following description, a ratio of a quantity of particles having an aspect ratio of 2.5 or less to a total quantity of particles having an equivalent circle diameter of 1 μm or more is referred to as circular shape ratio. The circular shape ratio may be, for example, 70% or more, may be 80% or more, may be 90% or more, or may be 95% or more.

Next, a method of manufacturing the metal plate 64 that satisfies at least the aforementioned conditions (1) and (2) is described. In this embodiment, an example in which the metal plate is made of a rolled material of an iron alloy containing nickel is described. A nickel and cobalt content in the rolled material is 30% by mass or more and 38% by mass or less in total.

First, a preparation step of preparing a base metal having an iron alloy containing at least nickel is performed. In this embodiment, the base metal is a member that is rolled into the aforementioned metal plate 64. The preparation step includes at least a first melting step.

First, iron, nickel and other raw materials are prepared. For example, the respective raw materials are prepared such that a ratio of iron and a ratio of nickel to the total raw material are about 64% by weight and about 36% by weight, respectively. Following thereto, after the respective raw materials have been crushed according to need, the first melting step of melting the respective raw materials in a melting furnace is performed. The first melting step includes vacuum melting, for example. Vacuum melting is a method of obtaining molten metal by melting a raw material in a vacuum atmosphere. For example, a raw material may be melted in a vacuum atmosphere by using a gas discharge such as an arc discharge. A raw material may be melted in an induction furnace installed in a vacuum atmosphere. The vacuum atmosphere is, for example, 1 Pa or less, and may be 0.1 Pa or less. Then, the molten metal is solidified to obtain a first ingot.

A temperature upon melting is set depending on the raw material, and is 1500° C. or higher, for example. The first melting step may include a step of putting an additive agent, such as aluminum, manganese, silicon, etc., into a melting furnace. The additive agent may realize a function such as deoxidation, dehydration, denitrification, etc. The melting step may be performed under an atmosphere of an inert gas such as argon gas at a low pressure lower than the atmospheric pressure. The additive agent forms a compound by reacting with oxygen and the like. Such a compound may constitute the aforementioned particle. Thus, by adjusting an amount of the additive agent, an amount or a size of particles included in the metal plate can be adjusted. For example, by reducing an amount of the additive agent, an amount of particles included in the metal plate can be reduced. Alternatively, by reducing an amount of the additive agent, an equivalent circle diameter of a particle included in the metal plate can be reduced.

Figure 36:
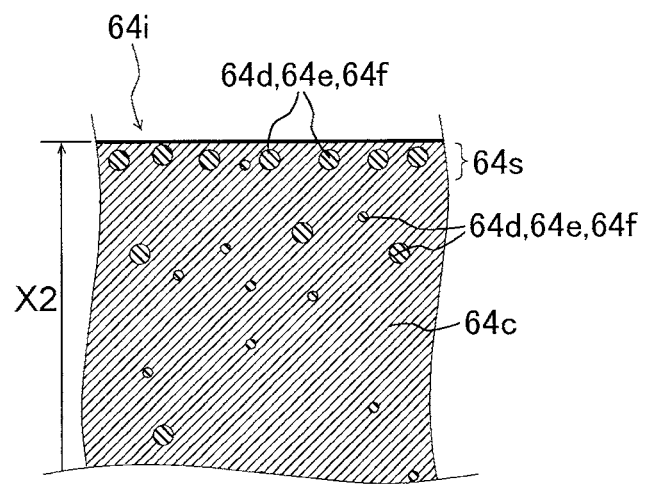
FIG. 36 is a view showing an iron alloy ingot.

FIG. 36 is an enlarged sectional view showing a surface of the first ingot 64*i* taken out from the melting furnace and its surroundings. As shown in FIG. 36, particles 64*d* containing the additive agent such as aluminum are likely to be present on the surface of the first ingot 64*i* and its surroundings. The reason is considered to be that a specific gravity of the particle 64*d* is smaller than a specific gravity of the molten metal. However, the reason why the particles 64*d* are likely to be present on the surface and its surroundings is not limited to the above reason.

It is preferable that time of the first melting step is set such that the particles 64*d* can move to the surface or its surroundings.

Figure 37:
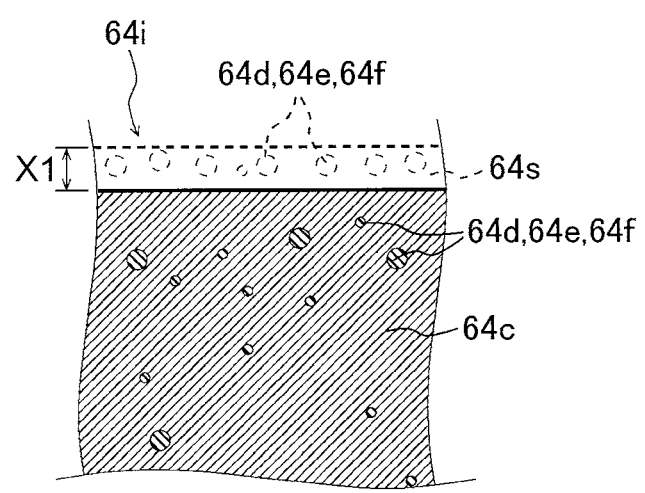
FIG. 37 is a view showing a process of removing a surface part of the ingot.

As shown in FIG. 37, after the first melting step, a first surface treatment step of removing a surface part 64*s* of the first ingot 64*i* may be performed, in order to remove the particles 64*d*. A symbol X1 indicates a thickness of the surface part 64*s* to be removed. By removing the surface part 64*s*, the number and a density of the particles 64*d* included in the metal plate 64 can be reduced. In addition, an oxide layer such as scale can be removed. As described below, the number and a density of the particles 64*d* included in the metal plate 64 can be reduced by a metal-plate surface treatment step of removing a surface part 64*u* of the metal plate 64, which is described later.

A thickness X2 of the first ingot 64*i* before the surface part 64*s* is removed may be, for example, 100 mm or more, may be 150 mm or more, or 200 mm or more. The thickness X2 may be, for example, 300 mm or less, may be 400 mm or less, or may be 500 mm or less. A range of the thickness X2 may be determined by a first group consisting of 100 mm, 150 mm and 200 mm, and/or a second group consisting of 300 mm, 400 mm and 500 mm. The range of the thickness X2 may be determined by a combination of any one of the values included in the aforementioned first group and any one of the values included in the aforementioned second group. The range of the thickness X2 may be determined by a combination of any two of the values included in the aforementioned first group. The range of the thickness X2 may be determined by a combination of any two of the values included in the aforementioned second group. For example, the range of the thickness X2 may be 100 mm or more and 500 mm or less, may be 100 mm or more and 400 mm or less, may be 100 mm or more and 300 mm or less, may be 100 mm or more and 200 mm or less, may be 100 mm or more and 150 mm or less, may be 150 mm or more and 500 mm or less, may be 150 mm or more and 400 mm or less, may be 150 mm or more and 300 mm or less, may be 150 mm or more and 200 mm or less, may be 200 mm or more and 500 mm or less, may be 200 mm or more and 400 mm or less, may be 200 mm or more and 300 mm or less, may be 300 mm or more and 500 mm or less, may be 300 mm or more and 400 mm or less, or may be 400 mm or more and 500 mm or less.

The thickness X1 of the surface part 64*s* to be removed may be, for example, 5 mm or more, may be 10 mm or more, may be 12 mm or more, or may be 15 mm or more. The thickness X1 may be, for example, 20 mm or less, may be 25 mm or less, may be 30 mm or less, or may be 40 mm or less. A range of the thickness X1 may be determined by a first group consisting of 5 mm, 10 mm, 12 mm and 15 mm, and/or a second group consisting of 20 mm, 25 mm, 30 mm and 40 mm. The range of the thickness X1 may be determined by a combination of any one of the values included in the aforementioned first group and any one of the values included in the aforementioned second group. The range of the thickness X1 may be determined by a combination of any two of the values included in the aforementioned first group. The range of the thickness X1 may be determined by a combination of any two of the values included in the aforementioned second group. For example, the range of the thickness X1 may be 5 mm or more and 40 mm or less, may be 5 mm or more and 30 mm or less, may be 5 mm or more and 25 mm or less, may be 5 mm or more and 20 mm or less, may be 5 mm or more and 15 mm or less, may be 5 mm or more and 12 mm or less, may be 5 mm or more and 10 mm or less, may be 10 mm or more and 40 mm or less, may be 10 mm or more and 30 mm or less, may be 10 mm or more and 25 mm or less, may be 10 mm or more and 20 mm or less, may be 10 mm or more and 15 mm or less, may be 10 mm or more and 12 mm or less, may be 12 mm or more and 40 mm or less, may be 12 mm or more and 30 mm or less, may be 12 mm or more and 25 mm or less, may be 12 mm or more and 20 mm or less, may be 12 mm or more and 15 mm or less, may be 15 mm or more and 40 mm or less, may be 15 mm or more and 30 mm or less, may be 15 mm or more and 25 mm or less, may be 15 mm or more and 20 mm or less, may be 20 mm or more and 40 mm or less, may be 20 mm or more and 30 mm or less, may be 20 mm or more and 25 mm or less, may be 25 mm or more and 40 mm or less, may be 25 mm or more and 30 mm or less, or may be 30 mm or more and 40 mm or less.

When the thickness X1 is 5 mm or more, the number and a density of the particles 64*d* included in the metal plate 64 can be reduced. The larger the range X1 is, the smaller the number of the particles 64*d* becomes. On the other hand, the larger the range X1 is, the smaller an amount of the metal plate 64 to be obtained becomes. When the range X1 is 40 mm or less, increase in the manufacturing cost of the metal plate 64 can be restrained.

The thickness X1 of the surface part 64*s* may be determined based on a ratio to the thickness X2 of the first ingot 64*i* before the surface part 64*s* is removed. X1/X2 may be, for example, 0.01 or more, may be 0.02 or more, may be 0.03 or more, or may be 0.05 or more. X1/X2 may be, for example, 0.10 or less, may be 0.15 or less, may be 0.20 or less, or may be 0.30 or less. A range of X1/X2 may be determined by a first group consisting of 0.01, 0.02, 0.03 and 0.50, and/or a second group consisting of 0.10, 0.15, 0.20 and 0.30. The range of X1/X2 may be determined by a combination of any one of the values included in the aforementioned first group and any one of the values included in the aforementioned second group. The range of X1/X2 may be determined by a combination of any two of the values included in the aforementioned first group. The range of X1/X2 may be determined by a combination of any two of the values included in the aforementioned second group. For example, the range of X1/X2 may be 0.01 or more and 0.30 or less, may be 0.01 or more and 0.20 or less, may be 0.01 or more and 0.15 or less, may be 0.01 or more and 0.10 or less, may be 0.01 or more and 0.05 or less, may be 0.01 or more and 0.03 or less, may be 0.01 or more and 0.02 or less, may be 0.02 or more and 0.30 or less, may be 0.02 or more and 0.20 or less, may be 0.02 or more and 0.15 or less, may be 0.02 or more and 0.10 or less, may be 0.02 or more and 0.05 or less, may be 0.02 or more and 0.03 or less, may be 0.03 or more and 0.30 or less, may be 0.03 or more and 0.20 or less, may be 0.03 or more and 0.15 or less, may be 0.03 or more and 0.10 or less, may be 0.03 or more and 0.05 or less, may be 0.05 or more and 0.30 or less, may be 0.05 or more and 0.20 or less, may be 0.05 or more and 0.15 or less, may be 0.05 or more and 0.10 or less, may be 0.10 or more and 0.30 or less, may be 0.10 or more and 0.20 or less, may be 0.10 or more and 0.15 or less, may be 0.15 or more and 0.30 or less, may be 0.15 or more and 0.20 or less, or may be 0.20 or more and 0.30 or less.

The particle 64d having a large equivalent circle diameter may be more likely to be present in the vicinity of the surface of the metal plate 64 than the particle 64d having a small equivalent circle diameter. The reason is considered to be that the larger the equivalent circle diameter of the particle 64d is, the higher the moving speed of the particle 64d that moves upward during the dissolution step becomes. However, the reason why the particle 64d having a large equivalent circle diameter is likely to be present on the surface is not limited to the above reason.

When the particle 64d having a large equivalent circle diameter is likely to be present on the surface, the step of removing the surface part 64s can particularly contribute to reducing the number and a density of the particles 64d having a large equivalent circle diameter. Thus, by adjusting the thickness X1 of the surface part 64s, there is a possibility that a first ratio, a second ratio and a third ratio of the particles 64d included in the metal plate 64 can be adjusted. Similarly, also by adjusting a thickness X3 of the surface part 64u described later, there is a possibility that the first ratio, the second ratio and the third ratio of the particles 64d included in the metal plate 64 can be adjusted. The first ratio is a ratio of a first quantity to a total quantity. The first quantity is the number of the particles per 1 mm$^3$ in the sample 81, the particles having an equivalent circle diameter of 1 μm or more and less than 3 μm. The second ratio is a ratio of a second quantity to the total quantity. The second quantity is the number of the particles per 1 mm$^3$ in the sample 81, the particles having an equivalent circle diameter of 3 μm or more and less than 5 μm. The third ratio is a ratio of a third quantity to the total quantity. The third quantity is the number of the particles per 1 mm$^3$ in the sample 81, the particles having an equivalent circle diameter of 5 μm or more. The total quantity is the number of the particles per 1 mm$^3$ in the sample, the particles having an equivalent circle diameter of 1 μm or more. There is a possibility that the second ratio and the third ratio can be reduced by the step of removing the surface part 64s, 64u.

On the other hand, as described in the below-described examples, there is a possibility that a second ratio and/or a third ratio of a metal plate having a small total quantity, e.g., the total quantity of less than 100 is higher than a second ratio and/or a third ratio of a metal plate having a large total quantity, e.g., the total quantity of 100 or more. In other words, there is a possibility that a first ratio of a metal plate having a small total quantity is lower than a first ratio of a metal plate having a large total quantity. For example, see a seventh mask and an eighth mask shown in FIG. 48.

It is assumed that the small total quantity is achieved by increasing the range X1. The results of the examples suggest that when the range X1 exceeds a certain value, there is a possibility that a phenomenon in which the first ratio decreases as the range X1 increases occurs. In other words, the decrease in the first ratio may suggest that the ingot or the metal plate is removed excessively. The first ratio can be one of the useful indicators.

The first ratio of the metal plate may be, for example, 70% or more, may be 80% or more, or may be 90% or more. The first ratio of the metal plate may be, for example, 95% or less, may be 98% or less, or may be 100% or less. A range of the first ratio of the metal plate may be determined by a first group consisting of 70%, 80% and 90%, and/or a second group consisting of 95%, 98% and 100%. The range of the first ratio of the metal plate may be determined by a combination of any one of the values included in the aforementioned first group and any one of the values included in the aforementioned second group. The range of the first ratio of the metal plate may be determined by a combination of any two of the values included in the aforementioned first group. The range of the first ratio of the metal plate may be determined by a combination of any two of the values included in the aforementioned second group. For example, the range of the first ratio of the metal plate may be 70% or more and 100% or less, may be 70% or more and 98% or less, may be 70% or more and 95% or less, may be 70% or more and 90%, may be 70% or more and 80%, may be 80% or more and 100% or less, may be 80% or more and 98% or less, may be 80% or more and 95% or less, may be 80% or more and 90%, may be 90% or more and 100% or less, may be 90% or more and 98% or less, may be 90% or more and 95% or less, may be 95% or more and 100% or less, may be 95% or more and 98% or less, or may be 98% or more and 100% or less.

A specific method of removing the surface part 64s is not particularly limited. A so-called grinding method in which the surface of the first ingot 64i is ground by rotating a grindstone, or a so-called pushing method in which the first ingot 64i is pushed into a cutting tool to scrape the surface of the first ingot 64i, etc. can be adopted. The surface part 64s may be removed by exposing the surface of the first ingot 64i to a surface treatment liquid. The surface treatment liquid is, for example, an acidic solution such as a sulfuric acid solution or a sulfuric acid excess aqueous solution. The sulfuric acid excess aqueous solution is a solution containing sulfuric acid and hydrogen peroxide. The first surface treatment step may include only one of the process of scraping the surface of the first ingot 64i and the process of exposing the surface of the first ingot 64i to a surface treatment liquid, or may include both processes. The first surface treatment step may be performed such that the thickness of the first ingot 64i becomes uniform.

Following thereto, a step of melting again in the melting furnace the ingot from which the surface part has been removed may be repeated a predetermined number of times. For example, a second melting step of melting the first ingot in the melting furnace to obtain a second ingot may be further performed. In addition, a third melting step of melting the second ingot in the melting furnace to obtain a third ingot may be further performed. The melting step may be repeated four times or more. Between the melting steps, the surface treatment step of removing the surface part of the ingot may be performed. For example, after the second melting step, a second surface treatment step of removing the surface part of the second ingot may be performed. After the third melting step, a third surface treatment step of removing the surface part of the third ingot may be performed. By repeating the melting step and the surface treatment step, the number and a density of the particles 64d included in the metal plate 64 can be further reduced.

By adjusting the number of the melting steps and the surface treatment steps, an amount or sizes of the particles included in the metal plate can be adjusted. For example, by increasing the number of the melting steps and the surface treatment steps, the amount of the particles included in the metal plate can be reduced. Alternatively, by increasing the number of melting steps and the surface treatment steps, the equivalent circle diameters of the particles included in the metal plate can be reduced.

A thickness of the surface part to be removed from the ingot in the second surface treatment step and the third surface treatment step may be the same as or different from that of the first surface treatment step. A numerical range of the thickness of the surface part to be removed in the second surface treatment step may be the same as or different from the aforementioned numerical range of the thickness X1. A numerical range of the thickness of the surface part to be removed in the third surface treatment step may be the same as or different from the aforementioned numerical range of the thickness X1.

The step of removing the surface part of the ingot, such as the first surface treatment step, the second surface treatment step and the third surface treatment step, is also referred to as "base-metal surface treatment step".

A melting method in the second melting step, the third melting step and the succeeding melting step may be the same as or different from the melting method in the first melting step. For example, vacuum arc melting, electro slag melting and the like can be adopted. It is preferable that the second melting step and the third melting step are performed in a vacuum atmosphere.

The lower the pressure of the atmosphere in the melting step is, the higher the moving speed of the particle 64d that moves upward in the melting step may become. Thus, by adjusting the pressure of the atmosphere, it may be possible to adjust an amount or sizes of the particles included in the metal plate. For example, by lowering the pressure of the atmosphere, the amount of the particles included in the metal plate can be reduced. Alternatively, by lowering the pressure of the atmosphere, the equivalent circle diameters of the particles included in the metal plate can be reduced.

It is preferable that the times of the second melting step, the third melting step and the succeeding melting step are also set such that the particles 64d can move to the surface or its surroundings.

Figure 38:
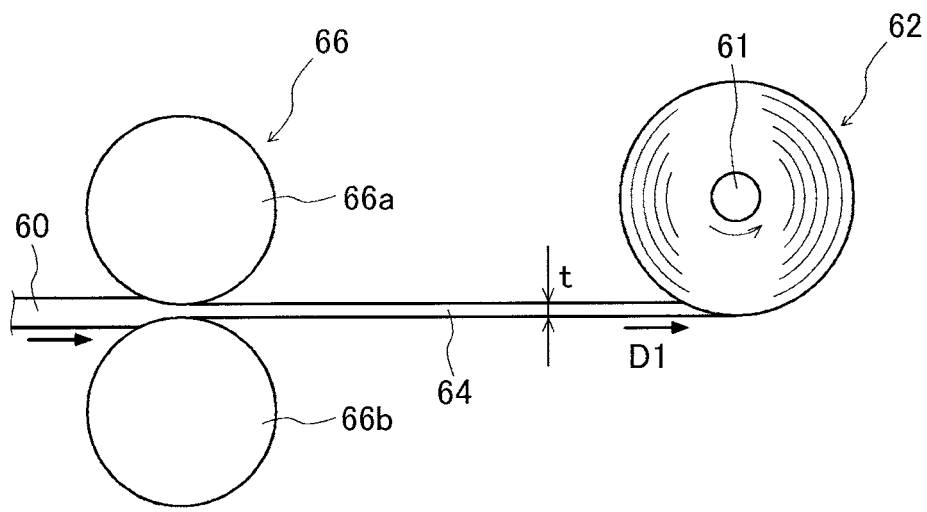
FIG. 38 is a view showing a step of rolling a base metal to obtain a metal plate having a desired thickness.

Following thereto, as shown in FIG. 38, a rolling step of rolling the base metal 60, formed of the ingot obtained by the melting step and the base-metal surface treatment step, is performed. For example, the base metal 60 is transferred while tensile tension is applied thereto in a direction shown by an arrow D1, toward a rolling apparatus 66 including a pair of rolling rolls (work rolls) 66a and 66b. The base metal 60 having reached between the pair of rolling rolls 66a and 66b is rolled by the pair of rolling rolls 66a and 66b, so that the base metal 60 is reduced in thickness and stretched along the transfer direction. Thus, the metal plate 64 that extends in the direction D1 and has a predetermined thickness can be obtained. In the below description, the direction D1 along which the metal plate 64 extends is also referred to as longitudinal direction D1. When the metal plate 64 is produced by rolling, rolling streaks extending in the longitudinal direction D1 are formed on the surface of the metal plate 64. As shown in FIG. 38, a wound body 62 may be formed by winding the metal plate 64 around a core 61.

FIG. 38 merely shows the outline of the rolling step, and a specific structure and procedure for performing the rolling step are not particularly limited. For example, the rolling step may include a hot rolling step of processing the base metal at a temperature equal to or higher than a temperature at which a crystalline orientation of the iron alloy constituting the base metal 60 is changed, and/or a cold rolling step of processing the base metal at a temperature equal to or lower than a temperature at which the crystalline orientation of the iron alloy is changed. In addition, the direction along which the base metal 60 and the metal plate 64 are passed between the pair of rolling rolls 66a and 66b is not limited to one direction. For example, in FIG. 38, the base metal 60 and the metal plate 64 may be gradually rolled by repeatedly passing the base metal 60 and the metal plate 64 between the pair of rolling rolls 66a and 66b in the direction from the left side to the right side in a sheet plane, and in the direction from the right side to the left side in the sheet plane.

In the rolling step, a pressure of a rolling actuator may be adjusted in order to adjust the shape of the metal plate 64. Further, in addition to the rolling rolls (work rolls) 66a and 66b, the shape of a backup roll may be suitably adjusted.

In the cold rolling step, coolant such as kerosene may be supplied between the base metal 60 and the rolling rolls 66a and 66b. Thus, the temperature of the base metal can be controlled.

An analysis step of analyzing a quality and characteristics of the base metal 60 or the metal plate 64 may be performed before and after the rolling step, or between the rolling steps. For example, a composition may be analyzed by irradiating the base metal 60 or the metal plate 64 with fluorescent X-rays. A thermal expansion and contraction rate of the base metal 60 or the metal plate 64 may be measured by thermomechanical analysis (TMA).

A metal-plate surface treatment step of removing the surface part of the metal plate 64 may be performed before the rolling step, or between the hot rolling step and the cold rolling step. Thus, the number and a density of the particles 64d included in the metal plate 64 can be reduced. In addition, an oxide layer such as scale can be removed. The metal-plate surface treatment step may be performed both before the rolling step, and between the hot rolling step and the cold rolling step.

Figure 60:
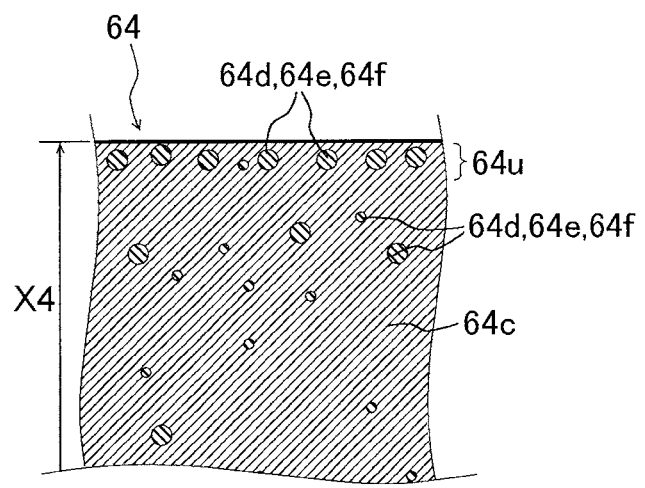
FIG. 60 is a view showing a metal plate.
Figure 61:
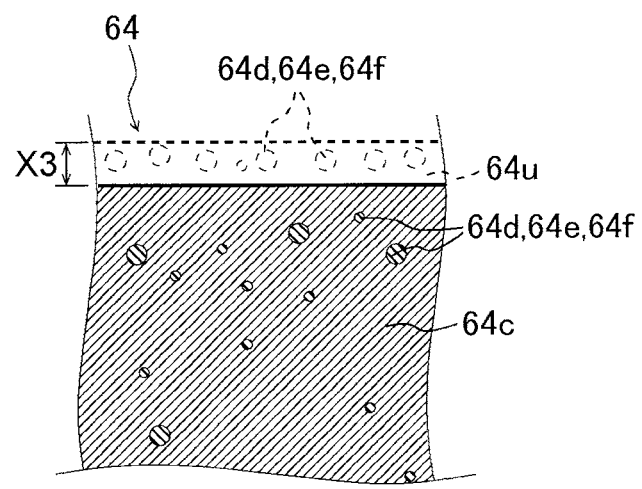
FIG. 61 is a view showing a step of removing a surface part of the metal plate.

FIG. 60 is an enlarged sectional view showing the surface and its surroundings of the metal plate 64 before the surface part 64u is removed. FIG. 61 is an enlarged sectional view showing the surface and its surrounding of the metal plate 64 after the surface pat 64u has been removed. A symbol X3 indicates a thickness of the surface part 64u to be removed. A symbol X4 indicates a thickness of the metal plate 64 before the surface part 64u is removed. A specific method of removing the surface part 64u is not particularly limited. For example, the surface pat 64u can be removed by exposing the surface of the metal plate 64 to a surface treatment liquid. Similarly to the base-metal surface treatment step, the surface treatment liquid is, for example, an acidic solution such as a sulfuric acid solution or a sulfuric acid excess aqueous solution. When the meta-plate surface treatment step is performed before the rolling step, similarly to the base-metal surface treatment step, the surface part 64u may be removed by scraping the surface of the metal plate 64. The metal-plate surface treatment step may include only one of the process of exposing the surface of the metal plate 64 to a surface treatment liquid and the process of scraping the surface of the metal plate 64, or may include both of them.

The thickness X3 of the surface part 64u to be removed by the metal-plate surface treatment step may be, for example, m or more, may be 10 µm or more, may be 15 µm or more, or may be 20 µm or more. The thickness X3 may be, for example, 30 µm or less, may be 50 µm or less, may be 70 µm or less, or may be 100 µm or less. A range of the thickness X3 may be determined by a first group consisting of 5 µm, 10 µm, 15 µm and 20 µm, and/or a second group consisting of 30 µm, 50 µm, 70 µm and 100 µm. The range of the thickness X3 may be determined by a combination of any one of the values included in the aforementioned first group and any one of the values included in the aforementioned second group. The range of the thickness X3 may be determined by a combination of any two of the values included in the aforementioned first group. The range of the thickness t X3 may be determined by a combination of any two of the values included in the aforementioned second group. For example, the range of the thickness X3 may be 5 µm or more and 100 µm or less, may be 5 µm or more and 70 µm or less, may be 5 µm or more and 50 µm or less, may be 5 µm or more and 30 µm or less, may be 5 µm or more and 20 µm or less, may be 5 µm or more and 15 µm or less, may be 5 µm or more and 10 µm or less, may be 10 µm or more and 100 µm or less, may be 10 µm or more and 70 µm or less, may be 10 µm or more and 50 µm or less, may be 10 µm or more and 30 µm or less, may be 10 µm or more and 20 µm or less, may be 10 µm or more and 15 µm or less, may be 15 µm or more and 100 µm or less, may be 15 µm or more and 70 µm or less, may be 15 µm or more and 50 µm or less, may be 15 µm or more and 30 µm or less, may be 15 µm or more and 20 µm or less, may be 20 µm or more and 100 µm or less, may be 20 µm or more and 70 µm or less, may be 20 µm or more and 50 µm or less, may be 20 µm or more and 30 µm or less, may be 30 µm or more and 100 µm or less, may be 30 µm or more and 70 µm or less, may be 30 µm or more and 50 µm or less, may be 50 µm or more and 100 µm or less, may be 50 µm or more and 70 µm or less, or may be 70 µm or more and 100 µm or less.

The thickness X3 of the surface part 64u may be determined based on a ratio to the thickness X4 of the metal plate 64 before the surface part 64u is removed. X3/X4 may be, for example, 0.01 or more, may be 0.02 or more, may be 0.03 or more, or may be 0.05 or more. X3/X4 may be, for example, 0.10 or less, may be 0.15 or less, may be 0.20 or less, or may be 0.30 or less. A range of X3/X4 may be determined by a first group consisting of 0.01, 0.02, 0.03 and 0.50, and/or a second group consisting of 0.10, 0.15, 0.20 and 0.30. The range of X3/X4 may be determined by a combination of any one of the values included in the aforementioned first group and any one of the values included in the aforementioned second group. The range of X3/X4 may be determined by a combination of any two of the values included in the aforementioned first group. The range of X3/X4 may be determined by a combination of any two of the values included in the aforementioned second group. For example, the range of X3/X4 may be 0.01 or more and 0.30 or less, may be 0.01 or more and 0.20 or less, may be 0.01 or more and 0.15 or less, may be 0.01 or more and 0.10 or less, may be 0.01 or more and 0.05 or less, may be 0.01 or more and 0.03 or less, may be 0.01 or more and 0.02 or less, may be 0.02 or more and 0.30 or less, may be 0.02 or more and 0.20 or less, may be 0.02 or more and 0.15 or less, may be 0.02 or more and 0.10 or less, may be 0.02 or more and 0.05 or less, may be 0.02 or more and 0.03 or less, may be 0.03 or more and 0.30 or less, may be 0.03 or more and 0.20 or less, may be 0.03 or more and 0.15 or less, may be 0.03 or more and 0.10 or less, may be 0.03 or more and 0.05 or less, may be 0.05 or more and 0.30 or less, may be 0.05 or more and 0.20 or less, may be 0.05 or more and 0.15 or less, may be 0.05 or more and 0.10 or less, may be 0.10 or more and 0.30 or less, may be 0.10 or more and 0.20 or less, may be 0.10 or more and 0.15 or less, may be 0.15 or more and 0.30 or less, may be 0.15 or more and 0.20 or less, or may be 0.20 or more and 0.30 or less.

When a surface treatment liquid is used, the thickness X3 of the surface part 64u to be removed may be smaller than the aforementioned thickness. For example, the thickness X3 may be 0.5 µm or more, may be 1.0 µm or more, may be 2.0 µm or more, or may be 3.0 µm. Also when a surface treatment liquid is brought into contact with the surface of the base metal, the thickness X1 of the surface part 64s to be removed may be smaller than the aforementioned thickness. For example, the thickness X1 may be 0.5 µm or more, may be 1.0 µm or more, may be 2.0 µm or more, or may be 3.0 µm.

Figure 39:
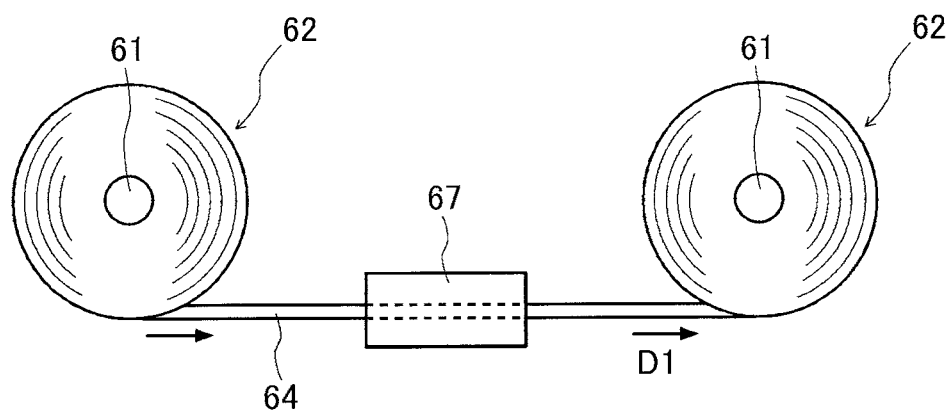
FIG. 39 is a view showing a step of annealing the metal plate obtained by rolling.

Thereafter, as shown in FIG. 39, the metal plate 64 may be annealed using an annealing apparatus 67, in order to remove a residual stress accumulated in the metal plate 64 by rolling. As shown in FIG. 39, the annealing step may be performed while pulling the metal plate 64 in the transfer direction (longitudinal direction). Namely, the annealing step may be performed as continuous annealing while the metal plate 64 is being transferred, instead of so-called batch annealing. In this case, it is preferable that a temperature and a transfer speed are set so as to restrain deformation such as buckling fracture in the metal plate 64. By performing the annealing step, the metal plate 64 from which residual strain has been removed to some extent can be obtained. FIG. 39 shows the example in which the metal plate 64 is transferred in the horizontal direction in the annealing step. However, not limited thereto, the metal plate 64 may be transferred in another direction such as the vertical direction, in the annealing step.

Thereafter, a slitting step of cutting off both ends in the width direction of the metal plate 64 obtained by the rolling step, over a predetermined range, such that the metal plate 64 has a width within a predetermined range, may be performed. The slitting step is performed for removing a crack that may occur at both ends of the metal plate 64 due to rolling. By performing such a slitting step, it is possible to prevent occurrence of a phenomenon in which the metal plate 64 is broken, i.e., so-called plate breakage starting from the crack.

The width of the portion to be cut off in the slitting step may be adjusted such that the shape of the metal plate 64 after the slitting step is symmetrical in the width direction. The slitting step may be performed before the aforementioned annealing step.

The elongated metal plate 64 having a predetermined thickness may be produced by repeating several times at least two steps of the aforementioned rolling step, the annealing step and the slitting step.

After the rolling step, the annealing step or the slitting step, an inspection step of inspecting a density and sizes of the particles 64*d* included in the metal plate 64 may be performed. In the inspection step, by performing the aforementioned observation step and the analysis step, information such as the number Z2 of the particles 64*d* included in a volume of 1 mm$^3$ of the sample 81, having a diameter equivalent to a circle of 1 m or more, equivalent circle diameters thereof, components thereof and so on is obtained.

Following thereto, a determination step of determining whether or not the metal plate 64 from which the sample 81 has been taken out is a non-defective product may be performed. For example, when the aforementioned conditions (1) and (2) are satisfied, the metal plate 64 from which the sample 81 has been taken out is determined as a non-defective product.

In the determination step, in addition to the above conditions (1) and (2), the metal plate 64 which further satisfies the aforementioned conditions (3) and (4) may be determined as a non-defective product. In the determination step, the aforementioned conditions (1) to (4) may be combined optionally. For example, the metal plate 64 which satisfies all the determination conditions (1) to (4) may be determined as a non-defective product, or the metal plate 64 which satisfies only one or more of the determination conditions (1) to (4) may be determined as a non-defective product. Examples of the combination are shown below.
Example 1: The metal plate 64 which satisfies the condition (1) is determined as a non-defective product.
Example 2: The metal plate 64 which satisfies the condition (2) is determined as a non-defective product.
Example 3: The metal plate 64 which satisfies the conditions (1) and (3) is determined as a non-defective product.
Example 4: The metal plate 64 which satisfies the conditions (2) and (4) is determined as a non-defective product.
Example 5: The metal plate 64 which satisfies the conditions (1) and (2) is determined as a non-defective product.
Example 6: The metal plate 64 which satisfies the conditions (1), (2) and (3) is determined as a non-defective product.
Example 7: The metal plate 64 which satisfies the conditions (1), (2) and (4) is determined as a non-defective product.
Example 8: The metal plate 64 which satisfies the conditions (1), (2), (3) and (4) is determined as a non-defective product.

In the determination step, in addition to the conditions shown in the aforementioned Examples 1 to 8, the metal plate 64 which further satisfies the aforementioned conditions (5), (6), (7) and so on may be determined as a non-defective product. For example, in addition to the conditions shown in the aforementioned Examples 1 to 8, the metal plate 64 which further satisfies the aforementioned condition (5) may be determined as a non-defective product. For example, in addition to the conditions shown in the aforementioned Examples 1 to 8, the metal plate 64 which further satisfies the aforementioned condition (6) may be determined as a non-defective product. For example, in addition to the conditions shown in the aforementioned Examples 1 to 8, the metal plate 64 which further satisfies the aforementioned conditions (5) and (7) may be determined as a non-defective product. For example, in addition to the conditions shown in the aforementioned Examples 1 to 8, the metal plate 64 which further satisfies the aforementioned conditions (6) and (7) may be determined as a non-defective product. Example 1A to Example 1d shown below are examples in which the metal plate 64 which further satisfies one or two of the aforementioned conditions (5), (6) and (7), in addition to the condition shown in the aforementioned Example 1, is determined as a non-defective product.
Example 1A: The metal plate 64 which satisfies the conditions (1) and (5) is determined as a non-defective product.
Example 1B: The metal plate 64 which satisfies the conditions (1) and (6) is determined as a non-defective product.
Example 1C: The metal plate 64 which satisfies the conditions (1), (5) and (7) is determined as a non-defective product.
Example 1D: The metal plate 64 which satisfies the conditions (1), (6) and (7) is determined as a non-defective product.

In the above description, the example in which the inspection step of inspecting the metal plate 64 based on the number, sizes, components, etc. of the particles 64*d* is performed in order to determine the quality of the metal plate 64, i.e., to select the metal plate 64 was shown. Namely, the example in which the inspection step functions as a selecting step of selecting the metal plate 64 in the manufacturing method of the metal plate 64. However, the inspection step may be used for purposes other than selecting the metal plate 64 in the manufacturing method of the metal plate 64.

An example in which the inspection step is used for purposes other than selecting the metal plate 64 in the manufacturing method of the metal plate 64 is described. For example, the inspection of the metal plate 64 based on the number, sizes, components, etc., of the particles 64*d* may be used for optimizing conditions of steps of producing the base metal, such as the melting step of melting a raw material in a melting surface, the surface treatment step, etc., or conditions of steps of manufacturing the metal plate 64, such as the rolling step, the metal-plate surface treatment step, the annealing step, etc.

For example, first, metal plates 64 are manufactured under various conditions, and the number and the sizes of the particles 64*d* included in the sample 81 taken out from each metal plate 64 are calculated. In addition, the manufacturing conditions of a certain metal plate 64 are compared with the number and the sizes of the particles 64*d* included in the sample 81 taken out from the obtained metal plate 64. Thus, it is possible to find out the conditions for manufacturing a metal plate 64 which satisfies the aforementioned determination conditions with high probability. In this manner, the inspection of the metal plate 64 based on the number and sizes of the particles 64*d* may be used for finding out suitable manufacturing conditions. In this case, it is not necessary to perform the inspection step of calculating the number and sizes of the particles 64*d* for all the metal plates obtained in the actual manufacturing method. For example, the inspection step may be performed only on some of the metal plates 64. Alternatively, once the manufacturing conditions are set, the inspection step of calculating the number and sizes of the particles 64*d* may not be performed at all.

(Appearance Inspection Step)

After the rolling step or after the annealing step, an appearance inspection step of inspecting an appearance of the metal plate 64 may be performed. The appearance inspection step may include a step of inspecting the appearance of the metal plate 64 using an automatic inspection machine. The appearance inspection step may include a step of inspecting the appearance of the metal plate 64 visually.

(Shape Inspection Step)

After the rolling step or after the annealing step, a shape inspection step of inspecting a shape of the metal plate 64 may be performed. For example, a three-dimensional measuring instrument may be used to measure a position of the surface of the metal plate 64 in the thickness direction within a predetermined area of the metal plate 64.

Figure 40:
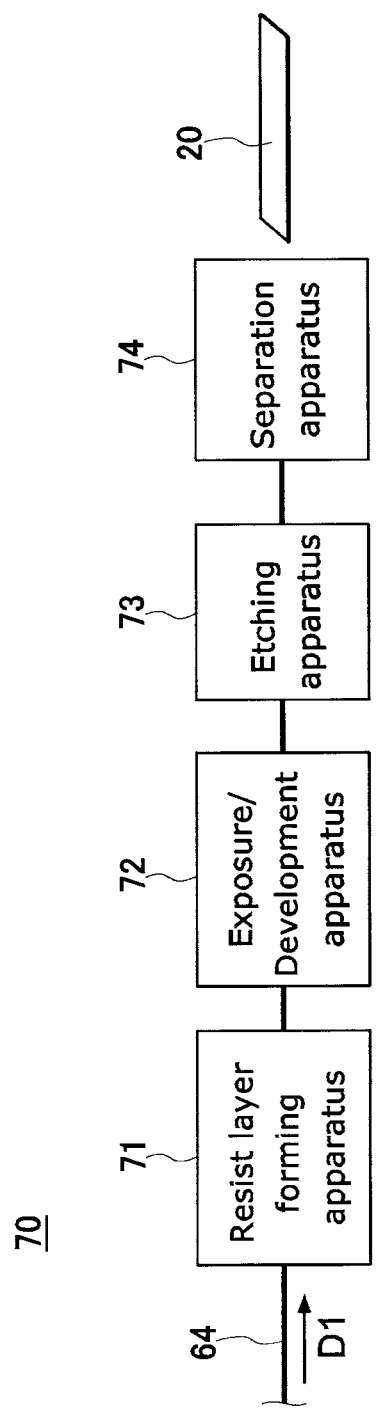
FIG. 40 is a schematic view for generally describing an example of a manufacturing method of a deposition mask.

Next, a method of manufacturing the deposition mask 20 using the metal plate 64 which satisfies the aforementioned determination conditions is described with reference mainly to FIGS. 40 to 43. FIG. 40 is a view showing a manufacturing apparatus 70 that manufactures the deposition mask 20 using the metal plate 64. First, the metal plate 64 extending in the longitudinal direction D1 is prepared. For example, the metal mask 64 is prepared in the state of a wound body 62 in which the metal plate 64 is wound around the core 61 described above. Then, the metal plate 64 is sequentially transferred to a resist layer forming apparatus 71, an exposure/development apparatus 72, an etching apparatus 73 and a separation apparatus 74 shown in FIG. 40. In FIG. 40, the example in which the metal plate 64 is transferred in its longitudinal direction D1 so as to move between the apparatuses is shown. However, not limited thereto, after the metal plate 64 has been wound in a certain apparatus, the metal plate 64 in the state of a wound body may be then supplied to an apparatus on the downstream side.

The resist layer forming apparatus 71 provides a resist layer on the surface of the metal plate 64. The exposure/development apparatus 72 patterns the resist layer to form a resist pattern by subjecting the resist layer to an exposure process and a developing process.

The etching apparatus 73 forms the through holes 25 in the metal plate 64 by etching the metal plate 64 using the resist pattern as a mask. In this embodiment, a large number of the through holes 25 corresponding to a plurality of the deposition masks 20 are formed in the metal plate 64. In other words, a plurality of the deposition masks 20 are assigned to the metal plate 64. For example, a large number of the through holes 25 are formed in the metal plate 64 such that a plurality of the effective areas 22 are arranged in the width direction D2 of the metal mask, and that a plurality of the effective areas 22 for a plurality of the deposition masks 20 are arranged in the longitudinal direction D1 of the metal plate 64.

The separation apparatus 74 performs a separation step of separating, from the metal plate 64, a portion of the metal plate 64, in which a plurality of the through holes 25 corresponding to one deposition mask 20 are formed. In this manner, a deposition masks 20 in sheet form can be obtained.

Figure 41:
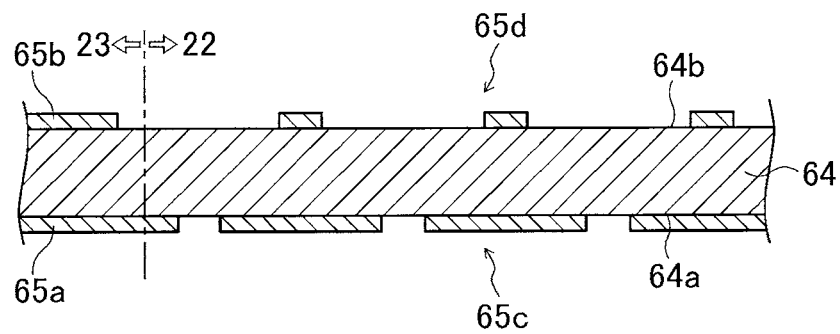
FIG. 41 is a view showing a step of forming a resist pattern on the metal plate.

In the manufacturing method of the deposition mask 20, a resist layer is initially provided on the surface of the metal plate 64 using the resist layer forming apparatus 71. Then, the resist layers 65a and 65b are exposed and developed using the exposure/development apparatus 72. Thus, as shown in FIG. 41, the first resist pattern 65c can be formed on the first surface 64a of the metal plate 64, and the second resist pattern 65d can be formed on the second surface 64b of the metal plate 64.

Figure 42:
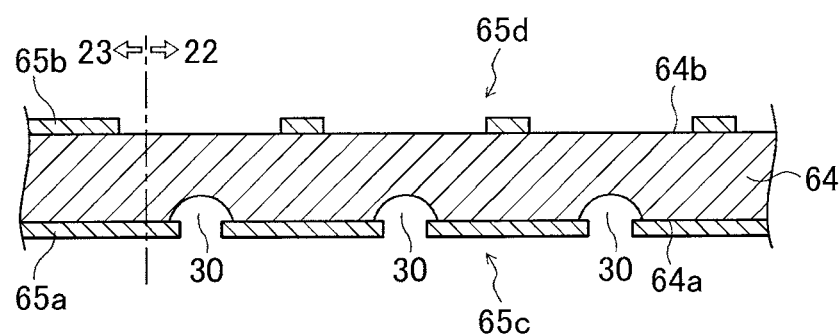
FIG. 42 is a view showing a first surface etching step.
Figure 43:
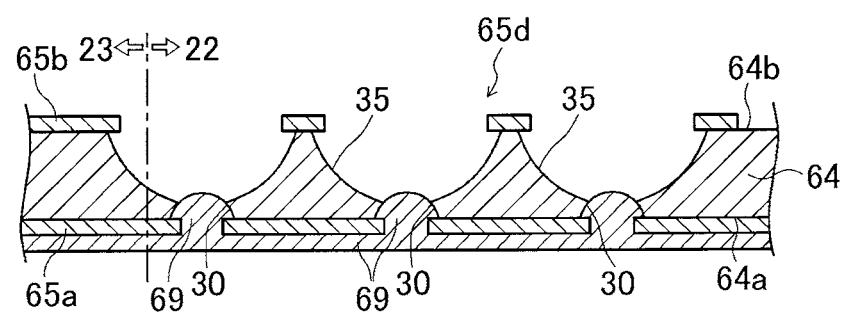
FIG. 43 is a second surface etching step.

Following thereto, the metal plate 64 is etched by using the etching apparatus 73, with the resist pattern 65a, 65b serving as a mask. First, as shown in FIG. 42, areas of the first surface 64a of the metal plate 64, which are not covered with the first resist pattern 65c, are etched by means of the first etchant, so as to form the first recesses 30. Then, the first recesses 30 are covered with the resin 69. Thereafter, as shown in FIG. 43, areas of the second surface 64b of the metal plate 64, which are not covered with the second resist pattern 65d, are etched so as to form the second recesses in the second surface 64b. After that, the resin 69 and the resist patterns 65c and 65d are removed from the metal plate 64.

Thereafter, a plurality of the deposition masks 20 assigned to the metal plate 64 are taken out one by one. For example, a portion of the metal plate 64, in which a plurality of the through holes 25 corresponding to one deposition mask 20 are formed, is separated from another portion of the metal plate 64. Thus, the deposition mask 20 can be obtained.

Following thereto, an inspection step of inspecting whether or not a deviation from an areal reference value of the through hole 25 formed in the metal plate 64 is equal to or less than a predetermined allowable value is performed. The reference value and the allowable value are suitably set according to a pixel density of a display device manufactured with the use of the deposition mask 20, an average value of sizes of the through holes 25, etc. For example, in the case of the deposition mask 20 used for manufacturing a WQHD (Wide Quad High Definition) display device, the allowable value is a predetermined value within a range between 5 $\mu m^2$ or more and 400 $\mu m^2$ or less. In the case of the deposition mask 20 in which an average value of equivalent circle diameters of the through holes 25 is 30 $\mu m \pm 3$ $\mu m$, the allowable value is a predetermined value within a range between 5 $\mu m^2$ or more and 150 $\mu m^2$ or less. In the through-hole inspection step, if the deposition mask 20 includes even one through hole 25 whose deviation from the areal reference value exceeds the allowable value, the deposition mask is excluded as a defective product.

As a method of measuring the area of the through hole 25, a method of using light transmitted through the through hole 25 can be adopted. To be specific, parallel light is caused to enter one of the first surface 20a and the second surface 20b of the deposition mask 20 along the normal direction of the metal plate 64, and to emit from the other of the first surface 20a and the second surface 20b through the through hole 25. An area of the area occupied by the emitted light in the planar direction of the metal plate 64 is measured as an area of the through hole 25. In this case, a profile of the through part 42 at which the opening area of the through hole 25 is minimum in a plan view determines an area of the area occupied by the light emitted from the deposition mask 20 in the planar direction of the metal plate 64.

During the etching step of etching the metal plate 64 for forming the through holes 25, if the particle 64d, 64e in the metal plate 64 falls down, as shown in the aforementioned FIG. 25, the smaller through hole 25B, 25C, which is smaller than the standard through hole 25A, and/or the larger through hole 25D, 25E, which is larger than the standard through hole 25A, may be formed. As a result, the size of the through part 42 may partly become the size SB, SC, which is smaller than the size SA of the standard through hole 25A, or the size SD, SE, which is larger than the size SA. Such a size deviation causes deviation of the area of the through hole 25 from the reference value.

In this embodiment, since the metal plate 64 which satisfies the aforementioned conditions (1) and (2) is used, formation of the smaller through hole 25B, 25C and the larger through hole 25D, 25E, which is caused by the falling down of the particle 64d, 64e, can be restrained. Thus, the area of the through hole 25 can be retrained from deviating from the reference value.

In the through-hole inspection step, in addition to the evaluation of an absolute value of the area of the through hole 25 as described above, or in place of the evaluation of an absolute value of the area of the through hole 25, evaluation of a relative value of the area of the through hole 25 can be performed. For example, when an area of one through hole 25 is S1, and an average value of areas of a plurality of the through holes 25 surrounding the through hole 25 is S2, it may be evaluated whether or not an absolute value of (S1−S2)/S2 is equal to or less than a predetermined threshold value. The threshold value in this case is also suitably set according to a pixel density of a display device manufactured with the use of the deposition mask 20, an average value of sizes of the through holes 25, etc.

In this embodiment, since the metal plate 64 which satisfies the aforementioned conditions (1) and (2) is used, it is possible to restrain the absolute value of (S1−S2)/S2 from exceeding the predetermined threshold value.

When the deposition mask 20 is manufactured with the use of the metal plate 64 which satisfies the aforementioned conditions (1) and (2), the deposition mask 20 may also satisfy the aforementioned conditions (1) and (2). For example, a portion of the deposition mask 20, such as the end part 17a, 17b, the peripheral area 23 of the intermediate part 18, etc., in which no through hole 25 is formed and thus having been covered with resist pattern in the manufacturing method of the deposition mask 20, has not been exposed to the etchant in the manufacturing method. Thus, in the end part 17a, 17b and the peripheral area 23, a state of distribution of the particles 64d in the metal plate 64 before the through holes 25 are formed can be maintained. In other words, in the portion of the deposition mask 20, which has not been exposed to the etchant, the particles 64d in the metal plate 64 have not fallen down and thus the particles 64d remain. Thus, when the particles 64d are analyzed by dissolving the sample 81 taken out from the end part 17a, 17b or the peripheral area 23 of the deposition mask 20, an analysis result, which is the same as the case of the metal plate 64 before the through holes 25 are formed, can be obtained. Thus, when the sample 81, which has been taken out from the end part 17a, 17b or the peripheral area 23 of the deposition mask 20, is analyzed, information on the distribution state of the particles 64d in the metal plate 64, which was used for manufacturing the deposition mask 20, can be obtained.

In this embodiment, as in the aforementioned condition (1), the number of the particles having an equivalent circle diameter of 1 μm or more and 3 μm or less is 50 or more per 1 $mm^3$ in the sample 81 taken out from the metal plate 64. When the particles 64d are exposed to the surface of the metal plate 64, the particles 64d can contribute to improvement in sticking force between the resist layer 65a, 65b and the metal plate 64. In addition, an anchoring effect of the particle 64d on the resist layer 65a, 65b can contribute to improvement in sticking force between the resist layer 65a, 65b and the metal plate 64. Thus, it is possible to restrain the resist layer 65a, 65b of the resist pattern 65c, 65d from peeling off from the metal plate 64 in the manufacturing method of the deposition mask 20, such as the etching step. This makes it easier to use the resist layer 65a, 65b of a small size. Thus, it is easy to shorten the arrangement cycle of the through holes 25 of the deposition mask 20, whereby a display device having a high pixel density can be produced.

By performing the aforementioned base-metal surface treatment step or the metal-layer surface treatment step, the number and the density of the particles 64d included in the metal plate 64 can be reduced. Thus, the probability that the metal plate 64 which satisfies the condition (1) is manufactured can be increased. By adjusting the thickness of the surface part to be removed by the base-metal surface treatment step or the metal-layer surface treatment step, the probability that the metal plate 64 which satisfies the condition (1) is manufactured can be adjusted. Similarly, by adjusting the thickness of the surface part to be removed by the base-metal surface treatment step or the metal-layer surface treatment step, the probability that the metal plate 64 which satisfies the other conditions (2) to (7) is manufactured can be adjusted. Similarly, by adjusting the thickness of the surface part to be removed by the base-metal surface treatment step or the metal-layer surface treatment step, the first ratio, the second ratio and the third ratio of the metal plate 64 can be adjusted. Only one of the base-metal surface treatment steps and the metal-layer surface treatment step may be performed, or both of them may be performed.

Next, a fixing step of fixing the deposition masks 20 obtained as described above, to the frame 15 is performed. Thus, the deposition mask apparatus 10 comprising the deposition mask 20 and the frame 15 can be obtained.

In the fixing step, a stretching step of adjusting a position of the deposition mask 20 with respect to the frame 15 is performed, while tension is applied to the deposition mask 20. In the stretching step, for example, the end parts 17a and 17b of the deposition mask 20 are sandwiched and gripped by a clamp unit, not shown. Following thereto, while tension is applied to the deposition mask 20, the position and the tension of the deposition mask 20 are adjusted such that a difference between the position of the through hole 25 of the deposition mask and the position of an electrode on the organic EL substrate 92 (or a substrate simulating the organic EL substrate 92) is equal to or less than a predetermined reference value. The reference value is 3 μm, for example. Following thereto, a welding step of welding the end part 17 to the frame 15 by heating the end part 17 is performed, with the end part 17 of the deposition mask 20 and the frame 15 being in contact with each other. For example, a pulsed laser beam is applied to the end part 17 so as to weld multiple points of the end part 17 to the frame 15. In this manner, the deposition mask 20 can be fixed onto the fame 15.

Next, a deposition method of depositing the deposition material 98 onto a substrate, such as the organic EL substrate 92, by using the deposition mask 20 according to this embodiment is described. First, the deposition mask apparatus 10 is arranged such that the deposition mask 20 is opposed to the organic EL substrate 92. In addition, the deposition mask 20 is brought into close contact with the organic EL substrate 92 by means of the magnet 93. Under this state, the deposition material 98 is evaporated to fly to the organic EL substrate 92 through the deposition mask 20, whereby the deposition material 98 can be adhered to the organic EL substrate 92 in a pattern corresponding to the through holes 25 of the deposition mask 20. Here, in the deposition mask 20 according to this embodiment, as described above, it is possible to restrain the accuracy of the shape of the through hole 25 from being lowered due the particles. Thus, the accuracy of an area, a shape, a thickness, etc., of the deposition material 98 adhering to the organic EL substrate 92 can be improved.

The aforementioned embodiment can be variously modified. Herebelow, a modified example is described with reference to the drawings as necessary. In the below description and the drawings used in the below description, a part that can be similarly constituted to the above embodiment has the same symbol as that of corresponding part the above embodiment, and overlapped description is omitted. When the effect obtained by the aforementioned embodiment can be apparently obtained in the modification example, its description is sometimes omitted.

Figure 44:
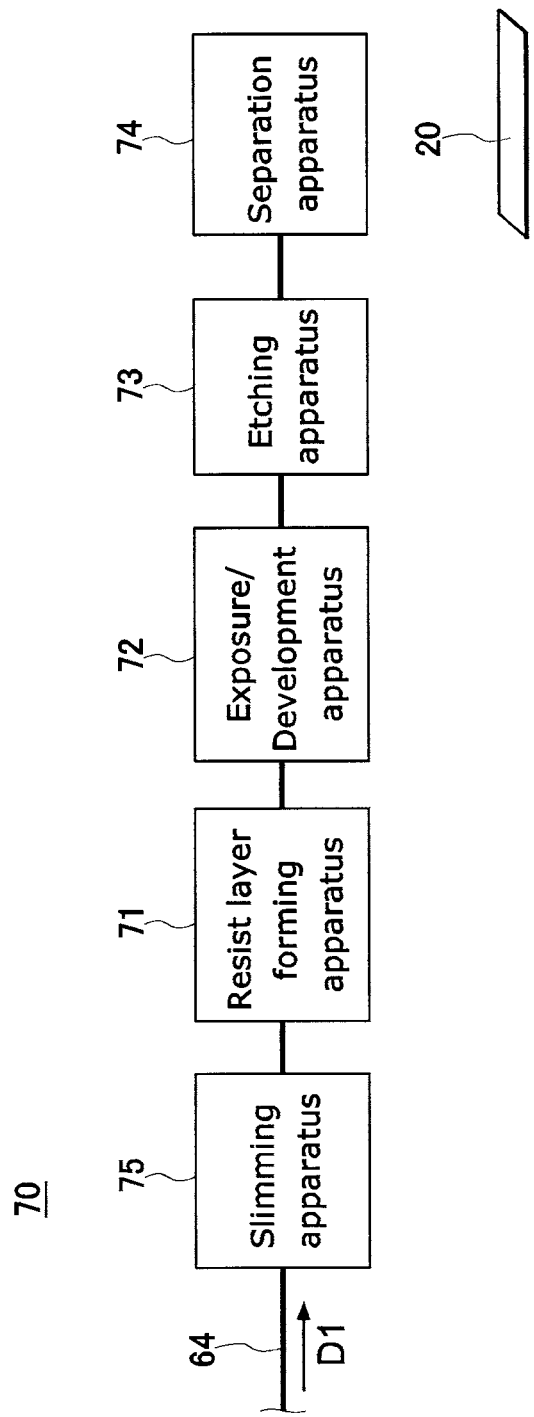
FIG. 44 is a schematic view for describing a first modification example of the manufacturing method of a deposition mask.

First, a modification example of the manufacturing method of the metal plate 64 is described. FIG. 44 is a schematic view for generally describing the modification example of the manufacturing method of the deposition mask 20. A manufacturing apparatus 70 shown in FIG. 44 differs from the aforementioned manufacturing apparatus 70 shown in FIG. 40 only in that it comprises a sliming apparatus 70 positioned on the upstream side of the resist layer forming apparatus 71, and other structures are the same.

The slimming apparatus 75 is an apparatus that reduces the thickness of the metal plate 64 unwound from the wound body. The slimming apparatus 75 reduces the thickness of the metal plate 64 by, for example, entirely etching a portion of the metal plate 64, which corresponds to at least the effective area 22. By performing the slimming of the metal plate 64, even when it is difficult to increase a rolling reduction ratio in the rolling step, the metal plate 64 having a small thickness can be obtained.

Next, a modification example of the step of forming the through holes 25 in the metal plate 64 in the manufacturing method of the metal plate 64 is described. In the aforementioned embodiment, the example in which the step of forming the through holes 25 in the metal plate 64 includes the first surface etching step of etching the first surface 64a of the metal plate 64, and the second surface etching step of etching the second surface 64b of the metal plate 64 was shown. However, not limited thereto, the step of forming the through holes 25 in the metal plate 64 may include laser processing of forming the through holes 25 by irradiating the metal plate 64 with a laser. In this case, the laser processing may be performed instead of the first surface etching step as described below.

Figure 45:
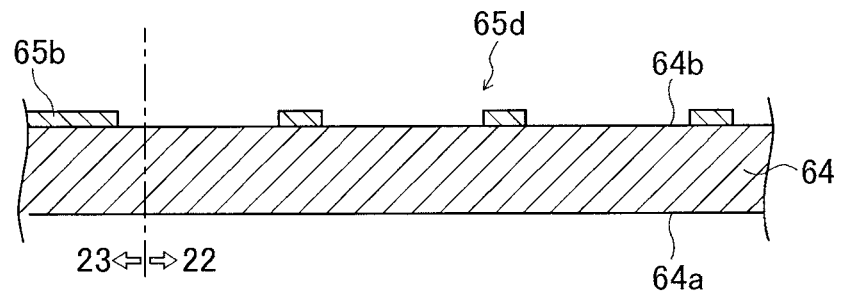
FIG. 45 is a schematic view for describing a second modification example of the manufacturing method of a deposition mask.
Figure 46:
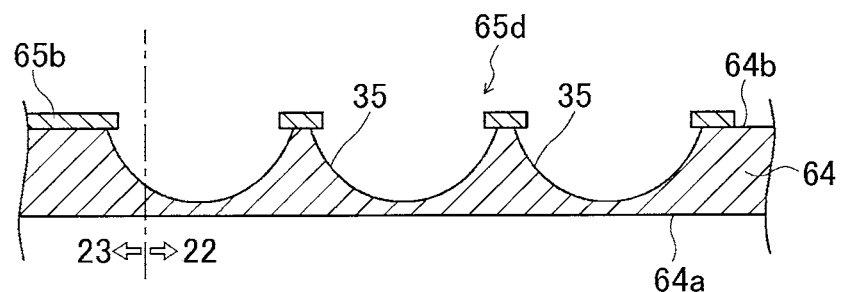
FIG. 46 is a schematic view for describing the second modification example of the manufacturing method of a deposition mask.
Figure 47:
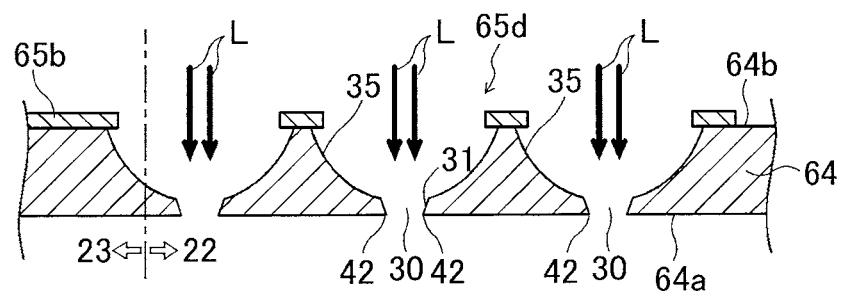
FIG. 47 is a schematic view for describing the second modification example of the manufacturing method of a deposition mask.

As shown in FIG. 45, the second resist pattern 65b is initially formed on the second surface 64b of the metal plate 64. Following thereto, as shown in FIG. 46, the second surface etching step is performed. In the second surface etching step, the areas of the second surface 64b of the metal plate 64, which are not covered with the second resist layer 65b, are etched so as to form the second recesses 35 in the second surface 64b. Thereafter, as shown in FIG. 47, a laser processing step is performed. In the laser processing step, the portions of the metal plate 64, in which the second recesses 35 are formed, are partly irradiated with a laser L so as to form the first recesses 30 extending from the wall surfaces of the second recesses 35 through the first surface 64a. As shown in FIG. 47, the laser L1 may be applied to the second surface 64b side of the metal plate 64.

Also in the example shown in FIGS. 45 to 47, in case the particle 64d in the metal plate 64 falls down during the second surface etching step, the through hole 25 may be deviated from a size design value, and/or sizes of the through holes 25 may be non-uniform. Thus, also in the example shown in FIGS. 45 to 47, it is important to use the metal plate 64 which satisfies the aforementioned conditions (1), (2) and so on.

As shown in FIG. 47, the wall surface 31 of the first recess 30 formed by the laser processing may be inclined so as to be displaced toward the center side of the through hole 25 in a plan view, from the second surface 64b side toward the first surface 64a side. In this case, an end of the first recess 30 on the first surface 64a defines the through part 42 at which the opening area of the through hole 25 is minimum in a plan view.

Next, a modification example of the inspection step is described. In the aforementioned embodiment, the example in which the inspection step of inspecting the density and the sizes of the particles 64d included in the metal plate 64 is performed on the metal plate 64 before the through holes 25 are formed therein was shown. However, not limited thereto, the inspection step of inspecting the particles 64d included in the metal plate 64 may be performed on the metal plate 64 after the through holes 25 have been formed therein, i.e., on the deposition mask 20. In this case, the particles 64d may be inspected by using the sample 81 taken out from a portion of the metal plate 64, in which no through hole 25 is formed, such as the end part 17a, 17b, the peripheral area 23, etc., of the deposition mask 20. When the sample 81 is taken out from the portion of the metal plate 64, in which no through hole 25 is formed, a dissolved volume of the sample 81 can be calculated based on the thickness of the metal plate 64 constituting the deposition mask 20, and the area and the number of the sample pieces 81a taken out from the sample 81. The particles 64d may be inspected by using the sample 81 taken out from a portion of the metal plate 64, in which the through holes 25 are formed. In this case, the dissolved volume of the sample 81 may be calculated based on a measured value of a weight of the sample 81 and density data of a material constituting the sample 81.

EXAMPLES

Next, the embodiment of the present disclosure is described further specifically with reference to Examples, but the embodiment of the present disclosure is not limited to the description of the following Examples, as long as it exceeds the scope thereof.

Example 1

First, iron, nickel and other raw materials were prepared such that a ratio of iron to the total raw material and a ratio of nickel thereto were about 64% by weight and about 36% by weight, respectively. Following thereto, the respective raw materials were crushed as needed, and thereafter, the first melting step of melting the respective raw materials in a melting furnace was performed. In the first melting step, aluminum, manganese and silicon were put into the melting furnace for deoxidation, dehydration, denitrification and so on. The first melting step was performed under an atmosphere of an inert gas at a low pressure lower than the atmospheric pressure. Following thereto, the first surface treatment step of removing the surface part of the first ingot obtained by the first melting step was performed. The thickness of the removed surface part was 10 mm or more.

Following thereto, the second melting step of melting the first ingot, from which the surface part had been removed in the first surface treatment step, so as to obtain a second ingot, and the second surface treatment step of removing the surface part of the second ingot were performed. The thickness of the removed surface part was 10 mm or more. In this manner, a base metal composed of an iron alloy containing nickel, balancing iron and inevitable impurities was prepared.

Then, by performing the aforementioned rolling step, the annealing step and the slitting step on the base metal, a wound body (first wound body) in which the metal plate having a thickness of 20 μm was wound was manufactured. Following thereto, the deposition mask 20 was manufactured using the metal plate 64 of the first wound body, by the manufacturing method shown in the aforementioned FIGS. 6 to 11. The deposition mask 20 manufactured from the metal plate 64 of the first wound body is also referred to as first mask. Then, the square sample 81 having a side length K1 of 60 mm was cut out from the first end part 17a of the first mask. The sample 81 included the first surface 64a and the second surface 64b of the metal plate 64 constituting the first end part 17a of the first mask. Then, three circular sample pieces 81a having a diameter K2 of 20 mm were punched out from the sample 81. Following thereto, the sample pieces 81a were ultrasonically cleaned with pure water so as to remove foreign matters adhering to the sample pieces 81a. A frequency of ultrasonic waves was 28 kHz, and an ultrasonic cleaning time was 10 seconds.

Following thereto, the sample dissolution step of dissolving the sample pieces 81a in the aqueous solution 83 was performed. To be specific, a beaker having a volume of 500 ml was initially prepared as the container 82, and the three sample pieces 81a were placed in the beaker. Then, 100 ml of the aqueous solution 83 at 50° C. was poured into the beaker to dissolve the sample pieces 81a. At this time, the sample pieces 81a were dissolved in the aqueous solution 83 in the beaker for 30 minutes in total, with the beaker being swung for the first 15 minutes and the beaker being left still for the next 15 minutes. An aqueous solution containing nitric acid was used as the aqueous solution 83. To be specific, the aqueous solution 83 was prepared by mixing 500 ml of a nitric acid solution and 500 ml of pure water. As the nitric acid solution, special grade nitric acid (1.38) manufactured by Hayashi Junyaku Kogyo Co., Ltd. was used. The special grade nitric acid (1.38) is an aqueous solution containing nitric acid at a concentration of 60% by weight.

Following thereto, the filtering step of taking out particles from the aqueous solution 83 in which the sample pieces 81a were dissolved, by means of a suction filtration apparatus. As the filter paper, a membrane filter JHWP02500 manufactured by MILLIPORE Company was used. A pore diameter, i.e., a pore size of JHWP02500 is 0.45 μm. Thus, particles having a diameter of at least 1 μm or more are considered to remain on the JHWP02500. As the decompression unit that decompresses the space on the downstream side of the filter paper, a suction and pressurization Chemical Duty pump WP6110060 manufactured by MILLIPORE Company was used. After the aqueous solution in the beaker had been filtered once with the filter paper, a rinsing step of pouring pure water into the beaker and filtering the pure water with the filter paper was performed three times.

Following thereto, the aforementioned particle drying step was performed to dry the filter paper and the particles remaining on the filter paper.

Following thereto, the aforementioned observation step was performed using the SEM to detect particles on the filter paper. As the SEM, a polar scanning electron microscope JSM7800FPRIME manufactured by JEOL Ltd. was used. The SEM setting and the method of adjusting the contrast and/or brightness of the SEM are as described above. Following thereto, the detected particles were analyzed using the particle automatic analysis software Particle Phase Analysis version 6.53 manufactured by AMETEK. In addition, composition analysis of the particles was performed using an EDX device Octane Elect manufactured by AMETEK. Thus, particles containing as a main component an element other than iron and nickel, and having an equivalent circle diameter of 1 μm or more were extracted. In addition, the number of the particles per 1 mm$^3$ in the sample 81, and equivalent circle diameters of the respective particles were calculated. The number of the particles having an equivalent circle diameter of 1 μm or more was 924 per 1 mm$^3$ in the sample 81 (referred to also as total quantity herebelow).

As shown in FIG. 48, the number of the particles having an equivalent circle diameter of 1 μm or more and less than 3 m was 912 per 1 mm$^3$ in the sample 81 (referred to also as first quantity herebelow), the number of the particles having an equivalent circle diameter of 3 μm or more and less than 5 μm was 12 per 1 mm$^3$ in the sample 81 (referred to also as second quantity herebelow), and the number of the particles having a diameter of 5 μm or more was 0 per 1 mm$^3$ in the sample 81 (referred to also as third quantity herebelow). The number of the particles having a diameter of 3 μm or more is 12 per 1 mm$^3$. Thus, in the metal plate of the first mask, the aforementioned conditions (1) and (2), (3) and (4) are satisfied.

In addition, a ratio of the first quantity (referred to also as first ratio) to the total quantity, a ratio of the second quantity (referred to also as second ratio) to the total quantity and a ratio of the third quantity (referred to also as third ratio) to the total quantity were respectively calculated. In FIG. 48, as shown in the parentheses below the first quantities, second quantities and third quantities, the first ratio was 98.7%, the second ratio was 1.3%, and the third ratio was 0.0%.

Further, a composition of the particles having an equivalent circle diameter of 1 μm or more was analyzed using the EDX device. As shown in FIG. 49, the number of the particles containing magnesium as a main component (referred to also as Mg quantity herebelow) was 6 per 1 mm$^3$ in the sample 81, the number of the particles containing aluminum as a main component (referred to also as Al quantity herebelow) was 770 per 1 mm$^3$ in the sample 81, the number of the particles containing silicon as a main component (referred to also as Si quantity herebelow) was 80 per 1 mm$^3$ in the sample 81, the number of the particles containing phosphorus as a main component (referred to also as P quantity herebelow) was 0 per 1 mm$^3$ in the sample 81, the number of the particles containing zirconium as a main component (referred to also as Zr quantity herebelow) was 37 per 1 mm$^3$ in the sample 81, and the number of the particles containing sulfur as a main component (referred to also as S quantity herebelow) was 31 per 1 mm$^3$ in the sample 81.

Examples 2 to 4

Similarly to Example 1, iron, nickel, and other raw materials were prepared such that a ratio of iron to the total raw material and a ratio of nickel thereto were about 64% by weight and about 36% by weight, respectively. Following thereto, the respective raw materials were crushed as needed, and thereafter, the first melting step, the first surface treatment step, the second melting step and the second surface treatment step were performed to produce a base metal. Following thereto, by performing the rolling step, the annealing step and the slitting step on the base metal, a second wound body to a fourth wound body in which the metal plates 64 having a thickness of 20 μm were wound were manufactured. Manufacturing conditions of the second wound body to the fourth wound body are basically the same as the manufacturing conditions of the first wound body, but details are different. To be specific, the manufacturing conditions of the second wound body to the fourth wound body differ from the manufacturing conditions of the first wound body with respect to at least one of the following (A) to (D). The manufacturing conditions of the second wound body to the fourth wound body differ from one another with respect to at least one of the following (A) to (D).

(A) Amount of the additive agent in the first dissolution step
(B) Thickness of the surface part to be removed in the first surface treatment step
(C) Number of the melting steps
(D) Atmospheric pressure in the first melting step Similarly to the aforementioned Example 1, the deposition masks 20 were manufactured by the manufacturing method shown in the aforementioned FIGS. 6 to 11 with the use of the metal plates 64 of the second wound body to the fourth wound body. The deposition masks 20 manufactured from the metal plate 64 of the second wound body to the fourth wound body are referred to also as second mask to fourth mask. Following thereto, particles included in the respective samples 81 taken out from the first end parts 17a of the second mask to the fourth mask were observed using the SEM, and the number of the particles included in a volume of 1 mm³ of the sample 81 and equivalent circle diameters of the respective particles were calculated. The results are shown in FIG. 48. In addition, similarly to the aforementioned Example 1, a composition of the particles having an equivalent circle diameter of 1 μm or more was analyzed using the EDX device. The results are shown in FIG. 49.

Examples 5 to 12

Similarly to Example 1, iron, nickel, and other raw materials were prepared such that a ratio of iron to the total raw material and a ratio of nickel thereto were about 64% by weight and about 36% by weight, respectively. Following thereto, the respective raw materials were crushed as needed, and thereafter, the first melting step, the first surface treatment step, the second melting step and the second surface treatment step were performed to produce a second ingot. Following thereto, the third melting step of obtaining a third ingot by melting in the melting furnace the second ingot from which the surface part had been removed in the second surface treatment step, and the third surface treatment step of removing the surface part of the third ingot were further performed. A thickness of the removed surface part was 10 mm or more. In this manner, a base metal composed of an iron alloy containing nickel, balancing iron and inevitable impurities was prepared. Following thereto, by performing the rolling step, the annealing step and the slitting step on the base metal, a fifth wound body to a twelfth wound body in which the metal plates having a thickness of 20 μm were wound were respectively manufactured. Manufacturing conditions of the fifth wound body to the twelfth wound body are basically the same with one another, but details are different. To be specific, the manufacturing conditions of the fifth wound body to the twelfth wound body differ from one another with respect to at least one of the following (A) to (D).
(A) Amount of the additive agent in the first dissolution step
(B) Thickness of the surface part to be removed in the first surface treatment step
(C) Number of the melting steps
(D) Atmospheric pressure in the first melting step Similarly to the aforementioned Example 1, the deposition masks 20 were manufactured by the manufacturing method shown in the aforementioned FIGS. 6 to 11 with the use of the metal plates 64 of the fifth wound body to the twelfth wound body. The deposition masks 20 manufactured from the metal plates 64 of the fifth wound body to the twelfth wound body are referred to also as fifth mask to twelfth mask, respectively. Following thereto, particles included in the respective samples taken out from the first end parts 17a of the fifth mask to the twelfth mask were observed using the SEM, and the number of the particles included in a volume of 1 mm³ of the sample 81 and equivalent circle diameters of the respective particles were calculated. The results are shown in FIG. 48.

In addition, similarly to the aforementioned Example 1, a composition of the particles having an equivalent circle diameter of 1 μm or more was analyzed. The results are shown in FIG. 49.

When the metal plate 64 of the seventh wound body was used, a phenomenon occurred in which the resist layer peeled off from the metal plate 64 during the etching step of forming the through holes 25 by etching the metal plate 64. Thus, the deposition mask 20 could not be manufactured from the metal plate 64 of the seventh wound body. In FIGS. 48 and 49, the measuring results described in the line of "seventh mask" are results obtained by observing the particles included in the sample taken out from the metal plate 64 of the seventh wound body using the SEM, and by analyzing the composition of the particles.

Examples 13 to 17

Similarly to Example 1, iron, nickel, and other raw materials were prepared such that a ratio of iron to the total raw material and a ratio of nickel thereto were about 64% by weight and about 36% by weight, respectively. Following thereto, the respective raw materials were crushed as needed, and thereafter, the first melting step and the first surface treatment step were performed to produce a base metal. Following thereto, by performing the rolling step, the annealing step and the slitting step on the base metal, a thirteenth wound body to a seventeenth wound body in which the metal plates having a thickness of 20 μm were wound were respectively manufactured. Manufacturing conditions of the thirteenth wound body to the seventeenth wound body are basically the same with one another, but details are different. To be specific, the manufacturing conditions of the thirteenth wound body to the seventeenth wound body differ from one another with respect to at least one of the following (A) to (D).
(A) Amount of the additive agent in the first dissolution step
(B) Thickness of the surface part to be removed in the first surface treatment step
(C) Number of the melting steps
(D) Atmospheric pressure in the first melting step Similarly to the aforementioned Example 1, the deposition masks 20 were manufactured by the manufacturing method shown in the aforementioned FIGS. 6 to 11 with the use of the metal plates 64 of the thirteenth wound body to the seventeenth wound body. The deposition masks 20 manufactured from the metal plates 64 of the thirteenth wound body to the seventeenth wound body are referred to also as thirteenth mask to seventeenth mask, respectively. Following thereto, particles included in the respective samples taken out from the first end parts 17a of the thirteenth mask to seventeenth mask were observed using the SEM, and the number of the particles included in a volume of 1 mm³ of the sample 81 and equivalent circle diameters of the respective particles were calculated. The results are shown in FIG. 48. In addition, similarly to the aforementioned Example 1, a composition of the particles having an equivalent circle diameter of 1 μm or more was analyzed. The results are shown in FIG. 49.

Examples 21 to 22

Similarly to Example 1, iron, nickel, and other raw materials were prepared such that a ratio of iron to the total raw material and a ratio of nickel thereto were about 64% by weight and about 36% by weight, respectively. Following thereto, the respective raw materials were crushed as needed, and thereafter, the first melting step, the first surface treatment step, the second melting step and the second surface treatment step were performed to produce a base metal. Following thereto, by performing the rolling step, the annealing step and the slitting step on the base metal, a twenty-first wound body to a twenty-second wound body in which the metal plates 64 were wound were manufactured. The metal plate of the twenty-first wound body had a thickness of 50 μm. The metal plate of the twenty-second wound body had a thickness of 80 μm.

Similarly to the aforementioned Example 1, the deposition masks 20 were manufactured by the manufacturing method shown in the aforementioned FIGS. 6 to 11 with the use of the metal plates 64 of the twenty-first wound body to the twenty-second wound body. The deposition masks 20 manufactured from the metal plate 64 of the twenty-first wound body to the twenty-second wound body are referred to also as twenty-first mask to twenty-second mask. Following thereto, particles included in the respective samples 81 taken out from the first end parts 17a of the twenty-first mask to the twenty-second mask were observed using the SEM, and the number of the particles included in a volume of 1 mm$^3$ of the sample 81 and equivalent circle diameters of the respective particles were calculated. The results are shown in FIG. 48. In addition, similarly to the aforementioned Example 1, a composition of the particles having an equivalent circle diameter of 1 μm or more was analyzed using the EDX device. The results are shown in FIG. 49.

Example 23

Similarly to Example 1, iron, nickel, and other raw materials were prepared such that a ratio of iron to the total raw material and a ratio of nickel thereto were about 64% by weight and about 36% by weight, respectively. Following thereto, the respective raw materials were crushed as needed, and thereafter, the first melting step and the first surface treatment step were performed to produce a base metal. Following thereto, by performing the rolling step, the annealing step and the slitting step on the base metal, a twenty-third wound body in which the metal plate 64 were wound was manufactured. The metal plate of the twenty-third wound body had a thickness of 70 μm.

Similarly to the aforementioned Example 1, the deposition mask 20 was manufactured by the manufacturing method shown in the aforementioned FIGS. 6 to 11 with the use of the metal plates 64 of the twenty-third wound body. The deposition mask 20 manufactured from the metal plate 64 of the twenty-third wound body is referred to also as twenty-third mask. Following thereto, particles included in the sample 81 taken out from the first end part 17a of the twenty-third mask was observed using the SEM, and the number of the particles included in a volume of 1 mm$^3$ of the sample 81 and equivalent circle diameters of the respective particles were calculated. The results are shown in FIG. 48. In addition, similarly to the aforementioned Example 1, a composition of the particles having an equivalent circle diameter of 1 μm or more was analyzed using the EDX device. The results are shown in FIG. 49.

Examples 24 to 25

Similarly to Example 1, iron, nickel, and other raw materials were prepared such that a ratio of iron to the total raw material and a ratio of nickel thereto were about 64% by weight and about 36% by weight, respectively. Following thereto, the respective raw materials were crushed as needed, and thereafter, the first melting step, the first surface treatment step, the second melting step and the second surface treatment step were performed to produce a second ingot. Following thereto, the third melting step of obtaining a third ingot by melting in the melting furnace the second ingot from which the surface part had been removed in the second surface treatment step, and the third surface treatment step of removing the surface part of the third ingot were further performed. A thickness of the removed surface part was 10 mm or more. In this manner, a base metal composed of an iron alloy containing nickel, balancing iron and inevitable impurities was prepared. Following thereto, by performing the rolling step, the annealing step and the slitting step on the base metal, a twenty-fourth wound body to a twenty-fifth wound body in which the metal plates were wound were respectively manufactured. The metal plate of the twenty-fourth wound body had a thickness of 60 μm. The metal plate of the twenty-fifth wound body had a thickness of 16 μm.

Similarly to the aforementioned Example 1, the deposition masks 20 were manufactured by the manufacturing method shown in the aforementioned FIGS. 6 to 11 with the use of the metal plates 64 of the twenty-fourth wound body to the twenty-fifth wound body. The deposition masks 20 manufactured from the metal plate 64 of the twenty-fourth wound body to the twenty-fifth wound body are referred to also as twenty-fourth mask to twenty-fifth mask. Following thereto, particles included in the respective samples 81 taken out from the first end parts 17a of the twenty-fourth mask to the twenty-fifth mask were observed using the SEM, and the number of the particles included in a volume of 1 mm$^3$ of the sample 81 and equivalent circle diameters of the respective particles were calculated. The results are shown in FIG. 48. In addition, similarly to the aforementioned Example 1, a composition of the particles having an equivalent circle diameter of 1 μm or more was analyzed using the EDX device. The results are shown in FIG. 49.

Following thereto, Evaluation A and Evaluation B regarding accuracy of an area of the through hole 25 of the first mask to the seventeenth mask and the twenty-first mask to the twenty-fifth mask were performed.

(Evaluation A of Accuracy of Through-Hole Area)

Figure 62:
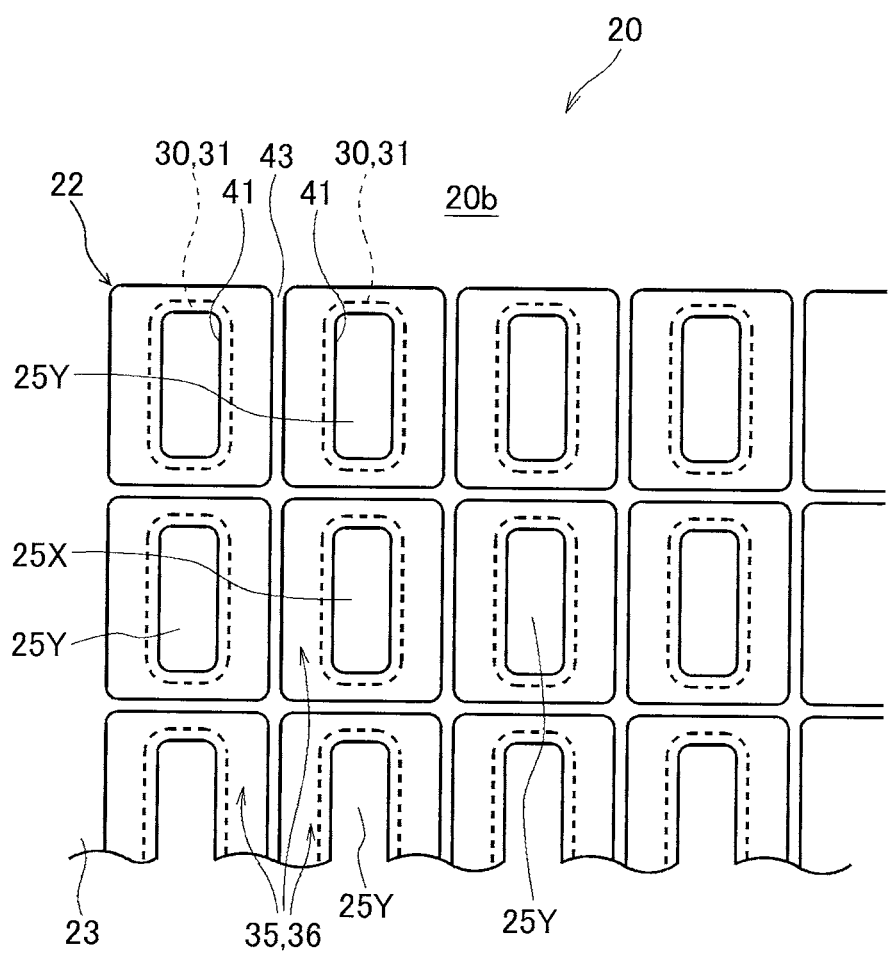
FIG. 62 is a view for describing a method of evaluating a relative value of an area of a through hole.

It was evaluated whether or not an area of the through hole 25 of the deposition mask 20 was within a predetermined allowable range. To be specific, as shown in FIG. 62, an area S1 of one through hole 25X and an average value S2 of areas of a plurality of the through holes 25Y surrounding the through hole 25X were measured. In the example shown in FIG. 62, the number of the through holes 25Y is four. Following thereto, it was evaluated whether or not an absolute value of (S1−S2)/S1 was equal to or less than a first threshold value. The first threshold value is set according to a pixel density of a display device manufactured with the use of the deposition mask 20, an average value of sizes of the through holes 25, etc. For example, in the case of the deposition mask 20 in which an average value of equivalent circle diameters of the through holes 25 is 30 μm, the first threshold value is 0.20.

As a method of measuring the area of the through hole 25, a method of using light transmitted through the through hole 25 was adopted. To be specific, parallel light is caused to enter one of the first surface 20a and the second surface 20b of the deposition mask 20 along the normal direction of the metal plate 64, and to emit from the other of the first surface 20a and the second surface 20b through the through hole 25. Then, by photographing an area occupied by the emitted light in the plane direction of the metal plate with a camera, an area of the area was measured. This measurement result was adopted as the area of each through hole 25. In this case, a profile of the through part 42 in a plan view determines an area of the area occupied by the light emitted from the deposition mask 20 in the plane direction of the metal plate 64.

The evaluation results are shown in the "Evaluation A-1" column and the "Evaluation A-2" column of FIG. 48. In the "Evaluation A-1" column, "OK" means that the absolute value of (S1−S2)/S1 of all the through holes 25 of the deposition mask 20 was 0.20 or less, and "NG" means that the absolute value of (S1−S2)/S1 of at least one or more of the through holes 25 exceeded 0.20. In the "Evaluation A-2" column, "OK" means that the absolute value of (S1−S2)/S1 of all the through holes 25 of the deposition mask 20 was 0.20 or less, and "NG" means that the absolute value of (S1−S2)/S1 of at least one or more of the through holes 25 was less than −0.20. Thus, when the aforementioned larger through hole is generated, NG is likely to appear in the Evaluation A-1. On the other hand, when the aforementioned smaller through hole is generated, NG is likely to appear in the Evaluation A-2. The number of through holes 25 to be evaluated was 25 μmillion or more per deposition mask 20.

(Evaluation B of Accuracy of Through-Hole Area)

It was evaluated whether or not the absolute value of the aforementioned (S1−S2)/S1 was equal to or less than a second threshold value that was smaller than the first threshold value. The second threshold value is set according to a pixel density of a display device manufactured with the use of the deposition mask 20, an average value of sizes of the through holes 25, etc. For example, in the case of the deposition mask 20 in which an average value of equivalent circle diameters of the through holes 25 is 20 μm, the second threshold value is 0.15.

The evaluation results are shown in the "Evaluation B-1" column and the "Evaluation B-2" column of FIG. 48. In the "Evaluation B-1" column, "OK" means that the absolute value of (S1−S2)/S1 of all the through holes 25 of the deposition mask 20 was 0.15 or less, and "NG" means that the absolute value of (S1−S2)/S1 of at least one or more of the through holes 25 exceeded 0.15. In the "Evaluation B-2" column, "OK" means that the absolute value of (S1−S2)/S1 of all the through holes 25 of the deposition mask 20 was 0.15 or less, and "NG" means that the absolute value of (S1−S2)/S1 of at least one or more of the through holes 25 was less than −0.15. Thus, when the aforementioned larger through hole is generated, NG is likely to appear in the Evaluation B-1. On the other hand, when the aforementioned smaller through hole is generated, NG is likely to appear in the Evaluation B-2. The number of through holes 25 to be evaluated was 25 μmillion or more per deposition mask 20.

The size of the through hole 25 generally decreases as the pixel density of a display device increases. For example, in the case of a WQHD smartphone display device, the pixel density is about 500 ppi, and the diameter of the through hole 25 is about 30 μm. In the case of a UHD smartphone display device, the pixel density is about 800 ppi, and the diameter of the through hole 25 is about 20 μm.

In order to accurately form the through holes 25 having a small size in the metal plate 64, it is preferable that the thickness of the metal plate 64 is small. For example, the thickness of the metal plate 64 of the deposition mask 20 for producing a smartphone display device having a pixel density of about 500 ppi is preferably 20 μm or less. Meanwhile, the thickness of the metal plate 64 of the deposition mask for producing a smartphone display device having a pixel density of about 800 ppi is preferably 15 μm or less.

Herebelow, the results of Evaluation A-1, Evaluation A-2, Evaluation B-1 and Evaluation B-2 are described.

As shown in FIG. 48, in the first mask to the sixth mask, the eighth mask to the twelfth mask, the sixteenth mask, the seventeenth mask, and the twenty-first mask to the twenty-fifth mask in which the number of the particles having an equivalent circle diameter of 1 μm or more was 50 or more and 3000 or less per 1 mm$^3$ in the sample 81, Evaluation A-1 was OK. On the other hand, in the thirteenth mask to the fifteenth mask in which the number of the particles having an equivalent circle diameter of 1 μm or more exceeded 3000 per 1 mm$^3$ in the sample 81, Evaluation A-1 was NG. From this, it can be said that the aforementioned condition (1) is a useful determination condition for restraining formation of larger through holes.

As shown in FIG. 48, in the first mask to the sixth mask, the eighth mask to the thirteenth mask, the sixteenth mask, the seventeenth mask and the twenty-first mask to the twenty-fifth mask in which the number of the particles having an equivalent circle diameter of 3 μm or more was 50 or less per 1 mm$^3$ in the sample 81, Evaluation A-2 was OK. On the other hand, in the fourteenth mask and the fifteenth mask in which the number of the particles having an equivalent circle diameter of 1 μm or more was exceeded 50 per 1 mm$^3$ in the sample 81, Evaluation A-2 was NG. From this, it can be said that the aforementioned condition (2) is a useful determination condition for restraining formation of smaller through holes.

As described above, when the metal plate 64 of the seventh wound body was used, a phenomenon occurred in which the resist layer peeled off from the metal plate 64 during the etching step of forming the through holes 25 by etching the metal plate 64. Thus, the deposition mask 20 could not be manufactured from the metal plate 64 of the seventh body. As shown in FIG. 48, the number of the particles having an equivalent circle diameter of 1 μm or more was less than 50 per 1 mm$^3$ in the sample 81. Thus, it can be said that the matter in which "the number of the particles having an equivalent circle diameter of 1 μm or more is 50 or more per 1 mm$^3$ in the sample" in the aforementioned condition (1) is a useful determination condition for restraining peeling of the resist layer.

As shown in FIG. 48, in the first mask, the fourth mask to the sixth mask, the eighth mask to the twelfth mask, the twenty-fourth mask and the twenty-fifth mask in which the number of the particles having an equivalent circle diameter of 1 μm or more was 1000 or less per 1 mm$^3$ in the sample 81, Evaluation B-1 was OK. On the other hand, in the second mask, the third mask, the thirteenth mask to the seventeenth mask and the twenty-first mask to the twenty-third mask in which the number of the particles having an equivalent circle diameter of 1 μm or more and less than 3 μm exceeded 1000 per 1 mm$^3$ in the sample 81, Evaluation B-1 was NG. From this, it can be said that the aforementioned condition (3) is a useful determination condition for more reliably restraining formation of larger through holes.

As shown in FIG. 48, in the first mask, the fourth mask to the sixth mask, the eighth mask to the twelfth mask, the twenty-second mask, the twenty-fourth mask and the twenty-fifth mask in which the number of the particles having an equivalent circle diameter of 3 μm or more was 20 or less per 1 mm$^3$ in the sample 81, Evaluation B-2 was OK. On the other hand, in the second mask, the third mask, the thirteenth mask to the seventeenth mask and the twenty-third mask in which the number of the particles having an equivalent circle diameter of 3 μm or more exceeded 20 per 1 mm³ in the sample 81, Evaluation B-2 was NG. From this, it can be said that the aforementioned condition (4) is a useful determination condition for more reliably restraining formation of smaller through holes.

In the aforementioned Examples 1 to 6, Examples 8 to 17 and Examples 21 to 25, the observation results of the particles included in the sample taken out from the first end part 17a of the deposition mask 20 were shown. It can be expected that the same observation results are obtained when the particles included in the samples taken out from the metal plates 64 of the first wound body to the sixth wound body, the eighth wound body to the seventeenth wound body and the twenty-first wound body to the twenty-fifth wound body are observed. This is because, in the first surface etching step and the second surface etching step, areas of the metal plate 64, which correspond to the first end part 17a, are covered with the first resist layer 65a and the second resist layer 65B, whereby the state of the metal plate 64 constituting the first end part 17a is considered to be the same in terms of particle distribution as the state of the metal plate 64 which constituted the wound body.

(Supplementary Evaluation 1)

Similarly to Example 1, iron, nickel, and other raw materials were prepared such that a ratio of iron to the total raw material and a ratio of nickel thereto were about 64% by weight and about 36% by weight, respectively. Following thereto, the respective raw materials were crushed as needed, and thereafter, the first melting step, the first surface treatment step, the second melting step and the second surface treatment step were performed to produce a base metal. Following thereto, by performing the rolling step, the annealing step and the slitting step on the base metal, an eighteenth wound body in which the metal plate 64 having a thickness of 20 μm was wound like a roll was manufactured.

Following thereto, a square sample 81 having a side length K1 of 60 mm was cut out at a position located at a distance of 1 μm from a distal end of the metal plate of the eighteenth wound body in the longitudinal direction of the metal plate. Similarly, square samples 81 having a side length K1 of 60 mm were cut out respectively at positions located at distances of 100 μm, 200 μm, 300 μm and 400 μm from the distal end of the metal plate of the eighteenth wound body in the longitudinal direction of the metal plate. In this manner, the samples 1 were cut out at the five positions on the metal plate of the eighteenth wound body. Thereafter, particles included in each sample 81 were observed using the SEM, and the number of the particles included in a volume of 1 mm³ of the sample 81 and equivalent circle diameters of the respective particles were calculated. In addition, similarly to the aforementioned Example 1, a composition of the particles having an equivalent circle diameter of 1 μm or more was analyzed using the EDX device. The results are shown in FIGS. 50 and 51.

As shown in FIG. 50, the number of the particles included in the cut out samples 81, having an equivalent circle diameter of 1 μm or more, was distributed in a range of 585 to 859 per 1 mm³. An average value of them was 689.0, and a distribution range was 274. The distribution range is a difference between a maximum value and a minimum value of the number of the particles included in a volume of 1 mm³ of the samples 81 having been cut out at the five positions, having an equivalent circle diameter of 1 μm or more. A value obtained by dividing the distribution range by the average value was 0.398. Thus, the number of the particles included in a volume of 1 mm³ of the samples 81 having been cut out at the five positions, having an equivalent circle diameter of 1 μm or more, was within a range of 20% of an intermediate value between the maximum value and the minimum value. A ratio of the maximum value to the minimum value was 1.5 or less. From this, on the assumption that the number of the particles included in a volume of 1 mm³ of the sample 81 having been cut out at one given position of the wound body like a roll, having an equivalent circle diameter of 1 μm or more is Y, it can be said that the number of the particles included in a volume of 1 mm³ of the sample 81 having been cut out at another position of the same wound body, having an equivalent circle diameter of 1 μm or more, is likely to be less than 1.5×Y.

FIG. 50 also shows the numbers and ratios of particles of respective sizes, which were included in a volume of 1 mm³ of the samples 81 having been cut out at the five positions. Regarding the first ratio and the second ratio, the similar tendency as that of the total quantity was observed. Regarding the particle composition analysis results shown in FIG. 51, the similarly tendency as that of the total quantity was observed.

(Supplementary Evaluation 2)

Similarly to Example 1, iron, nickel, and other raw materials were prepared such that a ratio of iron to the total raw material and a ratio of nickel thereto were about 64% by weight and about 36% by weight, respectively. Following thereto, the respective raw materials were crushed as needed, and thereafter, the first melting step, the first surface treatment step, the second melting step and the second surface treatment step were performed to produce a base metal. Following thereto, by performing the rolling step, the annealing step and the slitting step on the base metal, a nineteenth wound body in which the metal plate 64 having a thickness of 20 μm was wound like a roll was manufactured.

Following thereto, similarly to the aforementioned Example 1, the deposition mask 20 was manufactured by the manufacturing method shown in the aforementioned FIGS. 6 to 11 with the use of the metal plate 64 of the nineteenth wound body. Then, particles included in the respective samples 81 taken out from the first end part 17a and the second end part 17b of the deposition mask 20 were observed using the SEM, and the number of the particles included in a volume of 1 mm³ of the sample 81 and equivalent circle diameters of the respective particles were calculated. The results are shown in FIG. 52. In addition, similarly to the aforementioned Example 1, a composition of the particles having an equivalent circle diameter of 1 μm or more was analyzed using the EDX device. The results are shown in FIG. 53.

As shown in FIG. 52, the number of the particles included in the cut-out samples 81, having an equivalent circle diameter of 1 μm or more, was distributed in a range of 833 to 1158 per 1 mm³. An average value of them was 995.5, and a distribution range was 325. The distribution range is a difference between the number of the particles included in a volume of 1 mm³ of the sample 81 having been cut out at the first end part 17a, having an equivalent circle diameter of 1 μm or more, and the number of the particles included in a volume of 1 mm³ of the sample 81 having been cut out at the second end part 17b, having an equivalent circle diameter of 1 μm or more. A value obtained by dividing the distribution range by the average value was 0.326. Thus, the number of the particles included in a volume of 1 mm³ of the samples 81 having been cut out at the the first end part 17a and the second end part 17b of the deposition mask 20, having an equivalent circle diameter of 1 μm or more, was within a range of ±20% of an intermediate value between the maximum value and the minimum value. A ratio of the number of the particles at the second end part 17b to the number of the particles at the first end part 17a was 1.5 or less. From this, on the assumption that the number of the particles included in a volume of 1 mm³ of the sample 81 having been cut out at one given position of the deposition mask, having an equivalent circle diameter of 1 μm or more is Z, it can be said that the number of the particles included in a volume of 1 mm³ of the sample 81 having been cut out at another position of the same deposition mask, having an equivalent circle diameter of 1 μm or more, is likely to be less than 1.5×Z.

FIG. 52 also shows the numbers and ratios of particles of respective sizes, which were included in a volume of 1 mm³ of the samples 81 having been cut out at the first end part 17a and the second end part 17b of the deposition mask 20. Regarding the first ratio and the second ratio, the similar tendency as that of the total quantity was observed. Regarding the particle composition analysis results shown in FIG. 53, the similarly tendency as that of the total quantity was observed.

What is claimed is:

1. A metal plate used for manufacturing a deposition mask, the metal plate comprising:
    a first surface and a second surface positioned on the opposite side of the first surface, the metal plate being made of an invar material containing iron and nickel in an amount of 34% by mass or more; and
    particles containing as a main component an element other than iron and nickel,
    wherein in a sample including the first surface and the second surface of the metal plate, the following conditions (1) and (2) regarding the particles are satisfied
        (1) a number of the particles having an equivalent circle diameter of 1 μm or more is 50 or more and 3000 or less per 1 mm³ in the sample, and
        (2) a number of the particles having an equivalent circle diameter of 3 μm or more is 50 or less per 1 mm³ in the sample.

2. The metal plate according to claim 1, wherein the following condition (3) regarding the particles may be satisfied:
    (3) the number of the particles having an equivalent circle diameter of 1 μm or more is 50 or more and 1000 or less per 1 mm³ in the sample.

3. The metal plate according to claim 1, wherein the following condition (4) regarding the particles is satisfied:
    (4) the number of the particles having an equivalent circle diameter of 3 μm or more is 20 or less per 1 mm³ in the sample.

4. The metal plate according to claim 1, wherein the following condition (5) regarding the particles is satisfied:
    (5) a number of the particles having an equivalent circle diameter of 5 μm or more is 20 or less per 1 mm³ in the sample.

5. The metal plate according to claim 1, wherein the following condition (6) regarding the particles is satisfied:
    (6) a number of the particles having an equivalent circle diameter of 5 μm or more is 2 or less per 1 mm³ in the sample.

6. The metal plate according to claim 1, wherein a first ratio of the metal plate is 70% or more,
    wherein the first ratio is a ratio of a first quantity to a total quantity,
    wherein the total quantity is the number of the particles per 1 mm³ in the sample, the particles having an equivalent circle diameter of 1 μm or more, and
    wherein the first quantity is the number of the particles per 1 mm³ in the sample, the particles having an equivalent circle diameter of 1 μm or more and less than 3 μm.

7. The metal plate according to claim 1, wherein a thickness of the metal plate is 70 μm or less.

8. The metal plate according to claim 1, wherein a thickness of the metal plate is 50 μm or less.

9. The metal plate according to claim 1, wherein a thickness of the metal plate is 30 μm or less.

10. A method for manufacturing a metal plate used for manufacturing a deposition mask, the metal plate including a first surface and a second surface positioned on the opposite side of the first surface, the method comprising:
    a step of rolling a base metal made of an invar material containing iron and nickel in an amount of 34% by mass or more to produce the metal plate,
    wherein the metal plate comprises particles containing as a main component an element other than iron and nickel, and
    wherein in a sample including the first surface and the second surface of the metal plate, the following conditions (1) and (2) regarding the particles are satisfied
        (1) a number of the particles having an equivalent circle diameter of 1 μm or more is 50 or more and 3000 or less per 1 mm³ in the sample, and
        (2) a number of the particles having an equivalent circle diameter of 3 μm or more is 50 or less per 1 mm³ in the sample.

11. The method for manufacturing a metal plate according to claim 10, comprising a surface treatment step of removing a surface part of the base metal or the metal plate.

12. The method for manufacturing a metal plate according to claim 11, wherein the surface treatment step includes a base-metal surface treatment step of removing the surface part of the base metal, and
    wherein a thickness of the surface part is 10 mm or more.

13. The method for manufacturing a metal plate according to claim 11, wherein the surface treatment step includes a metal-plate surface treatment step of removing the surface part of the metal plate, and
    wherein a thickness of the surface part is 5 μm or more.

14. The method for manufacturing a metal plate according to claim 11, wherein the surface treatment step includes a step of removing the surface part by exposing a surface of the base metal or the metal plate to a surface treatment liquid.

15. The method for manufacturing a metal plate according to claim 10, comprising a selection step of selecting the metal plate in which, in a sample including the first surface and the second surface of the selected metal plate, the following conditions (1) and (2) regarding the particles are satisfied:
    (1) the number of the particles having an equivalent circle diameter of 1 μm or more is 50 or more and 3000 or less per 1 mm³ in the sample; and
    (2) the number of the particles having an equivalent circle diameter of 3 μm or more is 50 or less per 1 mm³ in the sample.

16. The method for manufacturing a metal plate according to claim 10, wherein the following condition (5) regarding the particles is satisfied:
    (5) a number of the particles having an equivalent circle diameter of 5 μm or more is 20 or less per 1 mm³ in the sample.

17. The method for manufacturing a metal plate according to claim 10, wherein the following condition (6) regarding the particles is satisfied:
  (6) a number of the particles having an equivalent circle diameter of 5 μm or more is 2 or less per 1 mm$^3$ in the sample.

18. The method for manufacturing a metal plate according to claim 10, wherein a first ratio of the metal plate is 70% or more,
  wherein the first ratio is a ratio of a first quantity to a total quantity,
  wherein the total quantity is the number of the particles per 1 mm$^3$ in the sample, the particles having an equivalent circle diameter of 1 μm or more, and
  wherein the first quantity is the number of the particles per 1 mm$^3$ in the sample, the particles having an equivalent circle diameter of 1 μm or more and less than 3 μm.

19. A deposition mask comprising:
  a metal plate including a first surface and a second surface positioned on the opposite side of the first surface, the metal plate being made of an invar material containing iron and nickel in an amount of 34% by mass or more; and
  a plurality of through holes formed in the metal plate,
  wherein the metal plate comprises particles containing as a main component an element other than iron and nickel, and
  wherein in a sample including the first surface and the second surface of the metal plate, the following conditions (1) and (2) regarding the particles are satisfied
    (1) a number of the particles having an equivalent circle diameter of 1 μm or more is 50 or more and 3000 or less per 1 mm$^3$ in the sample, and
    (2) a number of the particles having an equivalent circle diameter of 3 μm or more is 50 or less per 1 mm$^3$ in the sample.

20. A method for manufacturing a deposition mask comprising:
  a step of preparing a metal plate including a first surface and a second surface positioned on the opposite side of the first surface, the metal plate being made of an invar material containing iron and nickel in an amount of 34% by mass or more; and
  a processing step of forming through holes in the metal plate,
  wherein the metal plate comprises particles containing as a main component an element other than iron and nickel, and
  wherein in a sample including the first surface and the second surface of the metal plate, the following conditions (1) and (2) regarding the particles are satisfied
    (1) a number of the particles having an equivalent circle diameter of 1 μm or more is 50 or more and 3000 or less per 1 mm$^3$ in the sample, and
    (2) a number of the particles having an equivalent circle diameter of 3 μm or more is 50 or less per 1 mm$^3$ in the sample.

\* \* \* \* \*